(12) United States Patent
Kim et al.

(10) Patent No.: US 12,324,298 B2
(45) Date of Patent: Jun. 3, 2025

(54) LIGHT-EMITTING DEVICE AND ELECTRONIC APPARATUS INCLUDING THE SAME

(71) Applicant: Samsung Display Co., Ltd., Yongin-si (KR)

(72) Inventors: Mikyung Kim, Yongin-si (KR); Jaehyun Lee, Yongin-si (KR); Jiwon Kwak, Yongin-si (KR); Hyerim Kim, Yongin-si (KR); Jihyun Seo, Yongin-si (KR); Hanbyul Jang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 379 days.

(21) Appl. No.: 17/156,610

(22) Filed: Jan. 24, 2021

(65) Prior Publication Data

US 2021/0313535 A1    Oct. 7, 2021

(30) Foreign Application Priority Data

Apr. 6, 2020    (KR) .................. 10-2020-0041614

(51) Int. Cl.
*H10K 50/11*    (2023.01)
*H10K 50/16*    (2023.01)
(Continued)

(52) U.S. Cl.
CPC ............. *H10K 50/11* (2023.02); *H10K 50/16* (2023.02); *H10K 85/342* (2023.02);
(Continued)

(58) Field of Classification Search
CPC ...... H10K 50/11; H10K 50/16; H10K 85/342; H10K 85/654; H10K 85/6572;
(Continued)

(56) References Cited

U.S. PATENT DOCUMENTS 9,093,650 B2    7/2015    Kim et al.
9,876,180 B2    1/2018    Jeong et al.
(Continued)

FOREIGN PATENT DOCUMENTS

CN    107623081 A    1/2018
CN    109326733 A    2/2019
(Continued)

OTHER PUBLICATIONS

Korean Notice of Allowance issued in corresponding KR Patent Application No. 10-2020-0041614, dated Dec. 19, 2024, 3 pages.

*Primary Examiner* — Jenna N Chandhok
(74) *Attorney, Agent, or Firm* — Womble Bond Dickinson (US) LLP

(57) ABSTRACT

A light-emitting device includes: a first electrode; a second electrode facing the first electrode; and an interlayer disposed between the first electrode and the second electrode and having an emission layer, wherein the interlayer includes: i) a hole transport region disposed between the first electrode and the emission layer; and ii) an electron transport region disposed between the emission layer and the second electrode; wherein: the emission layer includes three or more hosts; the electron transport region includes a buffer layer; the three or more hosts include a hole transport host, a first electron transport host, and a second electron transport host; the buffer layer includes a third electron transport host; and a lowest unoccupied molecular orbital energy level of the second electron transport host is substantially equal to a lowest unoccupied molecular orbital energy level of the third electron transport host.

18 Claims, 1 Drawing Sheet

(51) Int. Cl.
  *H10K 85/30* (2023.01)
  *H10K 85/60* (2023.01)
  *H10K 101/00* (2023.01)
  *H10K 101/10* (2023.01)
  *H10K 101/30* (2023.01)
  *H10K 101/40* (2023.01)

(52) U.S. Cl.
  CPC ....... *H10K 85/654* (2023.02); *H10K 85/6572* (2023.02); *H10K 2101/10* (2023.02); *H10K 2101/30* (2023.02); *H10K 2101/40* (2023.02); *H10K 2101/90* (2023.02)

(58) Field of Classification Search
  CPC ........... H10K 2101/30; H10K 2101/40; H10K 2101/90; H10K 50/155; H10K 50/165; H10K 50/12; H10K 59/00; H10K 2101/10; H01L 2251/5384
  See application file for complete search history.

(56) References Cited

U.S. PATENT DOCUMENTS

| | | | |
|---|---|---|---|
| 10,326,111 B2 | 6/2019 | Yoo et al. | |
| 10,396,296 B2 | 8/2019 | Ko | |
| 11,283,037 B2 | 3/2022 | Shin et al. | |
| 11,283,038 B2 | 3/2022 | Jeon et al. | |
| 11,450,827 B2 | 9/2022 | Park et al. | |
| 11,641,753 B2 | 5/2023 | Lee et al. | |
| 2004/0100190 A1* | 5/2004 | Kim | H10K 50/18 313/504 |
| 2008/0074038 A1* | 3/2008 | Kim | H10K 50/14 445/24 |
| 2014/0374728 A1* | 12/2014 | Adamovich | H10K 50/121 257/40 |
| 2015/0053942 A1* | 2/2015 | Kho | C07D 209/82 257/40 |
| 2016/0072078 A1 | 3/2016 | Lee et al. | |
| 2016/0163771 A1* | 6/2016 | Jang | H10K 59/32 257/40 |
| 2016/0163995 A1* | 6/2016 | Kang | H10K 85/654 257/40 |
| 2017/0018600 A1 | 1/2017 | Ito et al. | |
| 2017/0162796 A1* | 6/2017 | Jeong | C07F 9/65583 |
| 2017/0200899 A1 | 7/2017 | Kim et al. | |
| 2019/0157600 A1 | 5/2019 | Park et al. | |
| 2019/0207118 A1 | 7/2019 | Lee et al. | |
| 2020/0028089 A1 | 1/2020 | Cho et al. | |

FOREIGN PATENT DOCUMENTS

| | | |
|---|---|---|
| CN | 109686849 A | 4/2019 |
| CN | 109994637 A | 7/2019 |
| EP | 2 991 128 A1 | 3/2016 |
| KR | 10-2004-0044260 A | 5/2004 |
| KR | 10-2008-0028212 A | 3/2008 |
| KR | 10-2014-0030462 A | 3/2014 |
| KR | 10-2016-0069934 A | 6/2016 |
| KR | 10-2017-0065733 A | 6/2017 |
| KR | 10-2018-0025057 | 3/2018 |
| KR | 10-2018-0099487 | 9/2018 |
| KR | 10-1926524 | 12/2018 |
| KR | 10-1974233 | 4/2019 |
| KR | 10-2019-0057179 A | 5/2019 |
| KR | 10-2019-0083020 | 7/2019 |

\* cited by examiner

10

| 190 |
| 150 |
| 110 |

LIGHT-EMITTING DEVICE AND ELECTRONIC APPARATUS INCLUDING THE SAME

CROSS-REFERENCE TO RELATED APPLICATION

This application claims priority from and the benefit of Korean Patent Application No. 10-2020-0041614, filed on Apr. 6, 2020, which is hereby incorporated by reference for all purposes as if fully set forth herein.

BACKGROUND

Field

Exemplary implementations of the invention relate generally to a light-emitting device, and more particularly, an electronic apparatus including the same.

Discussion of the Background

Light-emitting devices are self-emission devices that have wide viewing angles, high contrast ratios, short response times, and excellent characteristics in terms of brightness, driving voltage, and response speed, compared to devices in the art. In a light-emitting device, a first electrode is disposed on a substrate, and a hole transport region, an emission layer, an electron transport region, and a second electrode are sequentially formed on the first electrode. Holes provided from the first electrode move toward the emission layer through the hole transport region, and electrons provided from the second electrode move toward the emission layer through the electron transport region. Carriers, such as holes and electrons, recombine in the emission layer to produce light.

The above information disclosed in this Background section is only for understanding of the background of the inventive concepts, and, therefore, it may contain information that does not constitute prior art.

SUMMARY

Light-emitting devices and an electronic apparatus including the same constructed according to the principles and exemplary implementations of the invention have both improved efficiency and improved lifespan.

Additional features of the inventive concepts will be set forth in the description which follows, and in part will be apparent from the description, or may be learned by practice of the inventive concepts.

According to one aspect of the invention, a light-emitting device includes: a first electrode; a second electrode facing the first electrode; and an interlayer disposed between the first electrode and the second electrode and having an emission layer, wherein the interlayer includes: i) a hole transport region disposed between the first electrode and the emission layer; and ii) an electron transport region disposed between the emission layer and the second electrode; wherein: the emission layer includes three or more hosts; the electron transport region includes a buffer layer; the three or more hosts include a hole transport host, a first electron transport host, and a second electron transport host; the buffer layer includes a third electron transport host; and a lowest unoccupied molecular orbital energy level of the second electron transport host is substantially equal to a lowest unoccupied molecular orbital energy level of the third electron transport host.

The first electrode may include an anode, the second electrode may include a cathode, and the hole transport region may include a hole injection layer, a hole transport layer, an emission auxiliary layer, an electron blocking layer, or any combination thereof.

The first electrode may include an anode, the second electrode may include a cathode, and the electron transport region further may include a hole blocking layer, an electron transport layer, an electron injection layer, or any combination thereof.

The highest occupied molecular orbital energy level of the second electron transport host may be substantially equal to a highest occupied molecular orbital energy level of the third electron transport host.

The lowest unoccupied molecular orbital energy levels of the hole transport host, the first electron transport host, and the second electron transport host may satisfy Inequalities (1) and (2) below:

$$|E_{LUMO\_HT}| > |E_{LUMO\_ET1}| \quad (1); \text{ and}$$

$$|E_{LUMO\_HT}| > |E_{LUMO\_ET2}| \quad (2).$$

The highest occupied molecular orbital energy levels of the hole transport host, the first electron transport host, and the second electron transport host may satisfy Inequality (3) below:

$$E_{HOMO\_ET2} > |E_{HOMO\_ET1}| > |E_{HOMO\_HT}| \quad (3).$$

The lowest unoccupied molecular orbital energy levels and the highest occupied molecular orbital energy levels of the first electron transport host and the second electron transport host may satisfy Inequalities (4) and (5) below:

$$E_{LUMO\_ET2} > |E_{LUMO\_ET1}| \quad (4); \text{ and}$$

$$|E_{HOMO\_ET2}| > |E_{HOMO\_ET1}| \quad (5).$$

The lowest unoccupied molecular orbital energy levels and the highest occupied molecular orbital energy levels of the first electron transport host and the second electron transport host may satisfy Inequalities (6) and (7) below:

$$E_{LUMO\_ET2} - E_{LUMO\_ET1}| \leq \text{about } 0.1 \text{ eV} \quad (6); \text{ and}$$

$$E_{HOMO\_ET2} - E_{HOMO\_ET1}| \leq \text{about } 0.1 \text{ eV} \quad (7).$$

The first electron transport host and the third electron transport host may be identical compounds.

The buffer layer at least partially may contact the emission layer.

The electron transport region may include an electron transport layer, and the buffer layer at least partially contacts the electron transport layer.

The hole transport region may include an emission auxiliary layer, and the emission auxiliary layer may include a charge-generation material.

The emission auxiliary layer may have a two-layered structure.

The hole transport region may include an emission auxiliary layer and a hole transport layer, and the emission auxiliary layer at least partially may contact the hole transport layer.

The hole transport layer may have a charge-generation material.

The hole transport layer may have a two-layered structure.

The charge-generation material may have a p-dopant.

The p-dopant may have a quinone moiety, a metal oxide, a cyano group-containing compound, or any combination thereof may be HAT-CN or a compound represented by Formula 221:

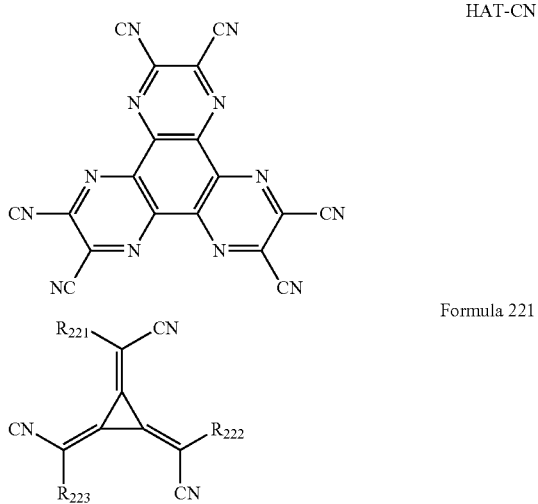

wherein, in Formula 221, $R_{221}$ to $R_{223}$ may each be, independently from one another, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic fused polycyclic group, or a substituted or unsubstituted monovalent non-aromatic heterofused polycyclic group.

An electronic apparatus may include: a thin-film transistor; and the light-emitting device as defined above; wherein the thin-film transistor may include a source electrode, a drain electrode, an activation layer, and a gate electrode, and the first electrode of the light-emitting device may be electrically connected to one of the source electrode and the drain electrode of the thin-film transistor.

It is to be understood that both the foregoing general description and the following detailed description are exemplary and explanatory and are intended to provide further explanation of the invention as claimed.

BRIEF DESCRIPTION OF THE DRAWING

The accompanying drawings, which are included to provide a further understanding of the invention and are incorporated in and constitute a part of this specification, illustrate exemplary embodiments of the invention, and together with the description serve to explain the inventive concepts.

The FIGURE is a schematic cross-sectional diagram of an exemplary embodiment of an organic light-emitting device constructed according to principles of the invention.

DETAILED DESCRIPTION

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Applicant discovered that the emission layer included in an organic light-emitting device of the related art has high resistance compared to other layers included in the organic light-emitting device, so that the characteristics of the organic light-emitting device may be regarded to be significantly determined by the characteristics of the emission layer.

Considering problems of controlling holes and electrons at a proper ratio in the emission layer and performing stable drive, organic light-emitting device of the related art including a single host or two hosts have difficulty in improving efficiency and lifespan at the same time.

According to one aspect of some exemplary embodiments of the inventions a light-emitting device includes: a first electrode; a second electrode facing the first electrode; and an interlayer located between the first electrode and the second electrode and including an emission layer, wherein the interlayer includes: i) a hole transport region disposed between the first electrode and the emission layer; and ii) an electron transport region disposed between the emission layer and the second electrode, the emission layer includes three or more hosts, the electron transport region includes a buffer layer, the three or more hosts include a hole transport host (HT), a first electron transport host (ET1), and a second electron transport host (ET2), the buffer layer includes a third electron transport host (ET2'), and a lowest unoccupied molecular orbital (LUMO) energy level of the ET2 is equal to a LUMO energy level of the ET2'.

Applicant discovered that in a device of the related art, a barrier exists between a host and a buffer layer, thereby increasing driving voltage and causing a difficulty in smooth transport of electrons. In a light-emitting device constructed according to the principles and some exemplary embodiments of the invention, by making a LUMO energy level of the ET2 equal to the LUMO energy level of the ET2', the barrier between a host and a buffer layer is removed, so as to induce smooth transport of electrons from "the buffer layer to the emission layer", thereby improving performance of the light-emitting device.

In one exemplary embodiment, the first electrode may be an anode, the second electrode may be a cathode, and the hole transport region may include a hole injection layer, a hole transport layer, an emission auxiliary layer, an electron blocking layer, or any combination thereof. In one exemplary embodiment, the first electrode may be an anode, the second electrode may be a cathode, and the electron transport region may include a hole blocking layer, an electron transport layer, an electron injection layer, or any combination thereof.

In one exemplary embodiment, a highest occupied molecular orbital (HOMO) energy level of the ET2 may be equal to a HOMO energy level of the ET2'. In one exemplary embodiment the LUMO energy levels of the HT, the ET1, and the ET2 may satisfy Inequalities (1) and (2) below:

$$|E_{LUMO\_HT}| > |E_{LUMO\_ET1}| \tag{1}$$

$$|E_{LUMO\_HT}| > |E_{LUMO\_ET2}| \tag{2}$$

In one exemplary embodiment the HOMO energy levels of the HT, the ET1, and the ET2 may satisfy Inequality (3) below:

$$|E_{HOMO\_ET2}| > |E_{HOMO\_ET1}| > |E_{HOMO\_HT}| \tag{3}$$

In one exemplary embodiment, the LUMO energy levels and the HOMO energy levels of the ET1 and the ET2 may satisfy Inequalities (4) and (5) below:

$$|E_{LUMO\_ET2}| > |E_{LUMO\_ET1}| \tag{4}$$

$$|E_{HOMO\_ET2}| > |E_{HOMO\_ET1}| \tag{5}$$

In one exemplary embodiment, the LUMO energy levels and the HOMO energy levels of the ET1 and the ET2 may satisfy Inequalities (6) and (7) below:

$$|E_{LUMO\_ET2} - E_{LUMO\_ET1}| 0 \leq 0.1 \text{ eV} \tag{6}$$

$$|E_{HOMO\_ET2} - E_{HOMO\_ET1}| \leq 0.1 \text{ eV} \tag{7}.$$

In one exemplary embodiment, the ET2 and the ET2' may be the identical compounds to each other.

In one exemplary embodiment, the buffer layer included in the light-emitting device may be in contact with the emission layer. In one exemplary embodiment, the electron transport region of the light-emitting device may include an electron transport layer, and the buffer layer of the light-emitting device may be in contact with the electron transport layer.

In one exemplary embodiment, the hole transport region of the light-emitting device may include an emission auxiliary layer, and the emission auxiliary layer may include a charge-generation material. In one exemplary embodiment, the emission layer may have a two-layered structure. For example, the emission auxiliary layer consists of a layer including a charge-generation material and a layer not including a charge-generation material. The layer not including a charge-generation material refers to a layer consisting of compounds only that may be included in the hole transport region, wherein such compounds will be described below.

In one exemplary embodiment, the hole transport region of the light-emitting device may include an emission auxiliary layer and a hole transport layer, and the emission auxiliary layer may be in contact with the hole transport layer. The emission auxiliary layer may be the same as described above. For example, the emission auxiliary layer may have a two-layered structure, and consists of a layer including a charge-generation material and a layer not including a charge-generation material. In one exemplary embodiment, the layer not including a charge-generation material in the emission auxiliary layer may be in contact with the emission layer. In one exemplary embodiment, the layer including a charge-generation material in the emission auxiliary layer may be in contact with the hole transport layer. In one exemplary embodiment, the hole transport layer may include a charge-generation material. For example, the hole transport layer may have a two-layered structure, and consists of a layer including a charge-generation material and a layer not including a charge-generation material.

In one exemplary embodiment, the layer not including a charge-generation material in the hole transport layer may be in contact with the layer including a charge-generation material in the emission auxiliary layer. In one exemplary embodiment, the layer including a charge-generation material in the hole transport layer may be in contact with the first electrode. In one exemplary embodiment, the charge-generation material may be a p-dopant. The p-dopant will be described below. In one exemplary embodiment, the emission layer may be a green emission layer. In one exemplary embodiment, the light-emitting device may be a phosphorescence device. In one exemplary embodiment, the emission layer may include three hosts.

According to another aspect of some exemplary embodiments of the invention, an electronic apparatus includes: a thin-film transistor; and the light-emitting device, wherein the thin-film transistor includes a source electrode, a drain electrode, an activation layer, and a gate electrode, and the first electrode of the light-emitting device is electrically connected to one of the source electrode and the drain electrode of the thin-film transistor.

Description of the FIGURE

The FIGURE is a schematic cross-sectional diagram of an exemplary embodiment of an organic light-emitting device constructed according to principles of the invention. The light-emitting device 10 includes a first electrode 110, an interlayer 150, and a second electrode 190.

Hereinafter, the structure of the light-emitting device 10 according to an embodiment and a method of manufacturing the light-emitting device 10 will be described in connection with the FIGURE.

First Electrode 110

In the FIGURE, a substrate may be additionally disposed under the first electrode 110 or above the second electrode 190. The substrate may be a glass substrate or a plastic substrate. The first electrode 110 may be formed by, for example, depositing or sputtering a material for forming the first electrode 110 on the substrate. When the first electrode 110 is an anode, a high work function material that easily injects holes may be used as a material for forming the first electrode 110.

The first electrode 110 may be a reflective electrode, a semi-transmissive electrode, or a transmissive electrode. When the first electrode 110 is a transmissive electrode, a material for forming the first electrode 110 may be selected from an indium tin oxide (ITO), an indium zinc oxide (IZO), a tin oxide ($SnO_2$), a zinc oxide (ZnO), and any combination thereof, but the exemplary embodiments are not limited thereto. In one or more exemplary embodiments, when the first electrode 110 is a semi-transmissive electrode or a reflective electrode, a material for forming the first electrode 110 may be selected from magnesium (Mg), silver (Ag), aluminum (Al), aluminum-lithium (Al—Li), calcium (Ca), magnesium-indium (Mg—In), magnesium-silver (Mg—Ag), and any combination thereof, but the exemplary embodiments are not limited thereto.

The first electrode 110 may have a single-layered structure consisting of a single layer or a multi-layered structure including a plurality of layers. For example, the first electrode 110 may have a three-layered structure of ITO/Ag/ITO, but the structure of the first electrode 110 is not limited thereto.

Interlayer 150

The interlayer 150 is disposed on the first electrode 110. The interlayer 150 includes an emission layer. The interlayer 150 may further include a hole transport region disposed between the first electrode 110 and the emission layer and an electron transport region disposed between the emission layer and the second electrode 190.

The interlayer 150 may further include a metal-containing compound, such as an organometallic compound, an inorganic material, such as a quantum dot, and the like, in addition to various organic materials.

Hole Transport Region in Interlayer 150

The hole transport region may have: i) a single-layered structure consisting of a single layer consisting of a single material, ii) a single-layered structure consisting of a single layer consisting of a plurality of different materials, or iii) a multi-layered structure including a plurality of layers including different materials.

The hole transport region may include a hole injection layer, a hole transport layer, an emission auxiliary layer, an electron blocking layer, or any combination thereof. As described above, the hole transport layer may include a charge-generation material. For example, the hole transport layer may have a two-layered structure, and consists of a layer including a charge-generation material and a layer not including a charge-generation material.

For example, the hole transport region may have a multilayered structure including a layer including a charge-generation material/hole transport layer structure, a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein, for each structure, constituting layers are sequentially stacked from the first electrode 110, but the exemplary embodiments are not limited thereto.

The hole transport region may include a compound represented by Formula 201, a compound represented by Formula 202, or any combination thereof:

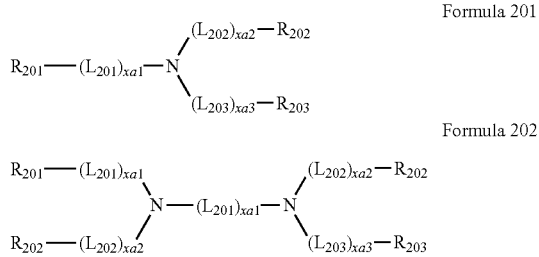

In Formulae 201 and 202, $L_{201}$ to $L_{204}$ may each independently be a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, or a substituted or unsubstituted divalent non-aromatic condensed heteropolycyclic group, $L_{205}$ may be *—O—*', *—S—*', *—N($Q_{201}$)-*', a substituted or unsubstituted $C_1$-$C_{20}$ alkylene group, a substituted or unsubstituted $C_2$-$C_{20}$ alkenylene group, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, or a substituted or unsubstituted divalent non-aromatic condensed heteropolycyclic group, xa1 to xa4 may each independently be 0, 1, 2, or 3 (for example, 0, 1, or 2), xa5 may be an integer from 1 to 10 (for example, 1, 2, 3, or 4), and $R_{201}$ to $R_{204}$ and $Q_{201}$ may each independently be a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group.

For example, in Formula 202, $R_{201}$ and $R_{202}$ may optionally be linked to each other via a single bond, a dimethyl-methylene group, or a diphenyl-methylene group, and $R_{203}$ and $R_{204}$ may optionally be linked to each other via a single bond, a dimethyl-methylene group, or a diphenyl-methylene group.

In one exemplary embodiment, i) at least one of $R_{201}$ to $R_{203}$ in Formula 201, and ii) at least one of $R_{201}$ to $R_{204}$ in Formula 202 may each independently be a fluorenyl group, a spiro-bifluorenyl group, a benzofluorenyl group, an indenophenanthrenyl group, a pyridinyl group, a pyrrolyl group, a thiophenyl group, a furanyl group, an indolyl group, a benzoindolyl group, an isoindolyl group, a benzoisoindolyl group, a benzosilolyl group, a benzothiophenyl group, a benzofuranyl group, a carbazolyl group, a dibenzosilolyl group, a dibenzothiophenyl group, or a dibenzofuranyl group, each unsubstituted or substituted with at least one of deuterium, —F, —Cl, —Br, —I, a hydroxyl group, a cyano group, a nitro group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a phenanthrenyl group, an indenyl group, a fluorenyl group, a dimethylfluorenyl group, a diphenyl fluorenyl group, a spiro-bifluorenyl group, a benzofluorenyl group, a dimethyl benzofluorenyl group, a diphenyl benzofluorenyl group, an indenophenanthrenyl group, a dimethyl indenophenanthrenyl group, a diphenyl indenophenanthrenyl group, a pyridinyl group, a pyrrolyl group, a thiophenyl group, a furanyl group, an indolyl group, a phenylindolyl group, a benzoindolyl group, a phenylbenzoindolyl group, an isoindolyl group, a phenylisoindolyl group, a benzoisoindolyl group, a phenylbenzoisoindolyl group, a benzosilolyl group, a dimethylbenzosilolyl group, a diphenylbenzosilolyl group, a benzothiophenyl group, a benzofuranyl group, a carbazolyl group, a phenylcarbazolyl group, a biphenylcarbazolyl group, a dibenzosilolyl group, a dimethyl dibenzosilolyl group, a diphenyl dibenzosilolyl group, a dibenzothiophenyl group, or a dibenzofuranyl group, but the exemplary embodiments are not limited thereto.

In one or more exemplary embodiments, the compound represented by Formula 201 or 202 may include at least one carbazole group. In one or more exemplary embodiments, the compound represented by Formula 201 may not include a carbazole group.

The hole transport region may include the following compounds, such as m-4,4',4''-tris[phenyl(m-tolyl)amino]triphenylamine (MTDATA), 1-N,1-N-bis[4-(diphenylamino)phenyl]-4-N,4-N-diphenylbenzene-1,4-diamine (TDATA), 4,4',4''-tris[2-naphthyl(phenyl)amino]triphenylamine (2-TNATA), N,N'-di(1-naphthyl)-N,N'-diphenyl-(1,1'-biphenyl)-4,4'-diamine (NPB or NPD), N4,N4'-di(naphthalen-2-yl)-N4,N4'-diphenyl-[1,1'-biphenyl]-4,4'-diamine (β-NPB), N,N'-bis(3-methylphenyl)-N,N'-diphenylbenzidine (TPD), N,N'-bis(3-methylphenyl)-N,N'-diphenyl-9,9-spirobifluorene-2,7-diamine (spiro-TPD), N2,N7-di-1-naphthalenyl-N2,N7-diphenyl-9,9'-spirobi[9H-fluorene]-2,7-diamine (spiro-NPB), N, N,N'-di(1-naphthyl)-N,N'-2,2'dimethyldiphenyl-(1,1'-biphenyl)-4,4'-diamine (methylated-NPB), 4,4'-cyclohexylidenebis[N,N-bis(4-methylphenyl)benzenamine](TAPC), N,N,N',N'-tetrakis(3-methylphenyl)-3,3'-dimethylbenzidine (HMTPD), 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), or a combination thereof. However, the exemplary embodiments are not limited thereto:

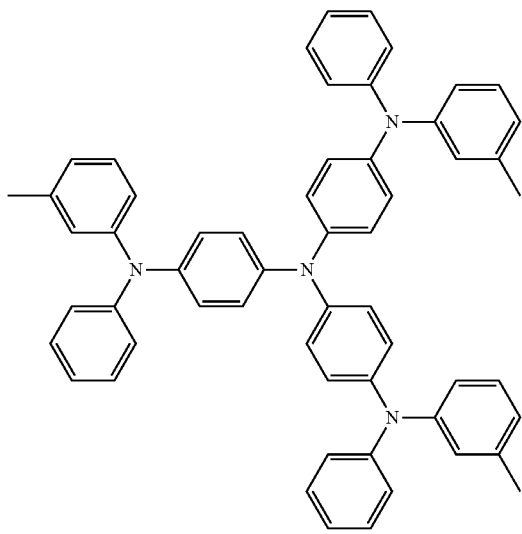

m-MTDATA

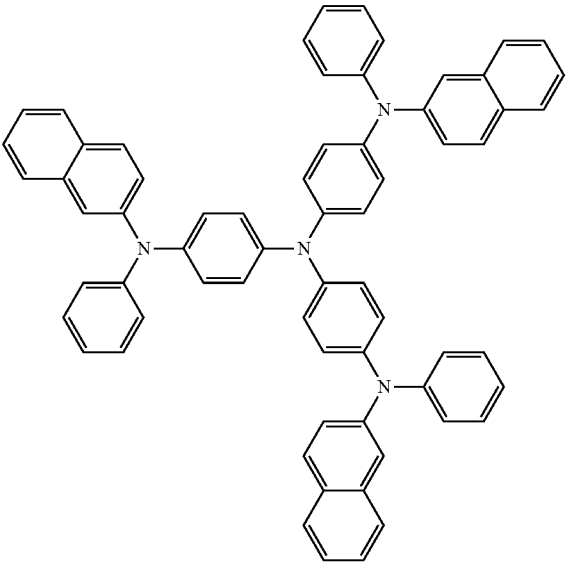

2-TNATA

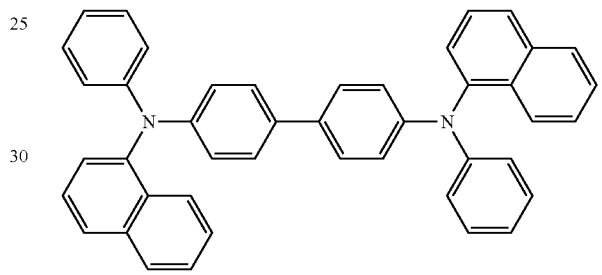

NPB

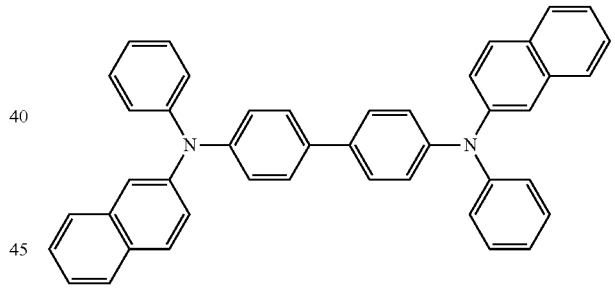

β-NPB

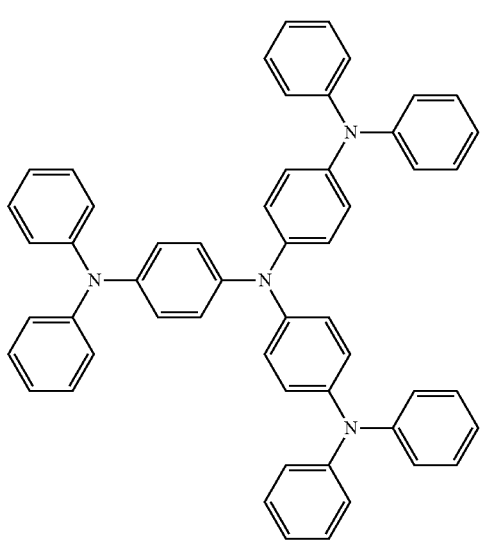

TDATA

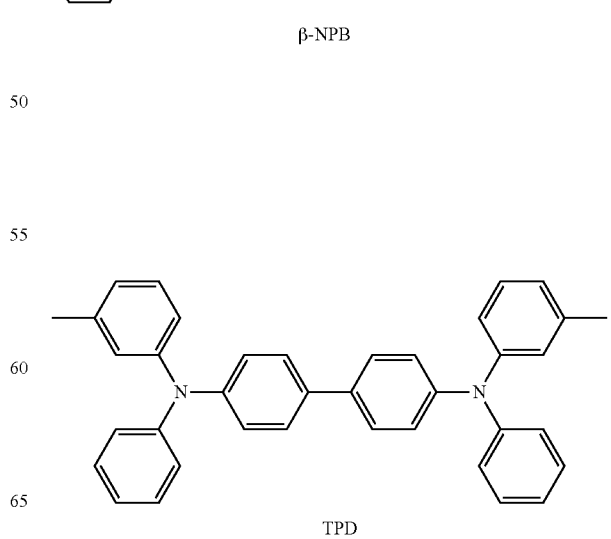

TPD

-continued

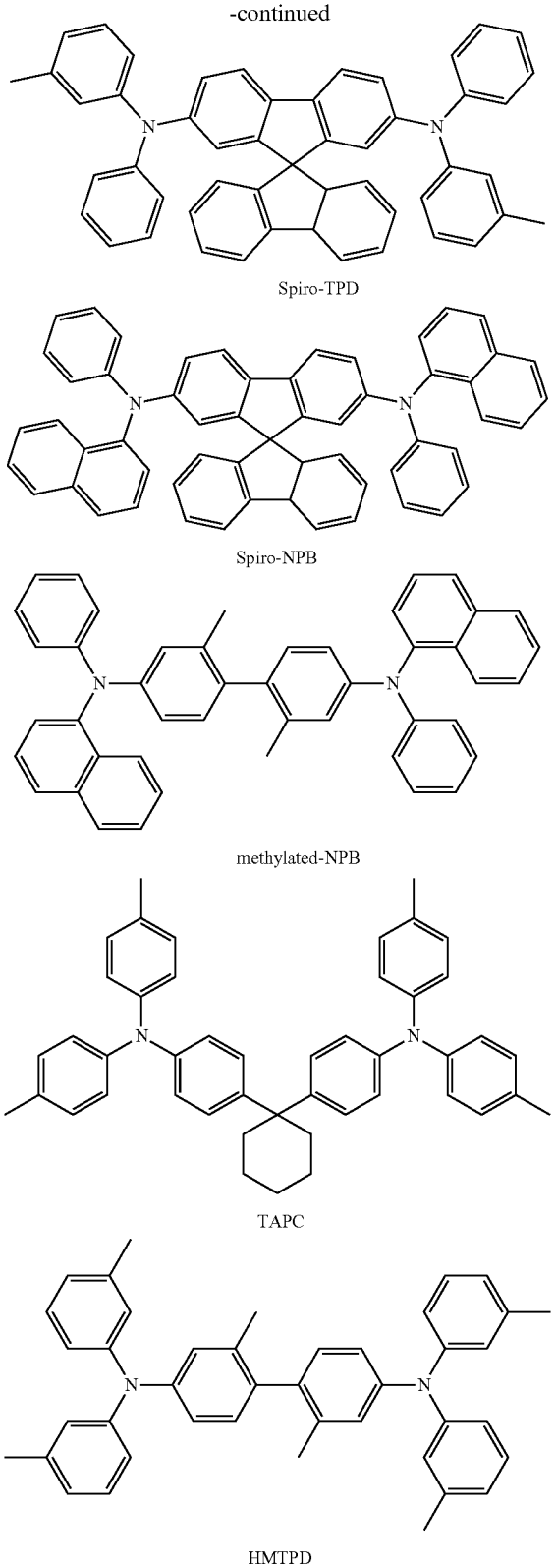

Spiro-TPD

Spiro-NPB methylated-NPB

TAPC

HMTPD

The thickness of the hole transport region may be in a range of about 100 Å to about 10,000 Å, for example, about 100 Å to about 1,000 Å. When the hole transport region includes at least one selected from a hole injection layer and a hole transport layer, the thickness of the hole injection layer may be in a range of about 100 Å to about 9,000 Å, for example, about 100 Å to about 1,000 Å, and the thickness of the hole transport layer may be in a range of about 50 Å to about 2,000 Å, for example, about 100 Å to about 1,500 Å. When the thicknesses of the hole transport region, the hole injection layer and the hole transport layer are within these ranges, satisfactory hole transporting characteristics may be obtained without a substantial increase in driving voltage.

The emission auxiliary layer may increase light-emission efficiency by compensating for an optical resonance distance according to the wavelength of light emitted by the emission layer, and the electron blocking layer may block the flow of electrons from the electron transport region. The emission auxiliary layer and the electron blocking layer may include the materials as described above. The emission auxiliary layer may be the same as described above. The electron blocking layer may serve as a layer that prevents injection of electrons from the electron transport region. The electron blocking layer may include the materials as described above.

P-Dopant

The hole transport region may include, in addition to the materials as described above, a charge-generation material for the improvement of conductive properties. The charge-generation material may be homogeneously or non-homogeneously dispersed in the hole transport region. The charge-generation material may be, for example, a p-dopant. In one exemplary embodiment, the LUMO energy level of the p-dopant may be about −3.5 eV or less. The p-dopant may include a quinone derivative, a metal oxide, a cyano group-containing compound, or any combination thereof, but the exemplary embodiments are not limited thereto.

In one exemplary embodiment, the p-dopant may include at least one selected from: a quinone derivative, such as tetracyanoquinodimethane (TCNQ), 2,3,5,6-tetrafluoro-7,7,8,8-tetracyanoquinodimethane (F4-TCNQ), and the like; a metal oxide, such as a tungsten oxide or a molybdenum oxide; a cyano group-containing compound, such as 1,4,5,8,9,12-hexaazatriphenylene-hexacarbonitrile (HAT-CN) and the like; a compound represented by Formula 221; or any combination thereof.

However, the exemplary embodiments are not limited thereto:

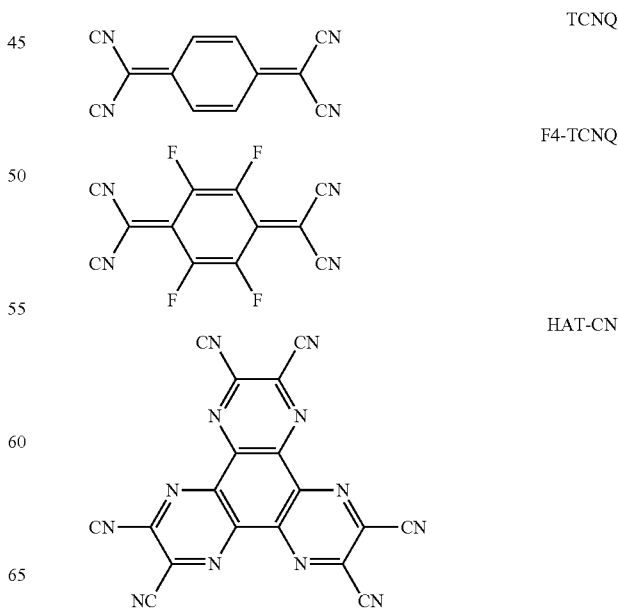

TCNQ

F4-TCNQ

HAT-CN

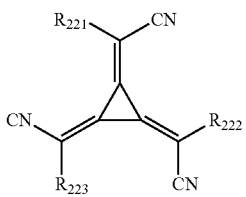

Formula 221

In Formula 221,

R$_{221}$ to R$_{223}$ may each independently be a substituted or unsubstituted C$_3$-C$_{10}$ cycloalkyl group, a substituted or unsubstituted C$_1$-C$_{10}$ heterocycloalkyl group, a substituted or unsubstituted C$_3$-C$_{10}$ cycloalkenyl group, a substituted or unsubstituted C$_1$-C$_{10}$ heterocycloalkenyl group, a substituted or unsubstituted C$_1$-C$_{60}$ aryl group, a substituted or unsubstituted C$_1$-C$_{60}$ heteroaryl group, a substituted or unsubstituted monovalent non-aromatic condensed polycyclic group, or a substituted or unsubstituted monovalent non-aromatic condensed heteropolycyclic group, wherein at least one of R$_{221}$ to R$_{223}$ may each independently be a C$_3$-C$_{10}$ cycloalkyl group, a C$_1$-C$_{10}$ heterocycloalkyl group, a C$_3$-C$_{10}$ cycloalkenyl group, a C$_1$-C$_{10}$ heterocycloalkenyl group, a C$_6$-C$_{60}$ aryl group, a C$_1$-C$_{60}$ heteroaryl group, a monovalent non-aromatic condensed polycyclic group, or a monovalent non-aromatic condensed heteropolycyclic group, each unsubstituted or substituted with: a cyano group; —F; —Cl; —Br; —I; a C$_1$-C$_{20}$ alkyl group substituted with at least one cyano group; a C$_1$-C$_{20}$ alkyl group substituted with at least one —F; a C$_1$-C$_{20}$ alkyl group substituted with at least one —Cl; a C$_1$-C$_{20}$ alkyl group substituted with at least one —Br; a C$_1$-C$_{20}$ alkyl group substituted with at least one —I; or any combination thereof. For example, the p-dopant may be included in the hole transport layer and/or the emission auxiliary layer.

Emission Layer in Interlayer 150

When the light-emitting device 10 is a full-color light-emitting device, the emission layer may be patterned into a red emission layer, a green emission layer, and/or a blue emission layer, according to a sub-pixel. In one exemplary embodiment, the emission layer may have a stacked structure of two or more layers selected from a red emission layer, a green emission layer, and a blue emission layer, in which the two or more layers contact each other or are separated from each other. In one or more exemplary embodiments, the emission layer may include two or more materials selected from a red light-emitting material, a green light-emitting material, and a blue light-emitting material, in which the two or more materials are mixed with each other in a single layer to emit white light.

The emission layer may include a host and a dopant. The dopant may include a phosphorescent dopant, a fluorescent dopant, or any combination thereof. The amount of the dopant in the emission layer may be in a range of about 0.01 parts by weight to about 15 parts by weight based on 100 parts by weight of the host. However, the exemplary embodiments are not limited thereto.

In one or more exemplary embodiments, the emission layer may include a quantum dot. The thickness of the emission layer may be in a range of about 100 Å to about 1,000 Å, for example, about 200 Å to about 600 Å. When the thickness of the emission layer is within this range, excellent light-emission characteristics may be obtained without a substantial increase in driving voltage.

Host in Emission Layer

In one exemplary embodiment, the emission layer included in the light-emitting device 10 according to an exemplary embodiment may include three or more hosts, and the three or more hosts may include the HT, the ET1, and the ET2, wherein a LUMO energy level of the ET2 may be equal to a LUMO energy level of the ET2' of the buffer layer.

In one or more exemplary embodiments, the emission layer included in the light-emitting device 10 may include three or more hosts, and the three or more hosts may include the HT, the ET1, and the ET2, wherein a LUMO energy level of the ET2 may be equal to a LUMO energy level of the ET2' of the buffer layer that will be described below and a HOMO energy level of the ET2 may be equal to a HOMO energy level of the ET2'.

For use as the host, compounds satisfying the energy relationship as described above among the HT, the ET1, and the ET2 that are included in the emission layer, and the ET2' included in the buffer layer may be used. For example, the HT may be a fluorene-based compound, a carbazole-based compound, a diarylamine-based compound, a triarylamine-based compound, a dibenzofuran-based compound, a dibenzothiophene-based compound, or a dibenzosilole-based compound. For example, the ET1, the ET2, and the ET2' may each independently be a triazine-based compound, a triazole-based compound, an imidazole-based compound, or an oxazine-based compound.

For example, the host may include a compound represented by Formula 301:

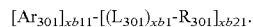

Formula 301

In Formula 301,

Ar$_{301}$ may be a substituted or unsubstituted C$_5$-C$_{60}$ carbocyclic group or a substituted or unsubstituted C$_1$-C$_{60}$ heterocyclic group, xb11 may be 1, 2, or 3, L$_{301}$ may be a substituted or unsubstituted C$_3$-C$_{10}$ cycloalkylene group, a substituted or unsubstituted C$_1$-C$_{10}$ heterocycloalkylene group, a substituted or unsubstituted C$_3$-C$_{10}$ cycloalkenylene group, a substituted or unsubstituted C$_1$-C$_{10}$ heterocycloalkenylene group, a substituted or unsubstituted C$_6$-C$_{60}$ arylene group, a substituted or unsubstituted C$_1$-C$_{60}$ heteroarylene group, a substituted or unsubstituted divalent non-aromatic condensed polycyclic group, or a substituted or unsubstituted divalent non-aromatic condensed heteropolycyclic group, xb1 may be 0, 1, 2, 3, 4, or 5, R$_{301}$ may be deuterium, —F, —Cl, —Br, —I, a hydroxyl group, a cyano group, a nitro group, a substituted or unsubstituted C$_1$-C$_{60}$ alkyl group, a substituted or unsubstituted C$_2$-C$_{60}$ alkenyl group, a substituted or unsubstituted C$_2$-C$_{60}$ alkynyl group, a substituted or unsubstituted C$_1$-C$_{60}$ alkoxy group, a substituted or unsubstituted C$_3$-C$_{10}$ cycloalkyl group, a substituted or unsubstituted C$_1$-C$_{10}$ heterocycloalkyl group, a substituted or unsubstituted C$_3$-C$_{10}$ cycloalkenyl group, a substituted or unsubstituted C$_1$-C$_{10}$ heterocycloalkenyl group, a substituted or unsubstituted C$_6$-C$_{60}$ aryl group, a substituted or unsubstituted C$_6$-C$_{60}$ aryloxy group, a substituted or unsubstituted C$_6$-C$_{60}$ arylthio group, a substituted or unsubstituted C$_1$-C$_{60}$ heteroaryl group, a substituted or unsubstituted monovalent non-aromatic condensed polycyclic group, a substituted or unsubstituted monovalent non-aromatic condensed heteropoly cyclic group, —Si(Q$_{301}$)(Q$_{302}$)(Q$_{303}$), —N(Q$_{301}$)(Q$_{302}$), —B(Q$_{301}$)(Q$_{302}$), —C(=O)(Q$_{301}$), —S(=O)$_2$(Q$_{301}$), or —P(=O)(Q$_{301}$)(Q$_{302}$), xb21 may be 1, 2, 3, 4, or 5, and Q301 to Q303 may be the same as described in connection with Q$_1$ as described herein.

In one or more exemplary embodiments, when xb11 in Formula 301 is 2 or more, two or more Ar301(s) may be linked to each other via a single bond. In one exemplary embodiment, the host may include a compound represented by Formula 301-1, a compound represented by Formula 301-2, or any combination embodiment:

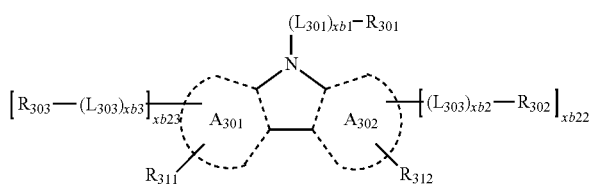

Formula 301-1

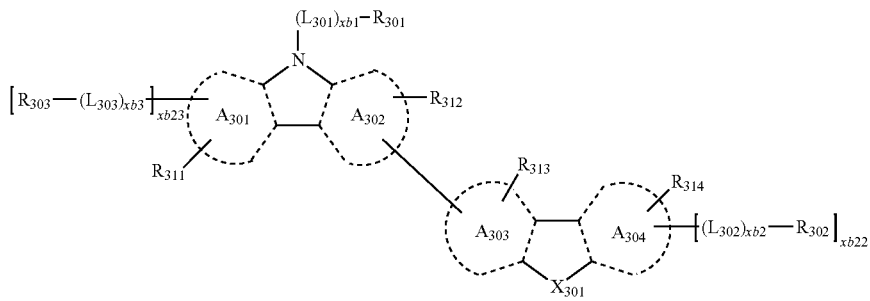

Formula 301-2

In Formulae 301-1 and 301-2, ring A$_{301}$ to ring A$_{304}$ may each independently be a C$_5$-C$_{60}$ carbocyclic group or a C$_1$-C$_{60}$ heterocyclic group, X$_{301}$ may be O, S, N-[(L$_{304}$)$_{xb4}$-R$_{304}$], C(R$_{304}$)(R$_{305}$), or Si(R$_{304}$)(R$_{305}$), xb22 and xb23 may each independently be 0, 1, or 2, L$_{301}$, xb1, and R$_{301}$ may be the same as described above, L$_{302}$ to L$_{304}$ may each independently be the same as described in connection with L$_{301}$, xb2 to xb4 may each independently be the same as described in connection with xb1, and R$_{302}$ to R$_{305}$ and R$_{311}$ to R$_{314}$ may each be the same as described in connection with R$_{301}$.

In one or more exemplary embodiments, the host may include an alkaline earth metal complex. For example, the host may be a Be complex (for example, Compound H55), a Mg complex, a Zn complex, or any combination thereof.

In one exemplary embodiment, the host may include one of Compounds H1 to H120, or 9,10-di(2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di-9-carbazolylbenzene (mCP), 1,3,5-tri(carbazol-9-yl)benzene (TCP), or any combination thereof, but the exemplary embodiments are not limited thereto:

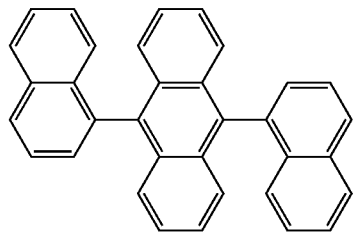

H1

-continued

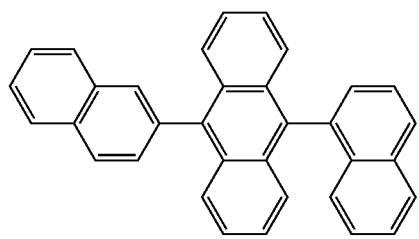

H2

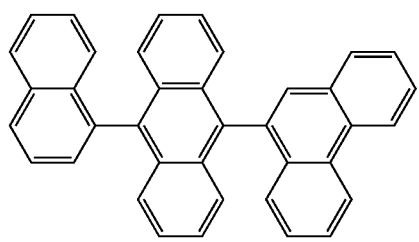

H3

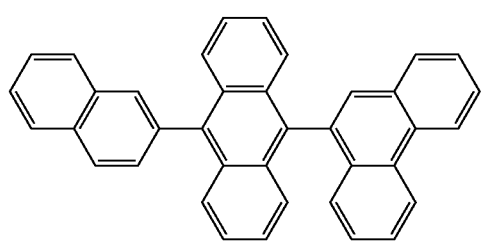

H4

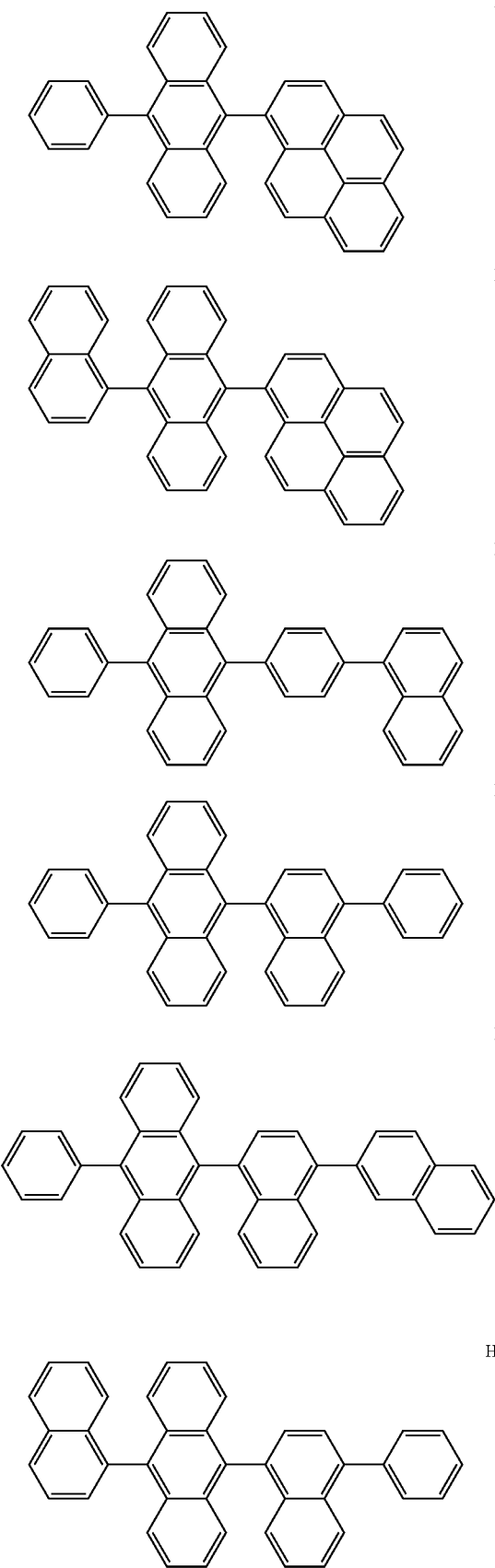
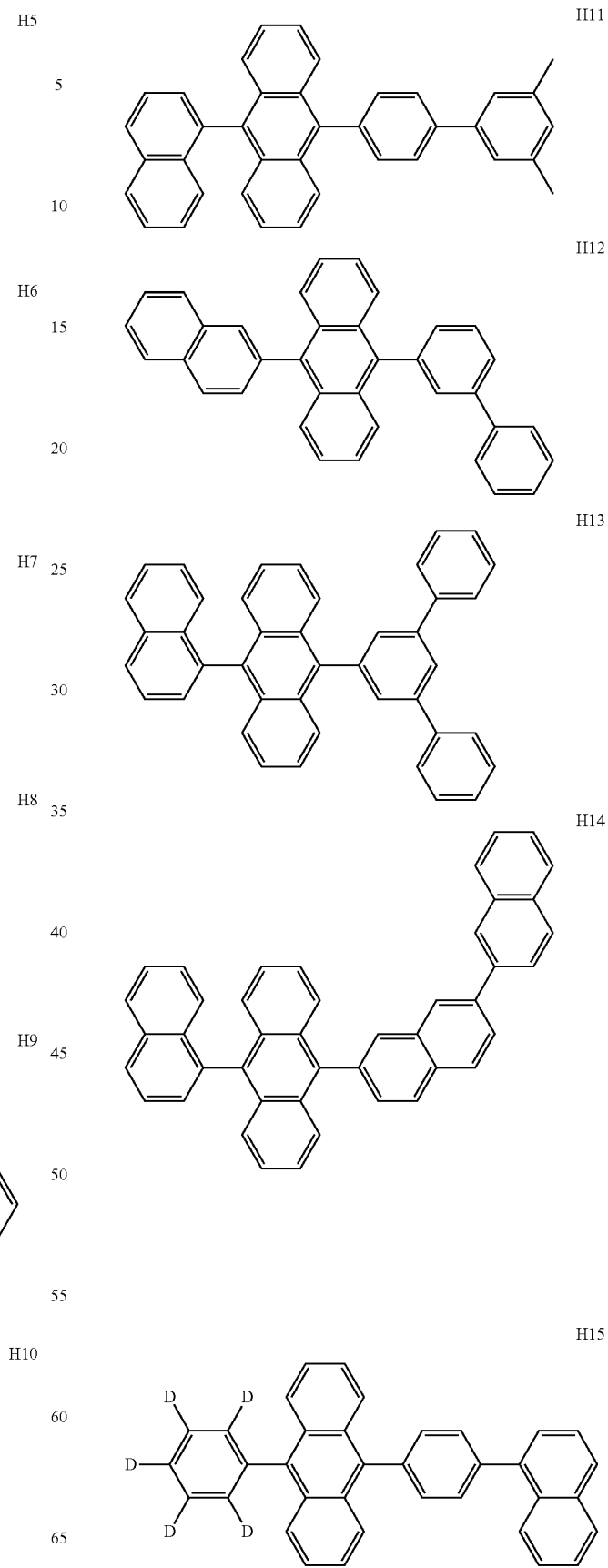

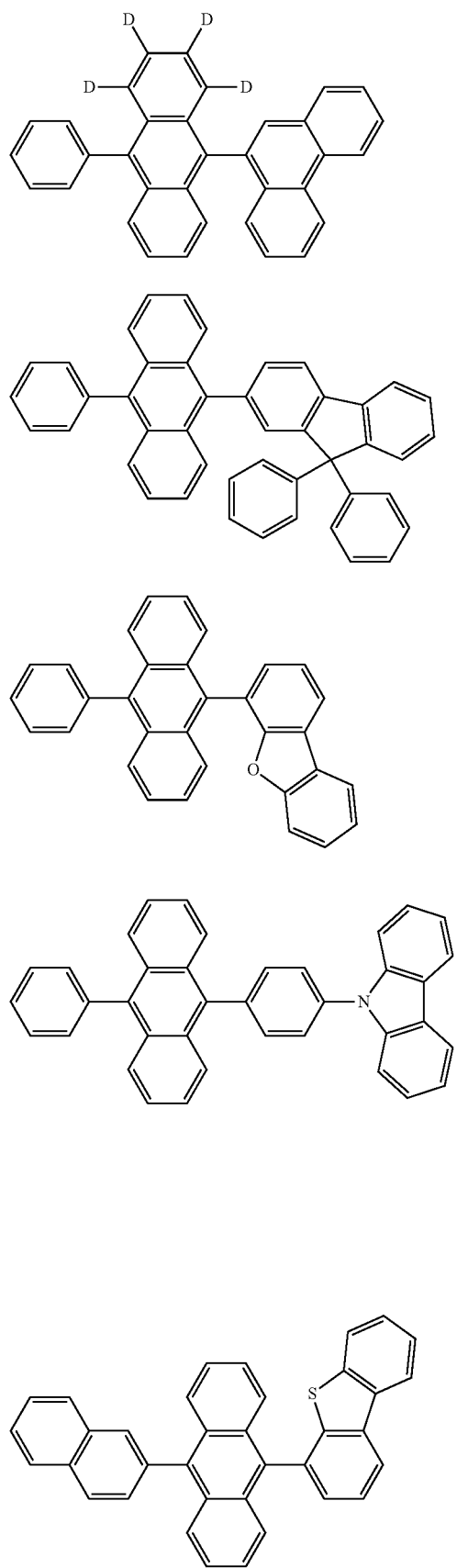
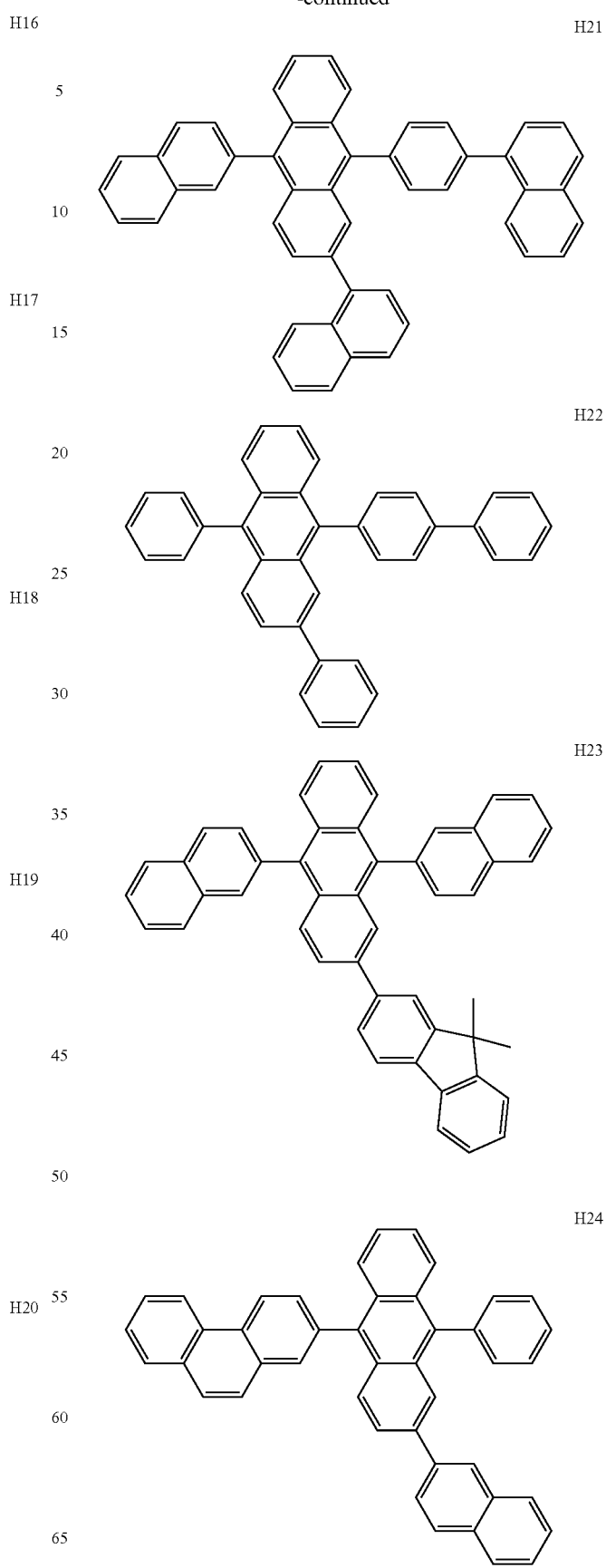

H25
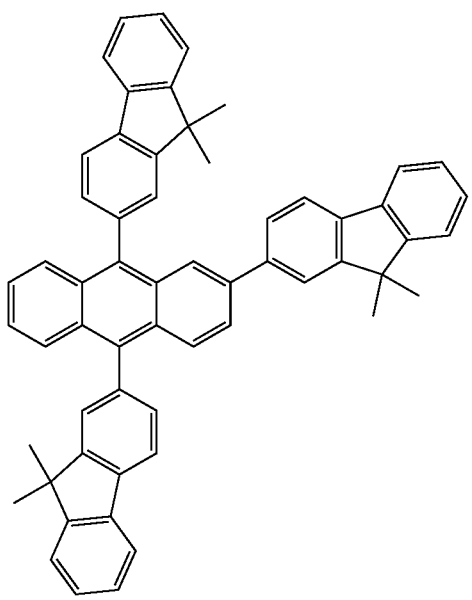
H26
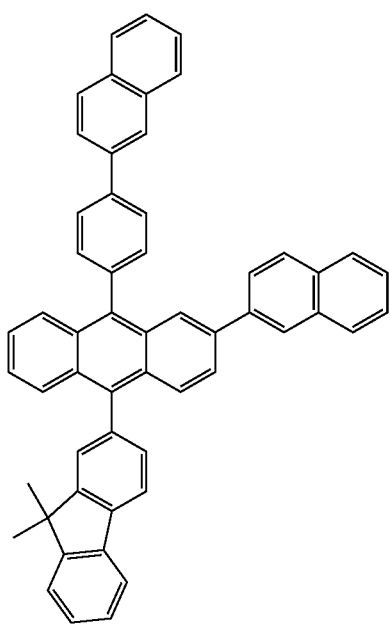
H27
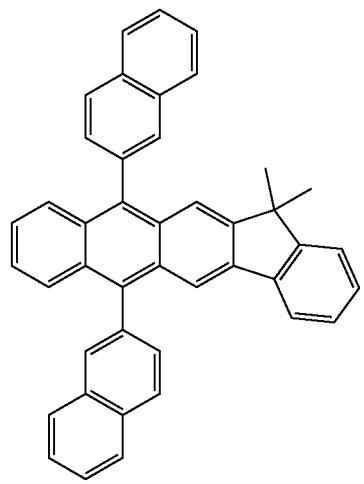
H28
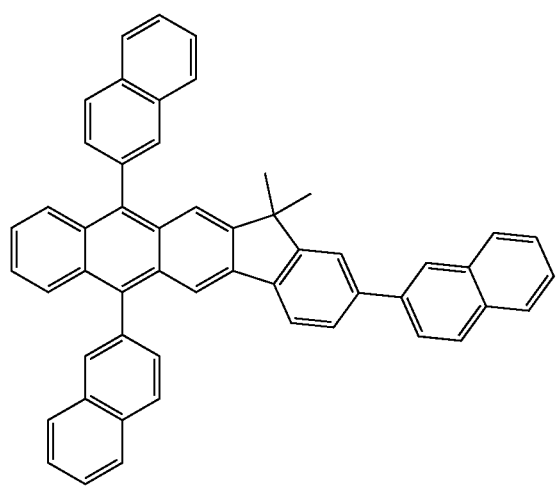
H29

-continued
H30
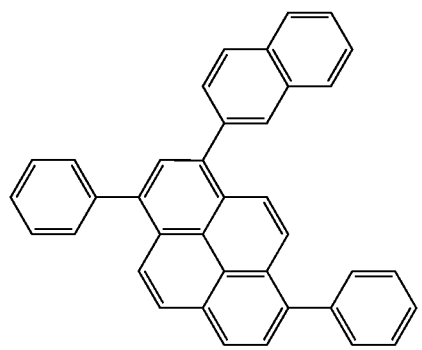
H31
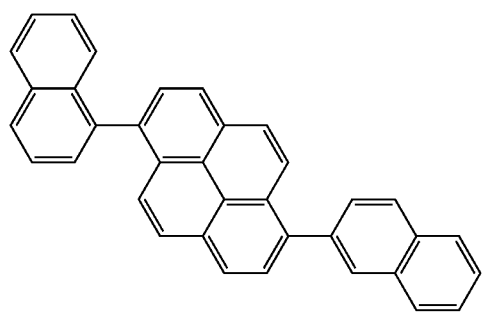
H32
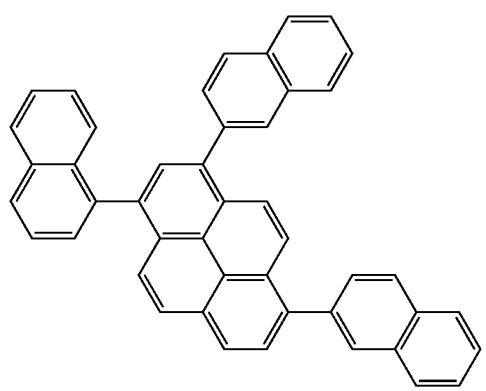
H33
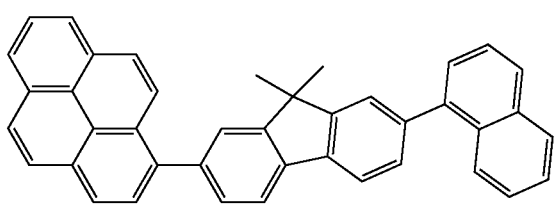
H34
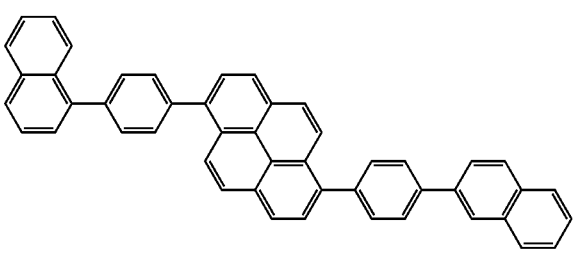
-continued
H35
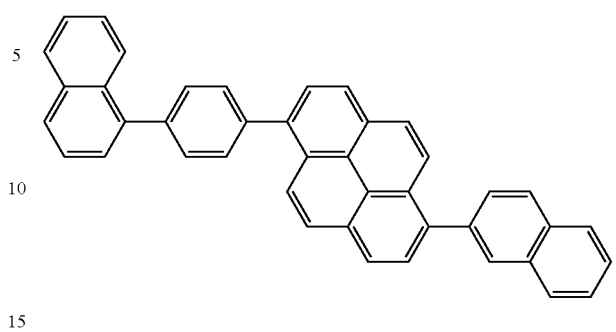
H36
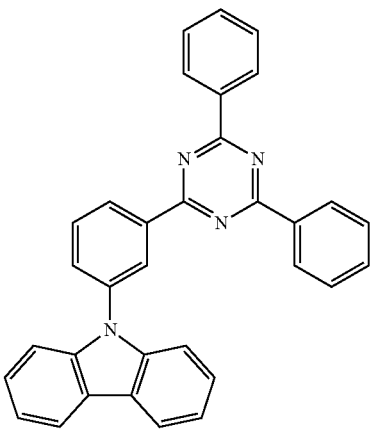
H37
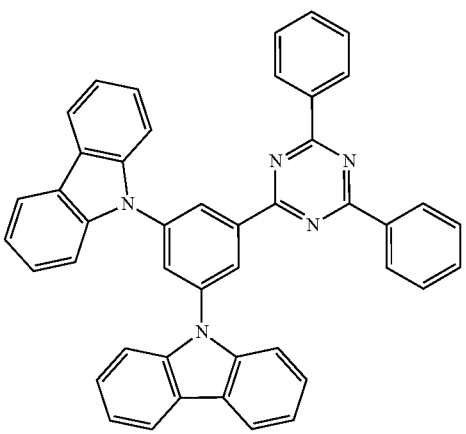
H38
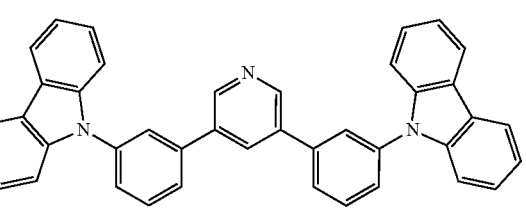

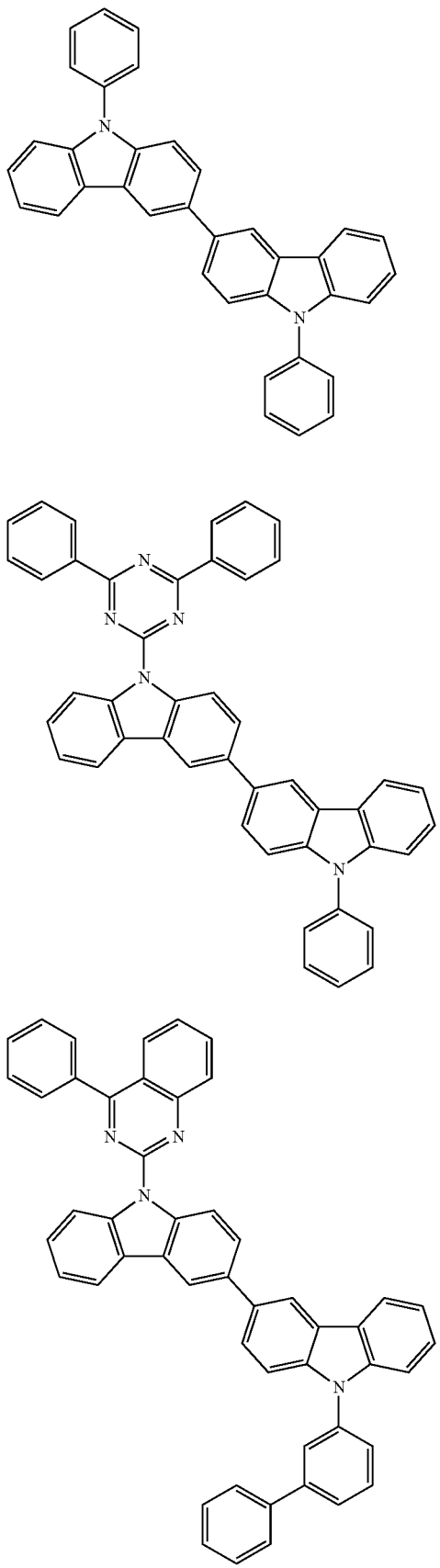 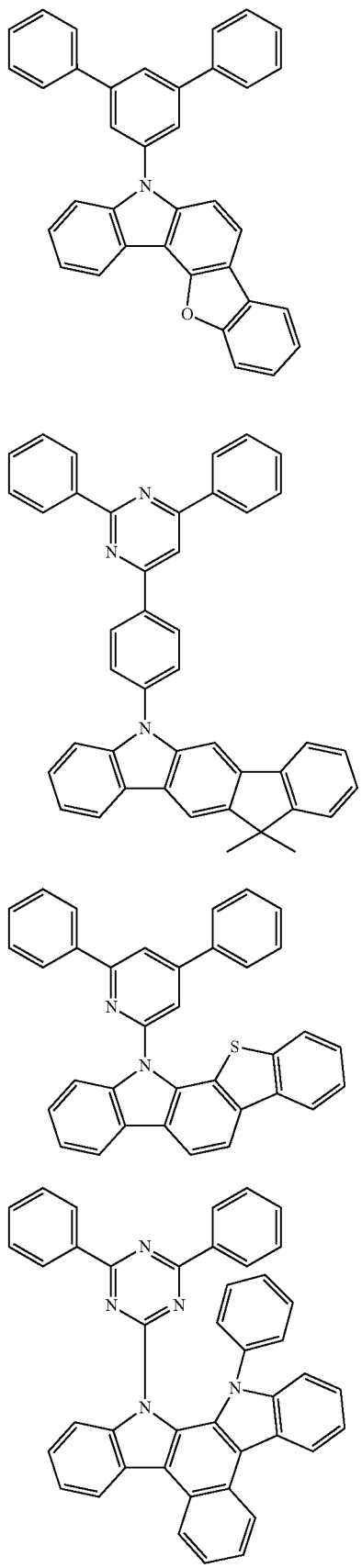

H46 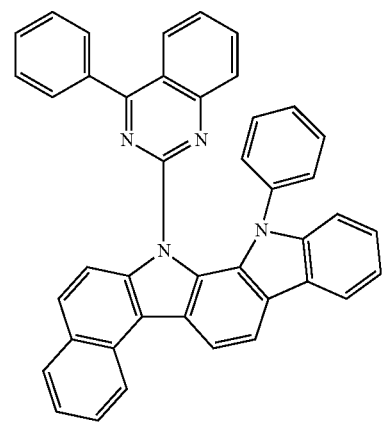
H47 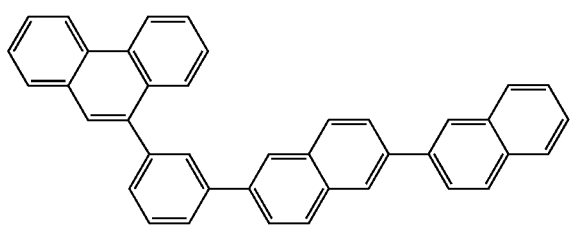
H48 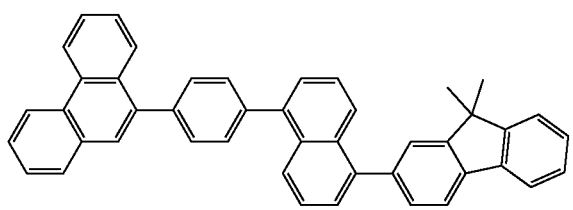
H49 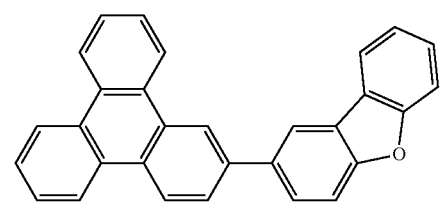
H50 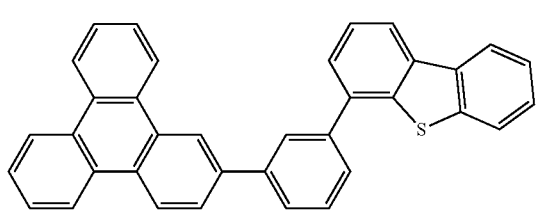
H51 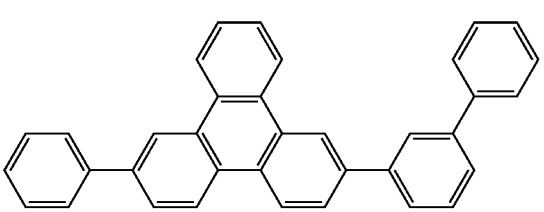
H52 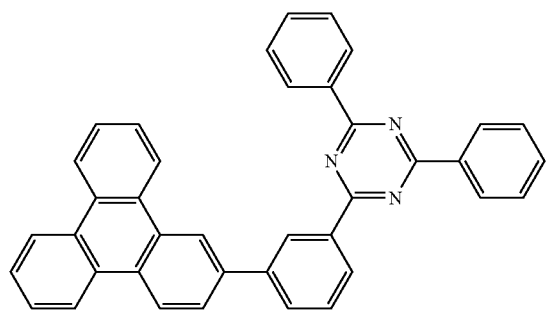
H53 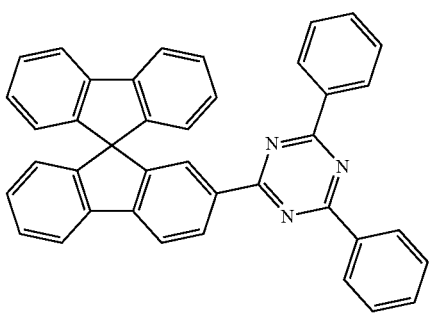
H54 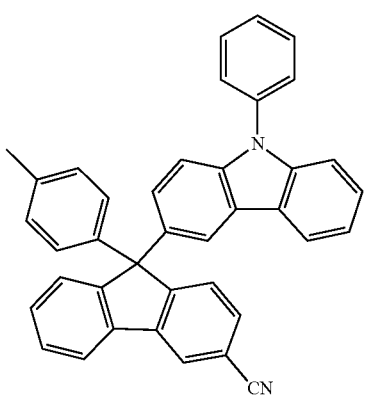
H55 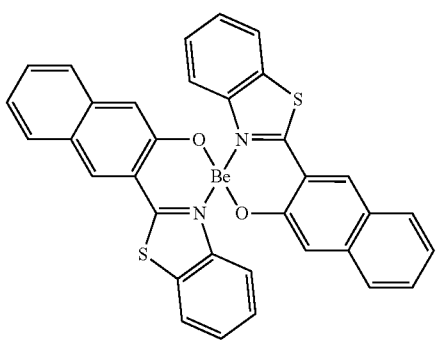

-continued
H56
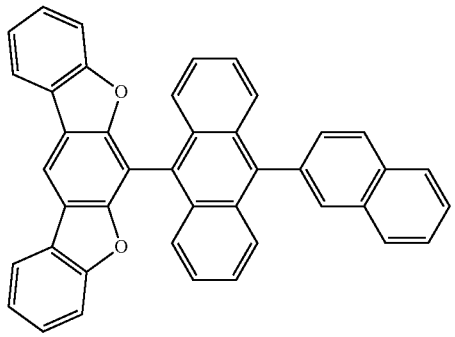
H57
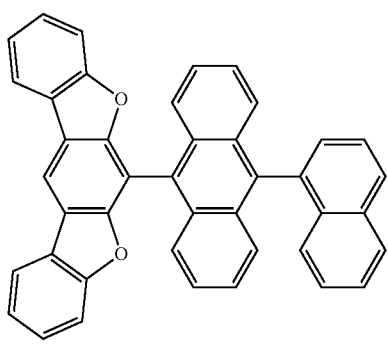
H58
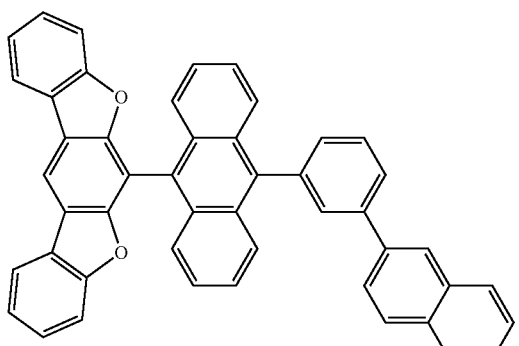
H59
-continued
H60
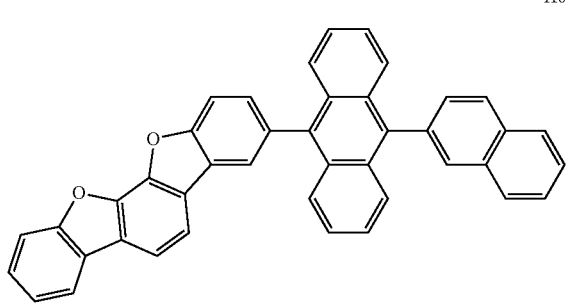
H61
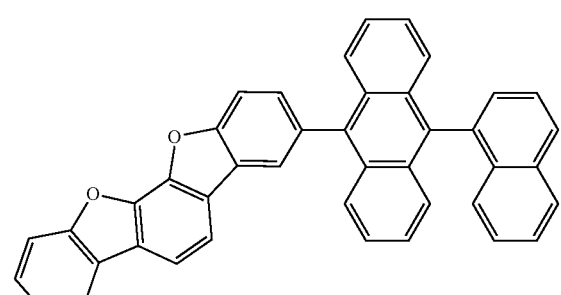
H62
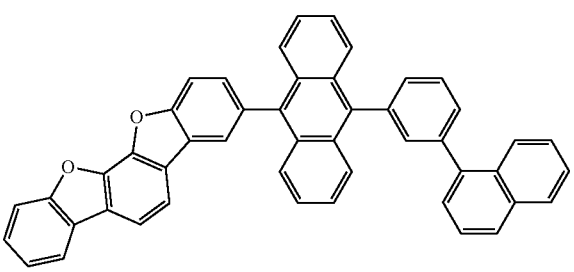
H63
H64
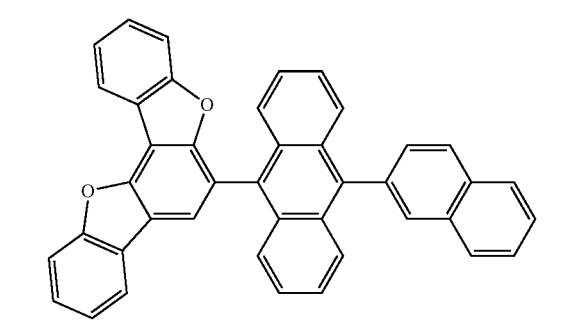

H65
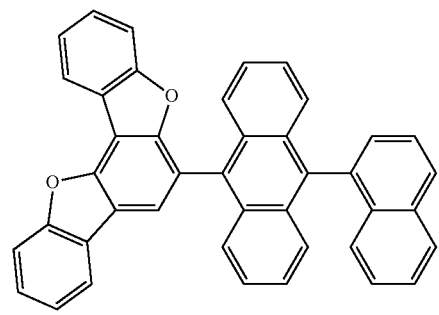
H66
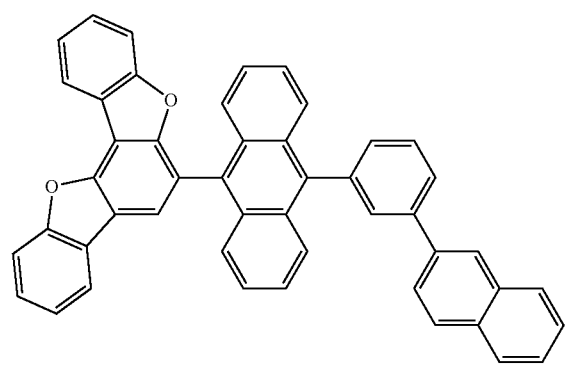
H67
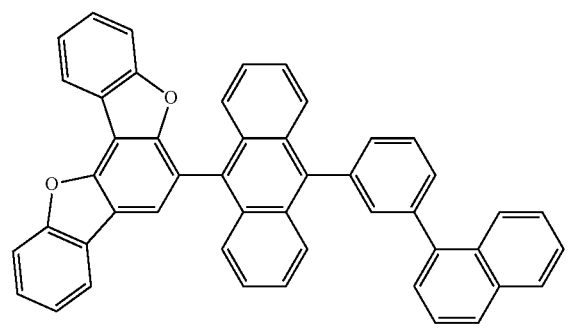
H68
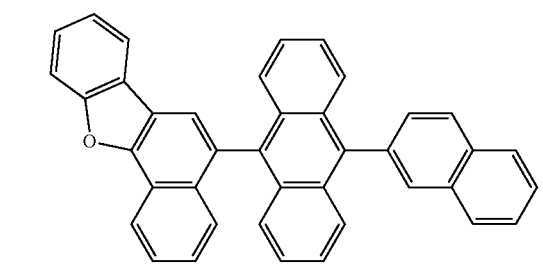
H69
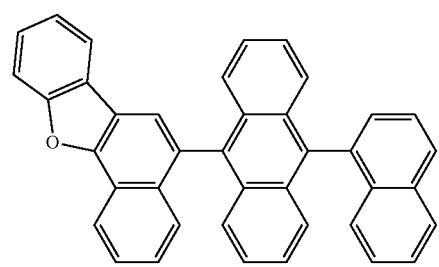
H70
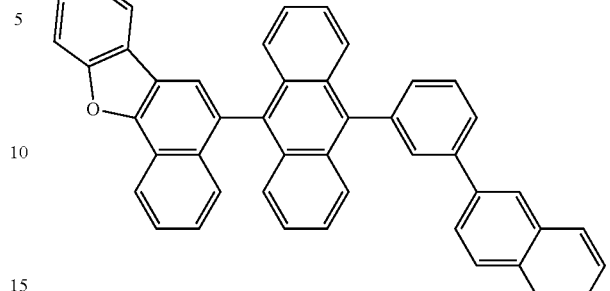
H71
H72
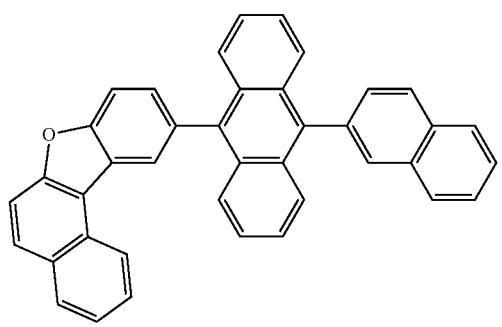
H73
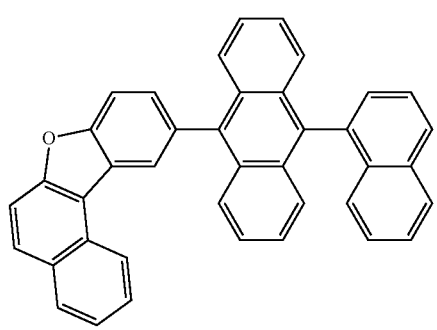

H74
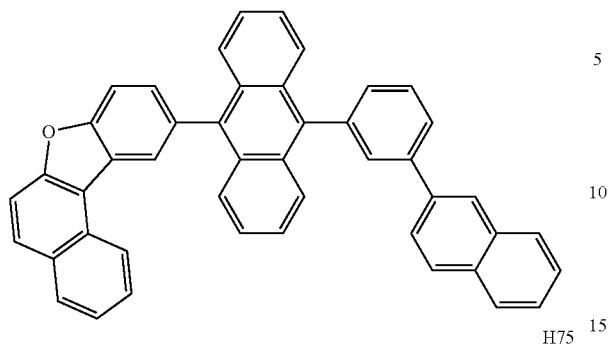
H75
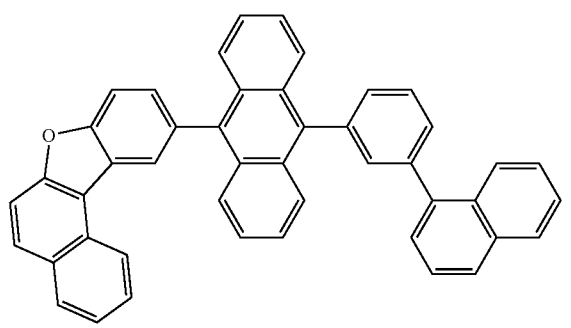
H76
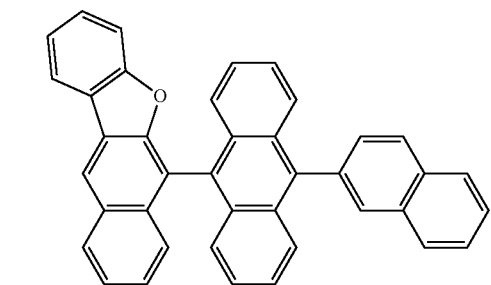
H77
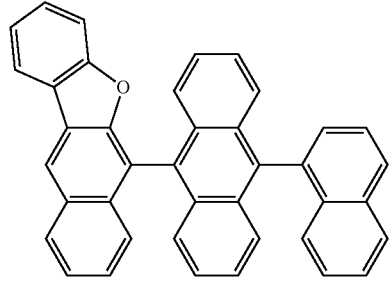
H78
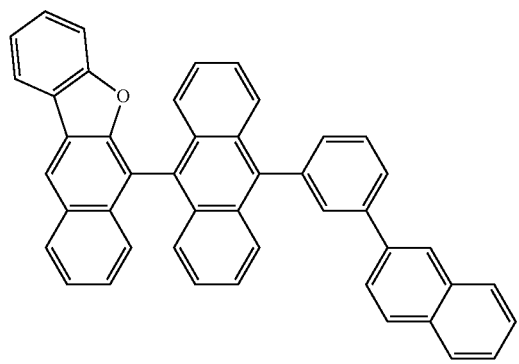
H79
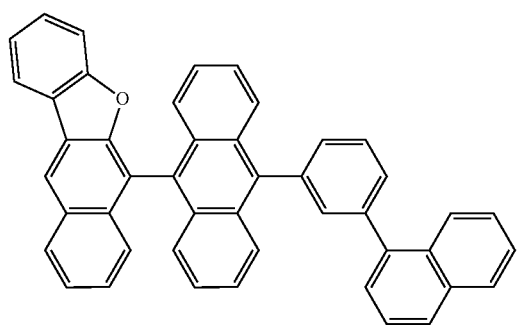
H80
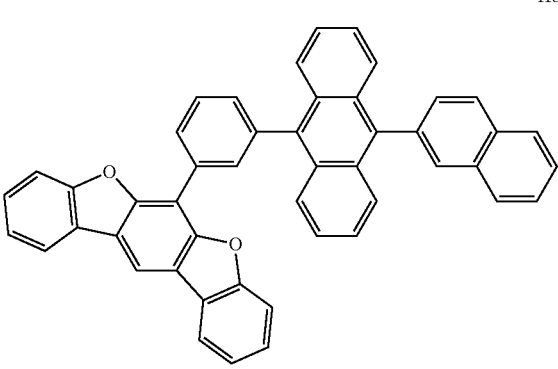
H81
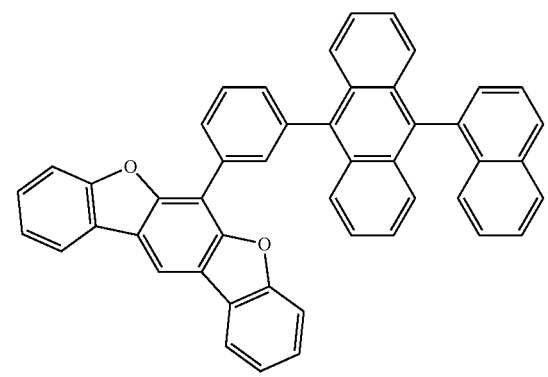
H82
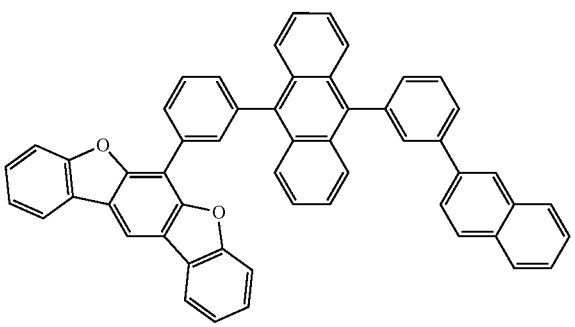

H83
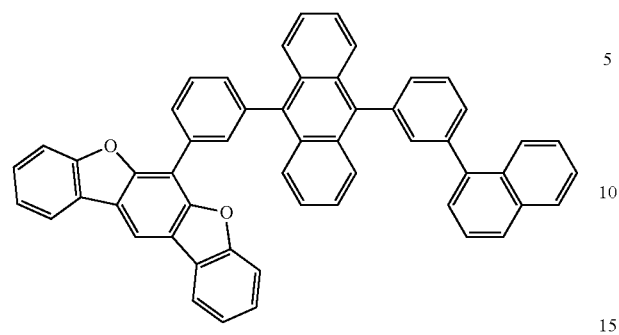
H84
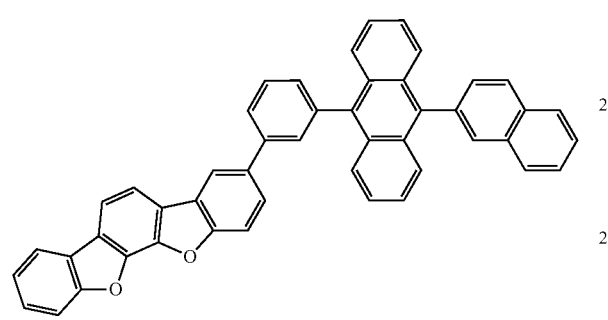
H85
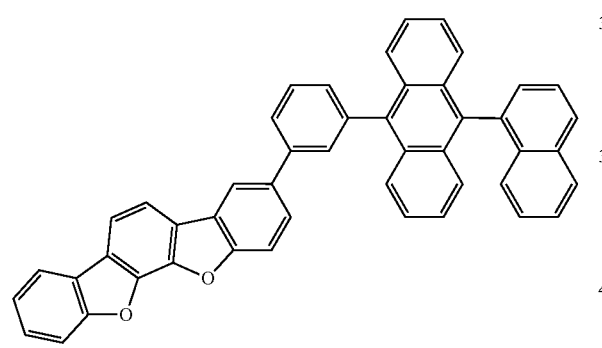
H86
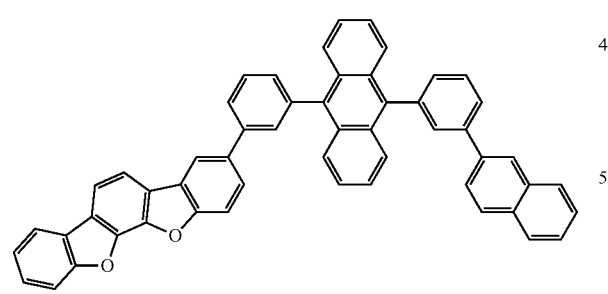
H87
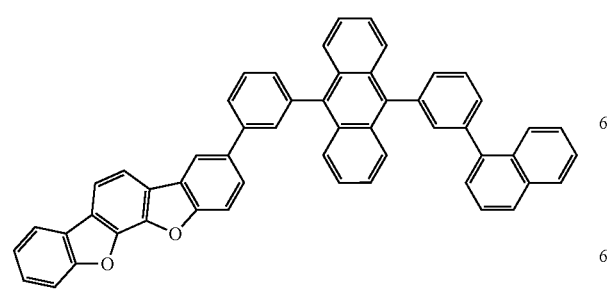
H88
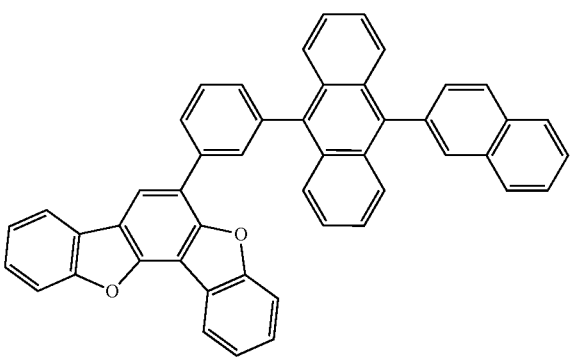
H89
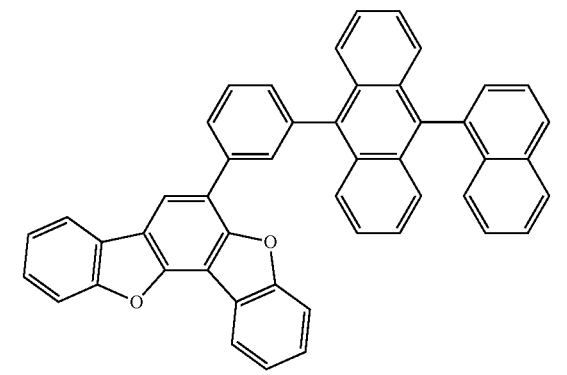
H90
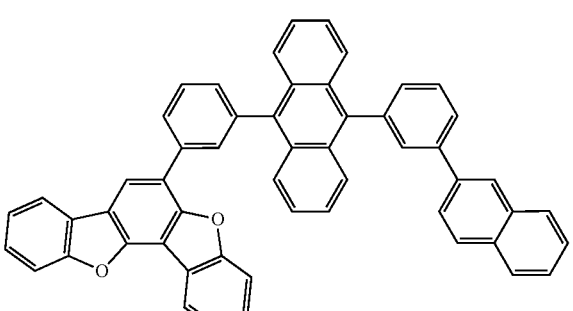
H91
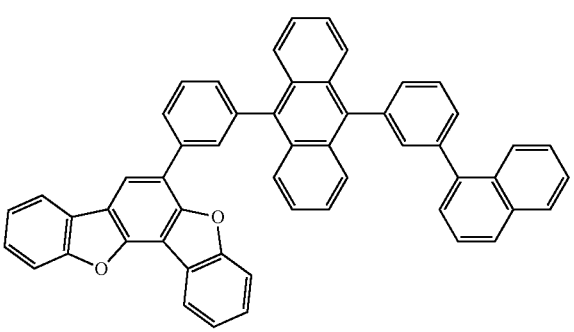

H92
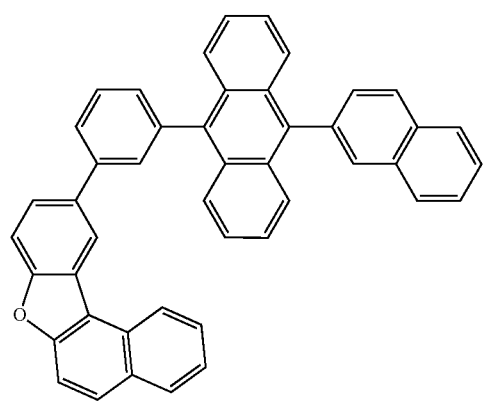
H93
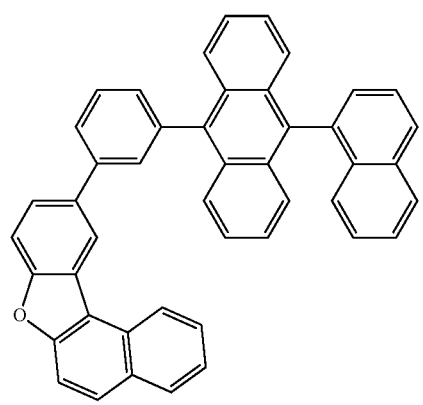
H94
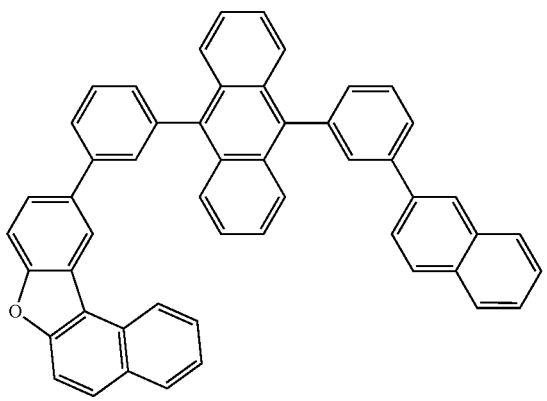
H95
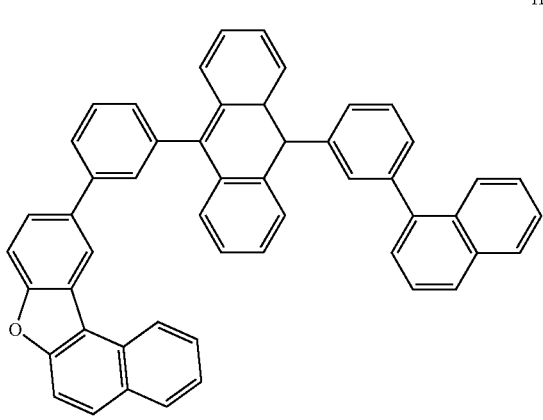
H96
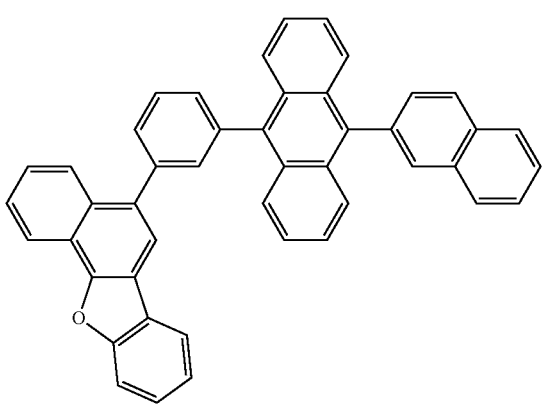
H97
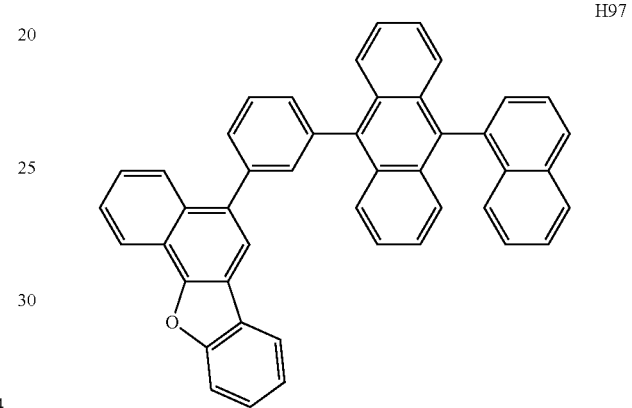
H98
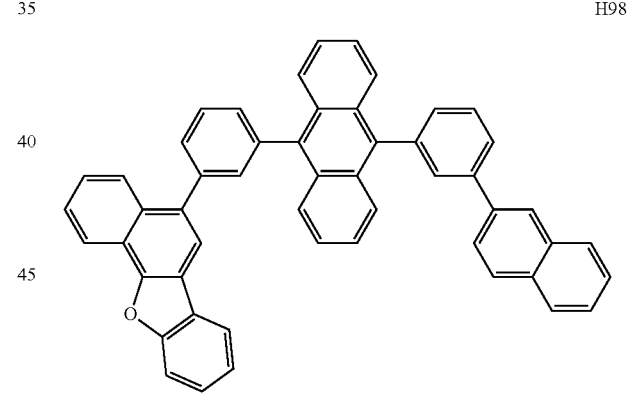
H99
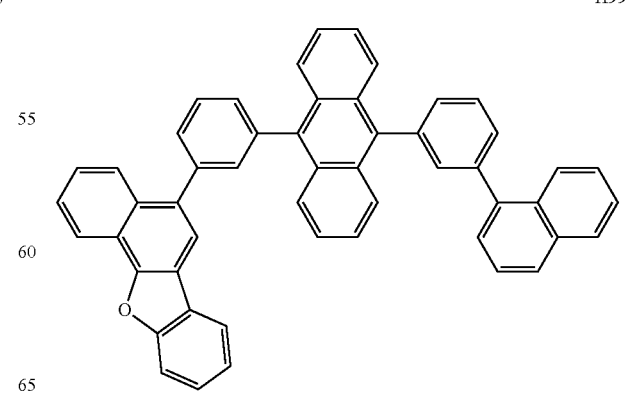

H100
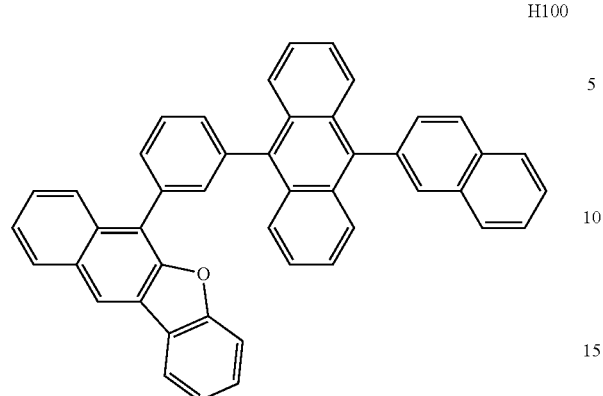
H101
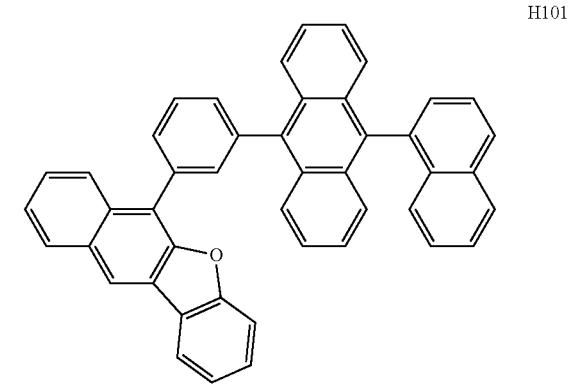
H102
H103
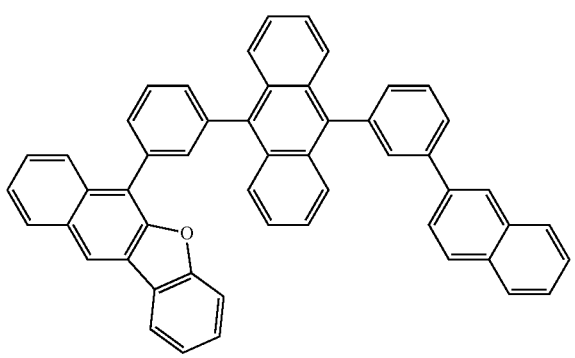
H104
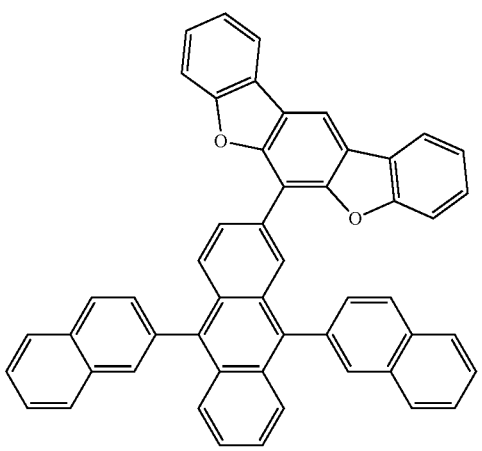
H105
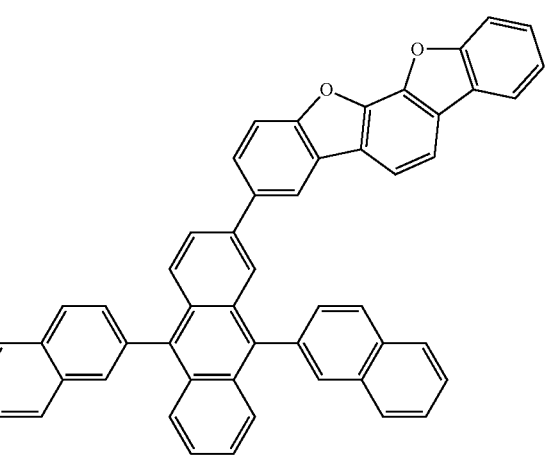
H106
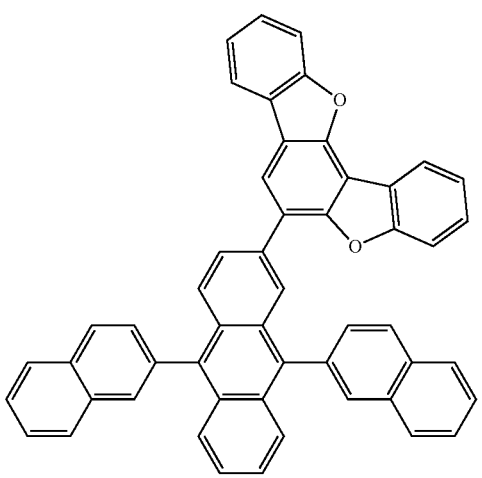

H107

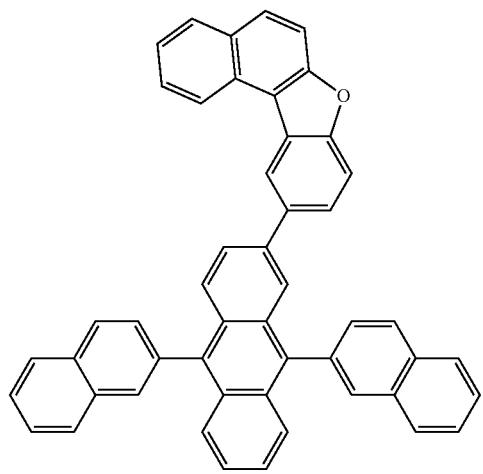

H118

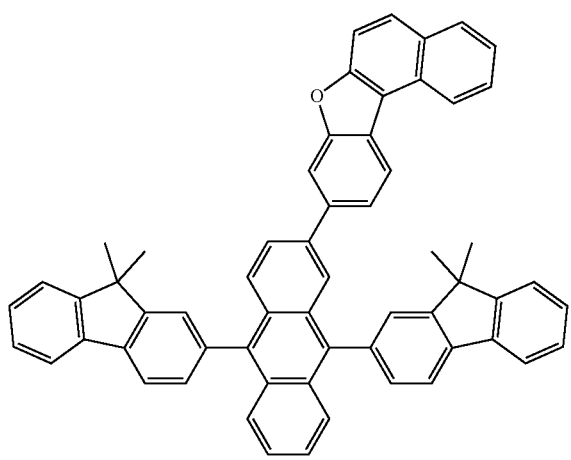

H119

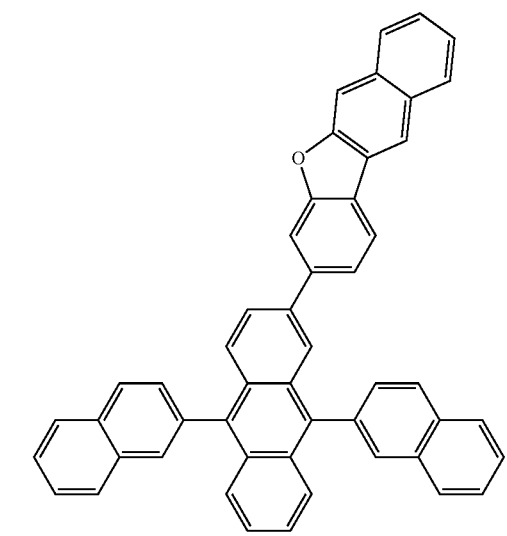

H120

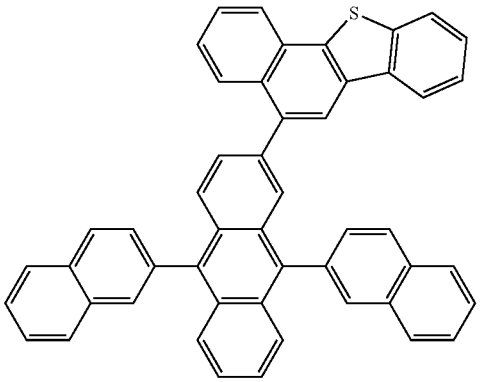

Phosphorescent Dopant Included in Emission Layer in Interlayer 150

The phosphorescent dopant may include at least one transition metal as a central metal. The phosphorescent dopant may include a monodentate ligand, a bidentate ligand, a tridentate ligand, a tetradentate ligand, a pentadentate ligand, a hexadentate ligand, or any combination thereof. The phosphorescent dopant may be electrically neutral.

For example, the phosphorescent dopant may include an organometallic compound represented by Formula 401:

$$M(L_{401})_{xc1}(L_{402})_{xc2}$$ Formula 401

Formula 402

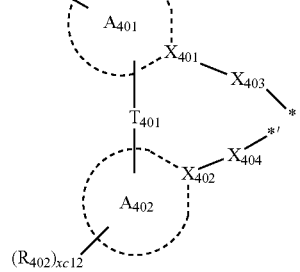

In Formulae 401 and 402,

M may be transition metal (for example, iridium (Ir), platinum (Pt), palladium (Pd), osmium (Os), titanium (Ti), gold (Au), hafnium (Hf), europium (Eu), terbium (Tb), rhodium (Rh), rhenium (Re), or thulium (Tm)), $L_{401}$ may be a ligand represented by Formula 402, xc1 may be 1, 2, or 3, and when xc1 is 2 or more, two or more $L_{401}$(s) may be identical to or different from each other, $L_{402}$ may be an organic ligand, xc2 may be 0, 1, 2, 3, or 4, and when xc2 is 2 or more, two or more $L_{402}$(s) may be identical to or different from each other, $X_{401}$ and $X_{402}$ may each independently be nitrogen or carbon, ring $A_{401}$ and ring $A_{402}$ may each independently be a $C_5$-$C_{60}$ carbocyclic group or a $C_1$-$C_{60}$ heterocyclic group, $T_{401}$ may be a single bond, *—O—*', *—S—*', *—C(=O)—*', *—N($Q_{411}$)-*', *—C($Q_{411}$)($Q_{412}$)-*', *—C($Q_{411}$)=C($Q_{412}$)-*', *—C($Q_{411}$)=*', or *=C($Q_{411}$)=*', $X_{403}$ and $X_{404}$ may each independently be a chemical bond (for example, a covalent bond or a coordinate bond), O, S, $N(Q_{413})$, $B(Q_{413})$, $P(Q_{413})$, $C(Q_{413})(Q_{414})$, or $Si(Q_{413})(Q_{414})$, and $Q_{411}$ to $Q_{414}$ may each be the same as described in connection with $Q_1$ as described herein.

$R_{401}$ and $R_{402}$ may each independently be hydrogen, deuterium, —F, —Cl, —Br, —I, a hydroxyl group, a cyano group, a nitro group, a substituted or unsubstituted $C_1$-$C_{20}$ alkyl group, a substituted or unsubstituted $C_1$-$C_{20}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, —$Si(Q_{401})(Q_{402})(Q_{403})$, —$N(Q_{401})(Q_{402})$, —$B(Q_{401})(Q_{402})$, —$C(=O)(Q_{401})$, —$S(=O)_2(Q_{401})$, or —$P(=O)(Q_{401})(Q_{402})$, $Q_{401}$ to $Q_{403}$ may each be the same as described in connection with $Q_1$ as described herein, xcii and xc12 may each independently be an integer from 0 to 10, and

* and *' in Formula 402 each indicate a binding site to M in Formula 401.

In one or more exemplary embodiments, in Formula 402, i) $X_{401}$ may be nitrogen, and $X_{402}$ may be carbon, or ii) each of $X_{401}$ and $X_{402}$ may be nitrogen.

In one or more exemplary embodiments, when xc1 in Formula 402 is 2 or more, two ring $A_{401}$(s) in two or more $L_{401}$(s) may optionally be linked to each other via $T_{402}$, which is a linking group, or two ring $A_{402}$(s) in two or more $L_{401}$(s) may optionally be linked to each other via $T_{403}$, which is a linking group (see Compounds PD1 to PD4 and PD7). $T_{402}$ and $T_{403}$ may each be the same as described in connection with $T_{401}$ as described herein.

$L_{402}$ in Formula 401 may be an organic ligand. For example, $L_{402}$ may be a halogen group, a diketone group (for example, an acetylacetonate group), a carboxylic acid group (for example, picolinate group), —C(=O), an isonitril group, a —CN group, a phosphorus group (for example, a phosphine group or a phosphite group), or any combination thereof, but the exemplary embodiments are not limited thereto.

The phosphorescent dopant may include, for example, one of Compound PD1 to PD25 below, or any combination, but the exemplary embodiments are not limited thereto:

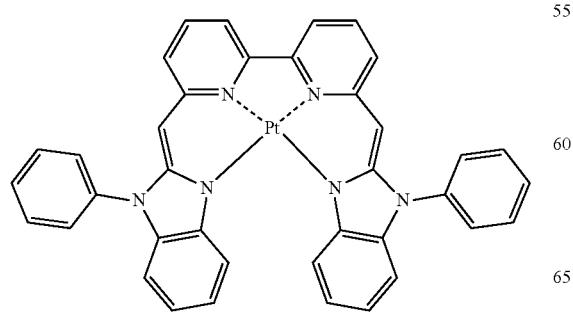

PD1

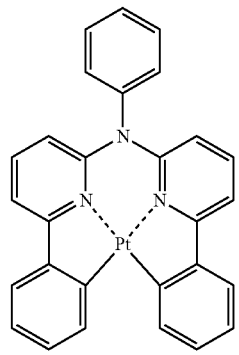

PD2

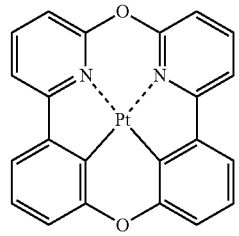

PD3

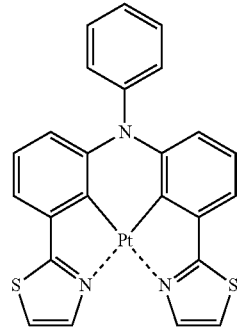

PD4

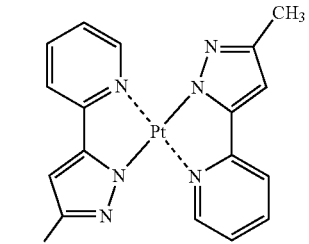

PD5

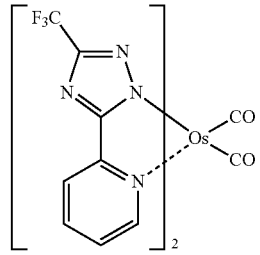

PD6

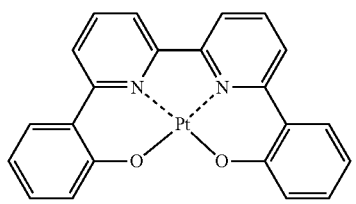
PD7
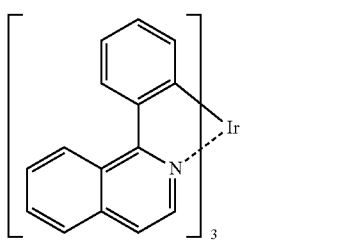
PD8
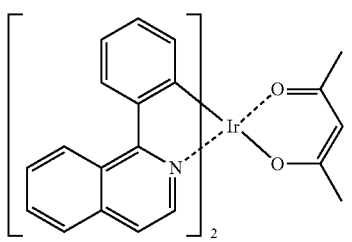
PD9
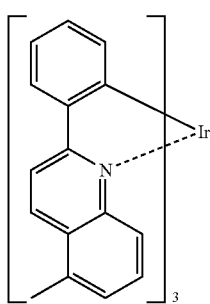
PD10
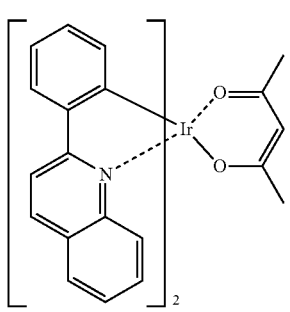
PD11
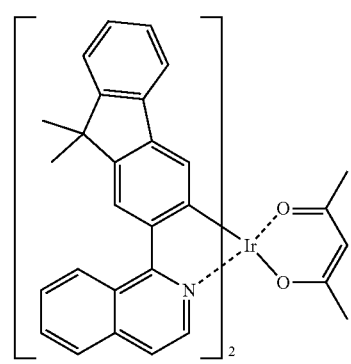
PD12
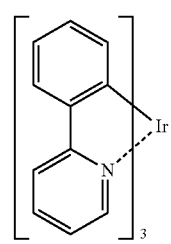
PD13
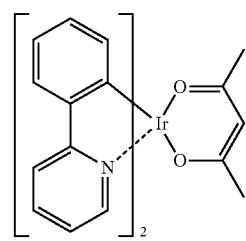
PD14
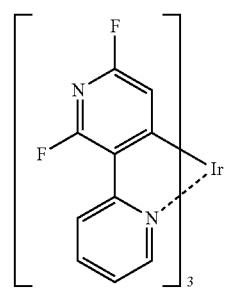
PD15
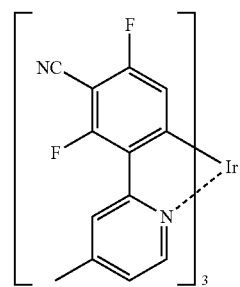
PD16

PD17 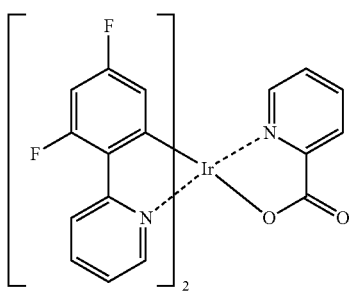
PD18 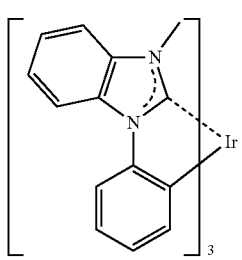
PD19 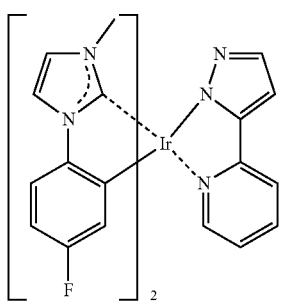
PD20 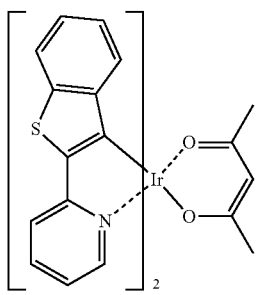
PD21 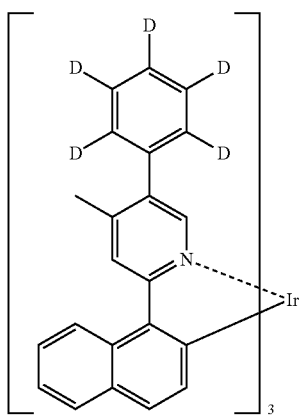
PD22 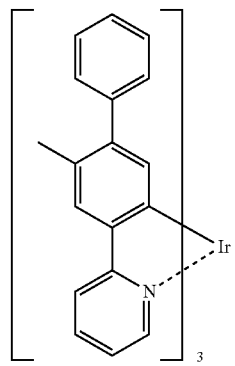
PD23 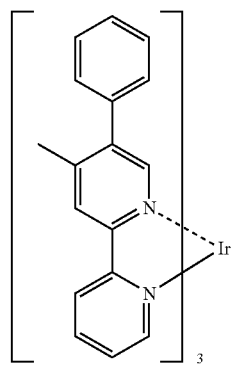
PD24 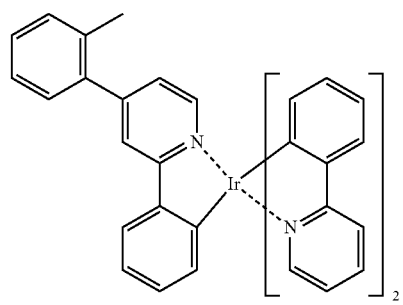
PD25 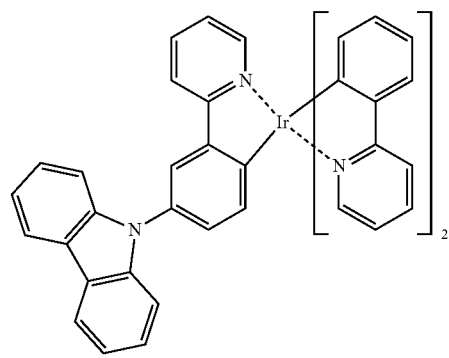
Fluorescent Dopant in Emission Layer
The fluorescent dopant may include an arylamine compound or a styrylamine compound. For example, the fluorescent dopant may include a compound represented by Formula 501:

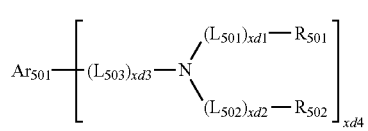

Formula 501

In Formula 501, $Ar_{501}$ may be a substituted or unsubstituted $C_5$-$C_{60}$ carbocyclic group or a substituted or unsubstituted $C_1$-$C_{60}$ heterocyclic group, $L_{501}$ to $L_{503}$ may each independently be a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, or a substituted or unsubstituted divalent non-aromatic condensed heteropolycyclic group, xd1 to xd3 may each independently be 0, 1, 2, or 3, $R_{501}$ and $R_{502}$ may each independently be a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted CO—$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group, and xd4 may be 1, 2, 3, 4, 5, or 6.

For example, $Ar_{501}$ in Formula 501 may be a condensed cyclic ring (for example, an anthracene group, a chrysene group, a pyrene group, etc.) in which three or more monocyclic groups are condensed with each other. In one exemplary embodiment, xd4 in Formula 501 may be 2, but the exemplary embodiments are not limited thereto.

For example, the fluorescent dopant may include one of Compounds FD1 to FD36 below, or 4,4'-bis(2,2-diphenylethenyl)-1,1'-biphenyl (DPVBi), 4,4'-Bis[4-(di-p-tolylamino) styryl]biphenyl (DPAVBi), or any combination thereof:

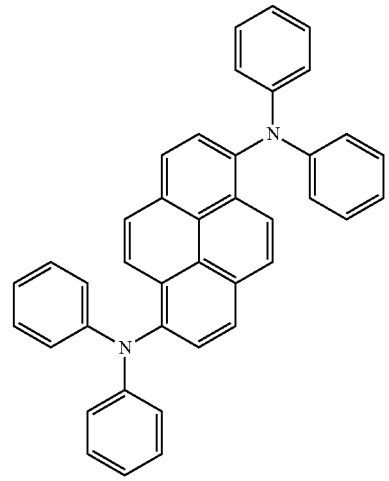

FD1

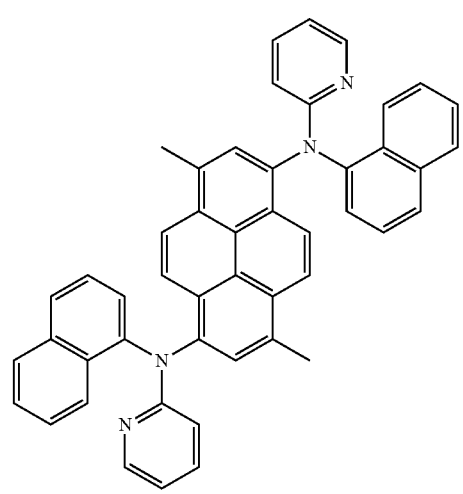

FD2

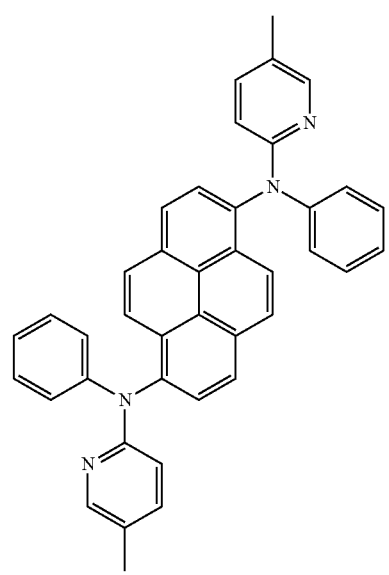

FD3

FD4
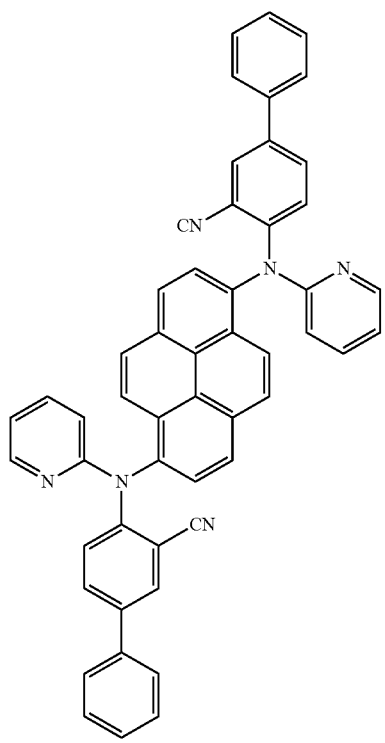
FD6
FD7
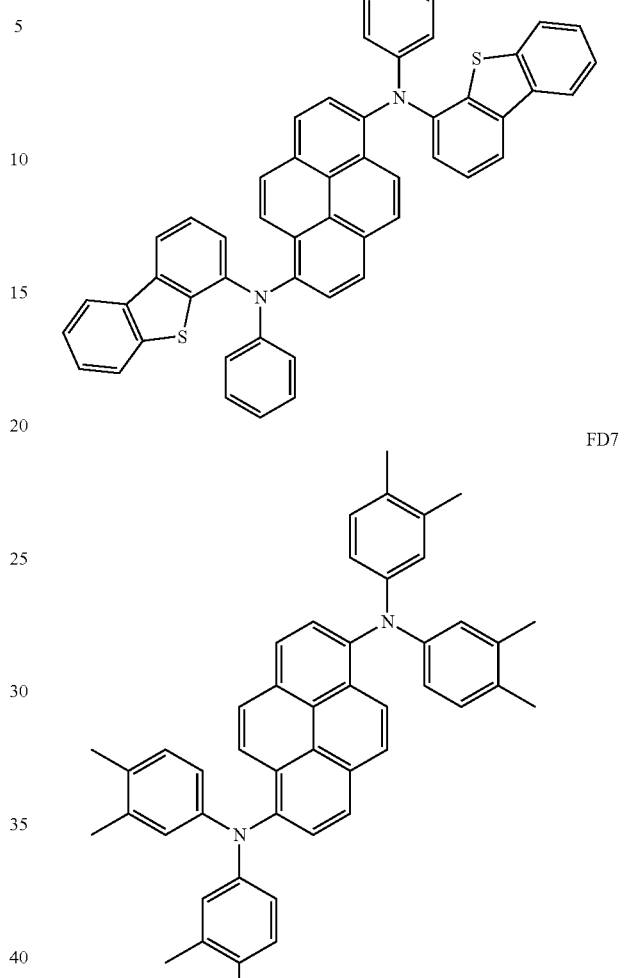
FD5
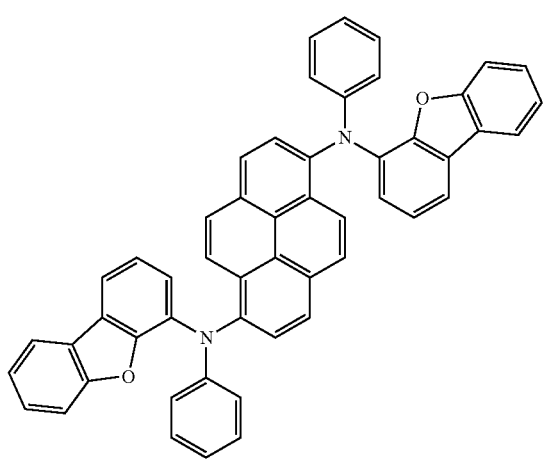
FD8

FD9
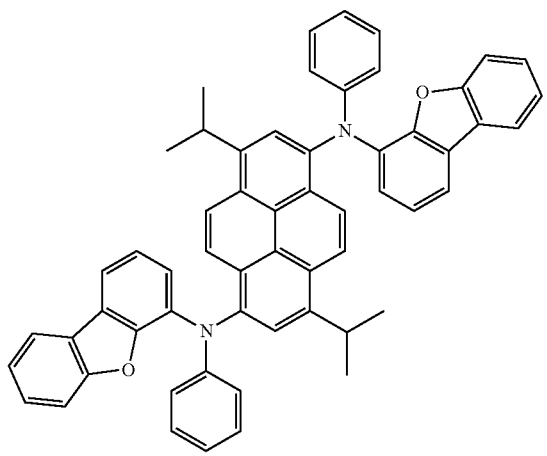
FD10
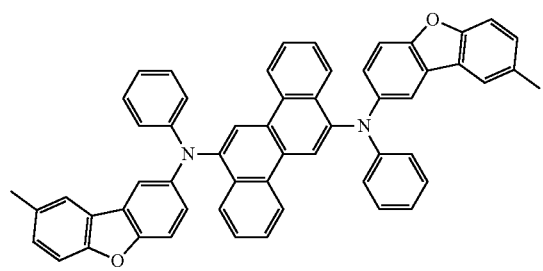
FD11
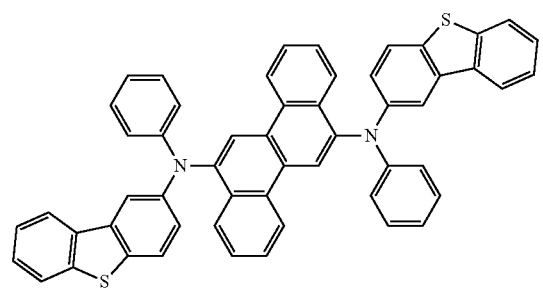
FD12
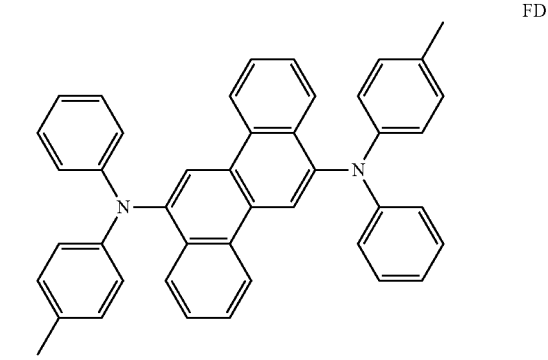
FD13
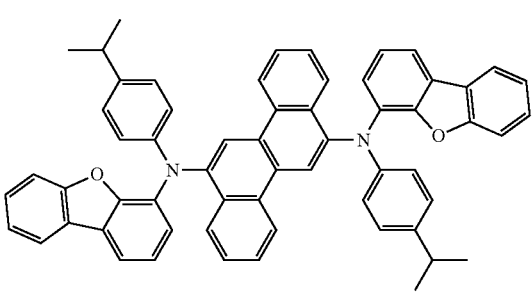
FD14
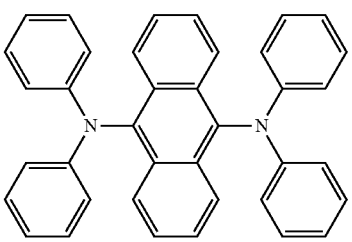
FD15
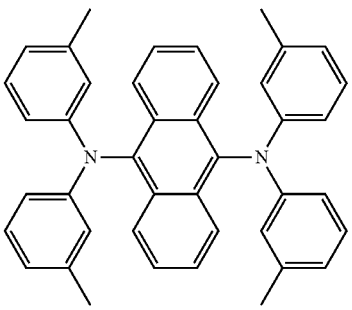
FD16
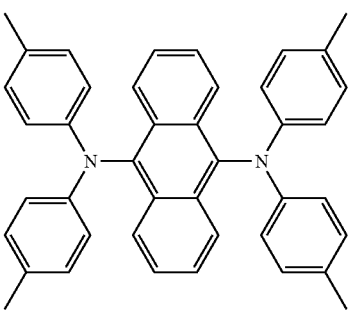
FD17
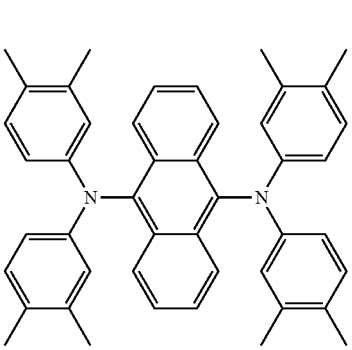

FD18
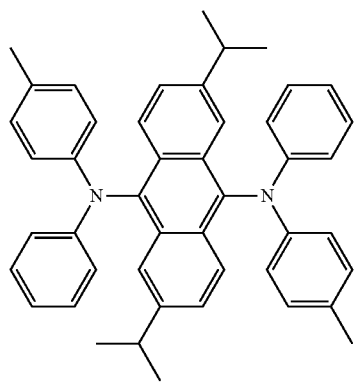
FD19
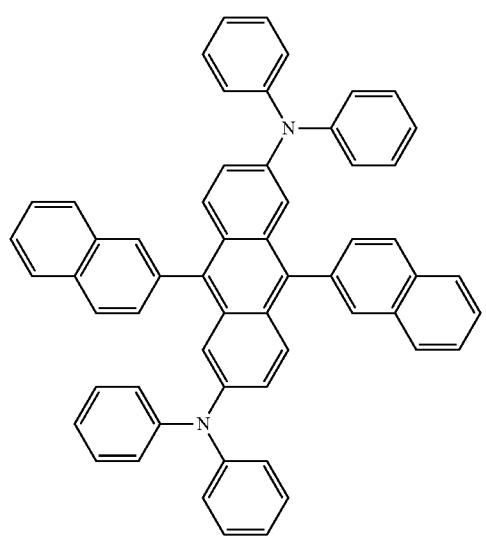
FD20
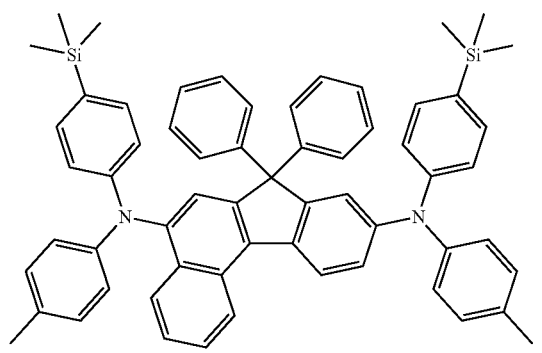
FD21
FD22
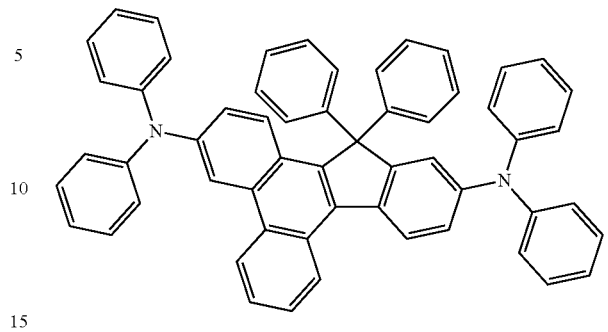
FD23
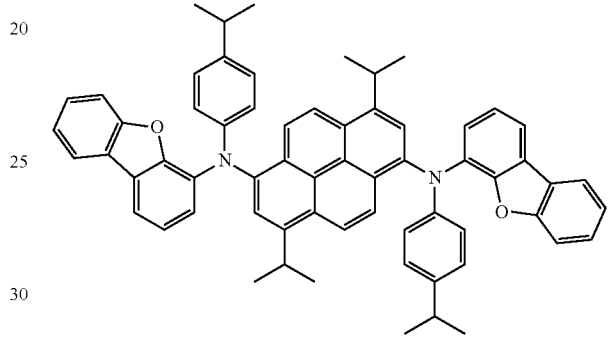
FD24
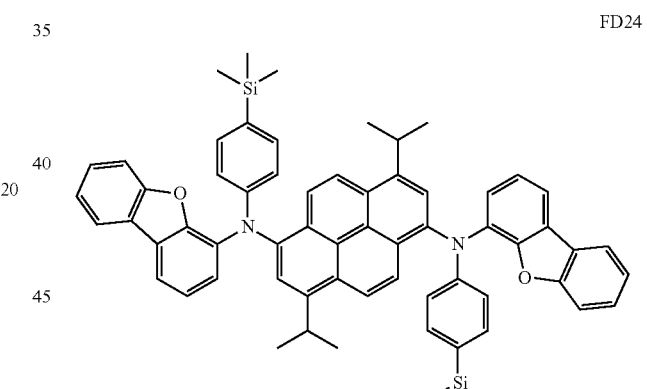
FD25
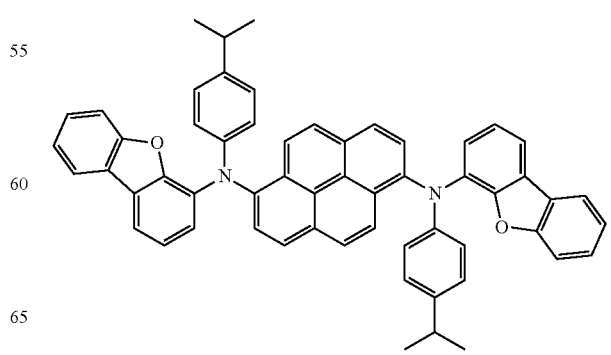

FD26
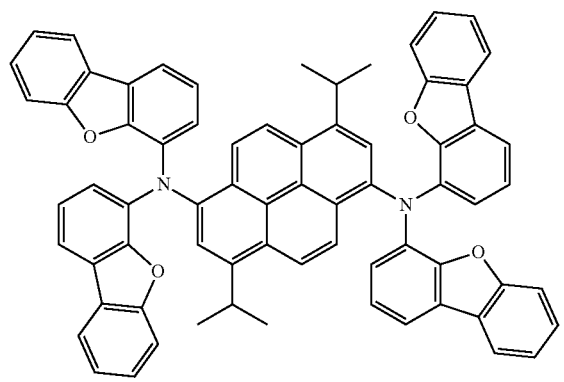
FD30
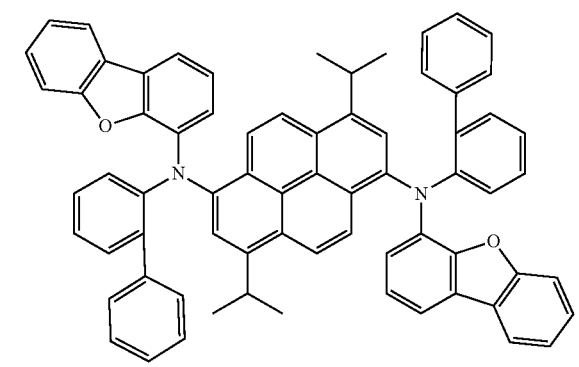
FD27
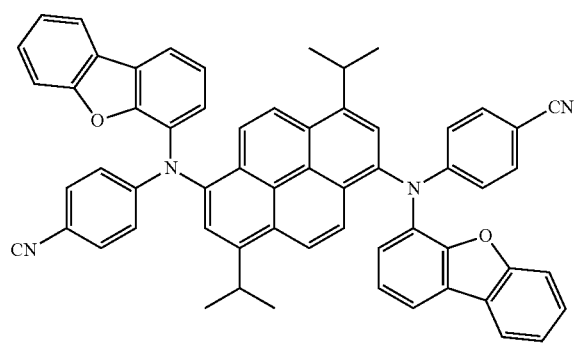
FD31
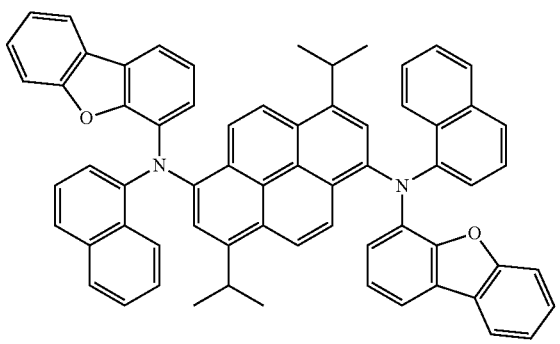
FD28
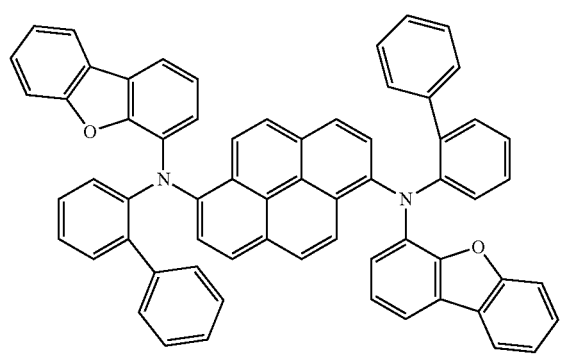
FD32
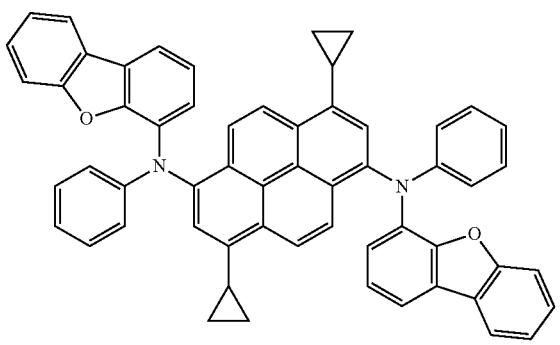
FD29
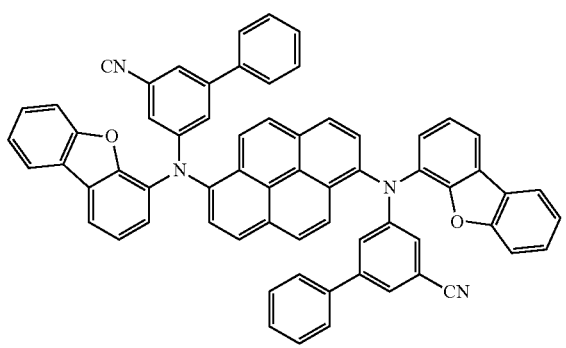
FD33
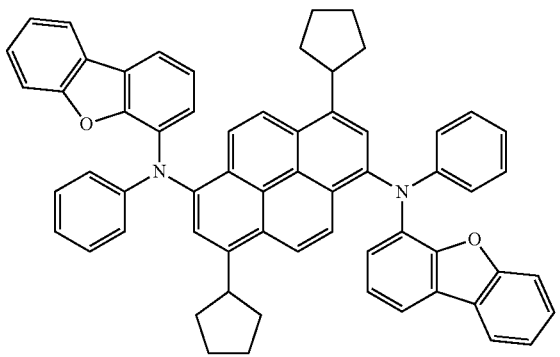

-continued

FD34

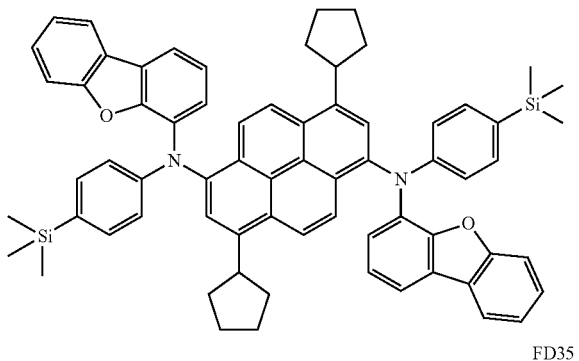

FD35

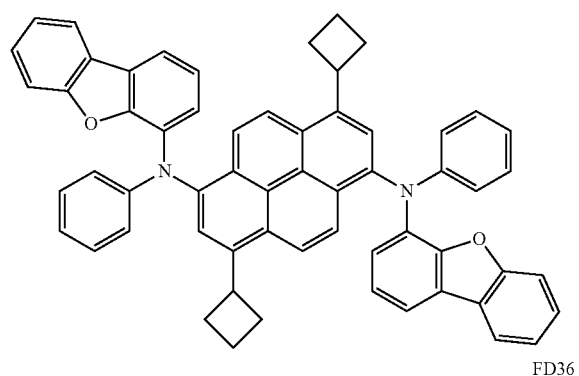

FD36

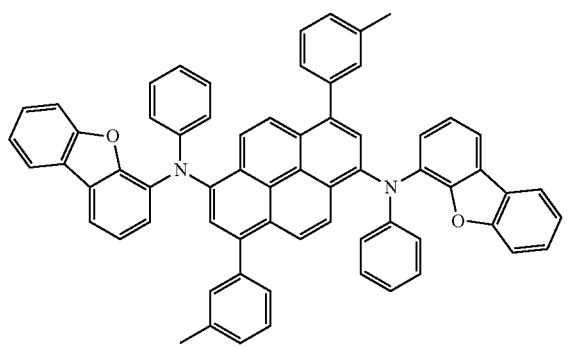

DPVBi

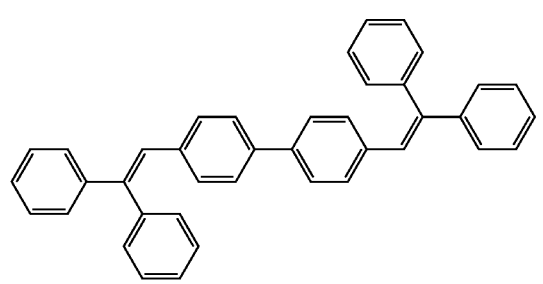

DPAVBi

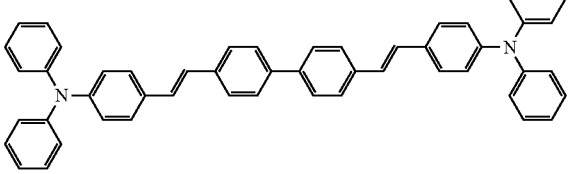

Electron Transport Region in Interlayer 150

The electron transport region may have: i) a single-layered structure consisting of a single layer consisting of a single material, ii) a single-layered structure consisting of a single layer consisting of a plurality of different materials, or iii) a multi-layered structure including a plurality of layers including different materials.

The electron transport region may include a buffer layer, a hole blocking layer, an electron control layer, an electron transport layer, an electron injection layer, or any combination thereof, but the exemplary embodiments are not limited thereto. For example, the electron transport region may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein for each structure, constituting layers are sequentially stacked from the emission layer. However, the exemplary embodiments of the structure of the electron transport region are not limited thereto.

The electron transport region (for example, the buffer layer, the hole blocking layer, the electron control layer, or the electron transport layer in the electron transport region) may include a metal-free compound including at least one π-electron deficient nitrogen-containing cyclic group, which may easily accept electrons.

Examples of the π-electron deficient nitrogen-containing cyclic group are a pyridine group, a pyrimidine group, a pyrazine group, a pyridazine group, a triazine group, a quinoline group, a benzoquinoline group, an isoquinoline group, a benzoisoquinoline group, a quinoxaline group, a benzoquinoxaline group, a quinazoline group, a benzoquinazoline group, a cinnoline group, a phenanthroline group, a phthalazine group, a naphthyridine group, an azacarbazole group, an azafluorene group, an azadibenzosilole group, an azadibenzothiophene group, an azadibenzofuran group, a pyrazole group, an imidazole group, a triazole group, a tetrazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, an imidazopyridine group, an imidazopyrimidine group, an imidazotriazine group, an imidazopyrazine group, and an imidazopyridazine group, but the exemplary embodiments are not limited thereto.

The buffer layer may include the ET2'. For use as the ET2', compounds satisfying the energy relationship as described above among the HT, the ET1, and the ET2 that are included in the emission layer, and the ET2' included in the buffer layer may be used in the buffer layer.

For example, the electron transport region may include a compound represented by Formula 601 and including at least one π-electron deficient nitrogen-containing cyclic group:

$$[Ar_{601}]_{xe11}-[(L_{601})_{xe1}-R_{601}]_{xe21}. \quad \text{Formula 601}$$

In Formula 601, $Ar_{601}$ may be a substituted or unsubstituted $C_5$-$C_{60}$ carbocyclic group or a substituted or unsubstituted $C_1$-$C_{60}$ heterocyclic group, xe11 may be 1, 2, or 3, $L_{601}$ may be a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, or a substituted or unsubstituted divalent non-aromatic condensed heteropolycyclic group, xe1 may be 0, 1, 2, 3, 4, or 5, $R_{601}$ may be a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, $-Si(Q_{601})(Q_{602})(Q_{603})$, $-C(=O)(Q_{601})$, $-S(=O)_2(Q_{601})$, or $-P(=O)(Q_{601})(Q_{602})$, $Q_{601}$ to $Q_{603}$ may each be the same as described in connection with $Q_1$ as described herein, and xe21 may be 1, 2, 3, 4, or 5.

For example, at least one of $Ar_{601}$, $L_{601}$, and $R_{601}$ in Formula 601 may each independently include at least one π-electron deficient nitrogen-containing ring. In one or more exemplary embodiments, when xe11 in Formula 601 is 2 or more, two or more $Ar_{601}$(s) may be linked to each other via a single bond. In one exemplary embodiment, $Ar_{601}$ in Formula 601 may be a substituted or unsubstituted anthracene group.

In one exemplary embodiment, the electron transport region may include a compound represented by Formula 601-1:

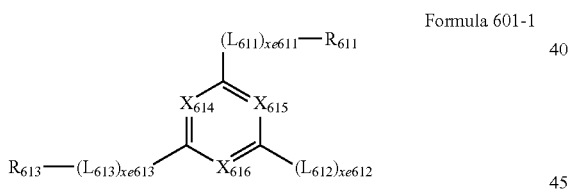

Formula 601-1

In Formula 601-1, $X_{614}$ may be N or $C(R_{614})$, $X_{615}$ may be N or $C(R_{615})$, $X_{616}$ may be N or $C(R_{616})$ and at least one of $X_{614}$ to $X_{616}$ may be N, $L_{611}$ to $L_{613}$ may each be the same as described in connection with $L_{601}$, xe611 to xe613 may each be the same as described in connection with xe1, $R_{611}$ to $R_{613}$ may each be the same as described in connection with $R_{601}$, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a phenyl group, a biphenyl group, a terphenyl group, or a naphthyl group.

For example, xe1 and xe611 to xe613 in Formulae 601 and 601-1 may each independently be 0, 1, or 2.

The electron transport region may include one of Compounds ET1 to ET36 below, or 2,9-dimethyl-4,7-diphenyl-1,10-phenanthroline (BCP), 4,7-diphenyl-1,10-phenanthroline (Bphen), tris-(8-hydroxyquinoline)aluminum (Alq$_3$), bis(2-methyl-8-quinolinolato-N1,O8)-(1,1'-biphenyl-4-olato)aluminum (BAlq), 3-(biphenyl-4-yl)-5-(4-tert-butylphenyl)-4-phenyl-4H-1,2,4-triazole (TAZ), 4-(naphthalen-1-yl)-3,5-diphenyl-4H-1,2,4-triazole (NTAZ), or any combination thereof, but the exemplary embodiments are not limited thereto:

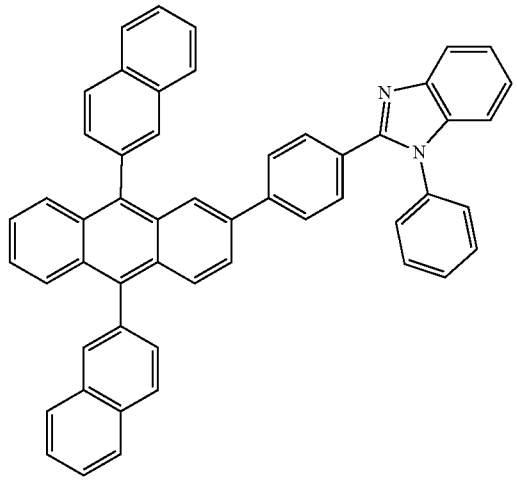

ET1

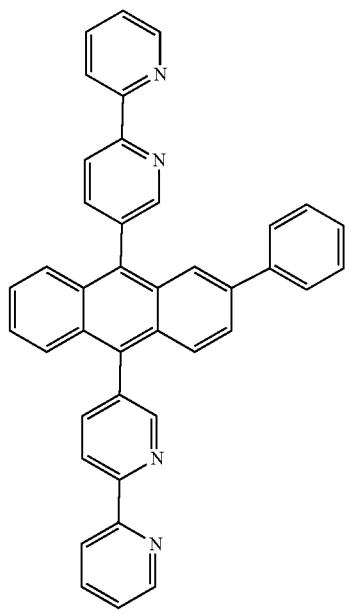

ET2

-continued
ET3
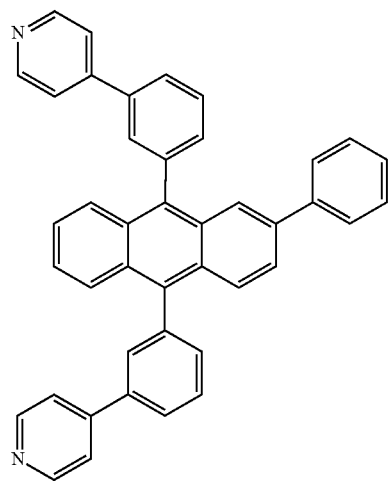
ET4
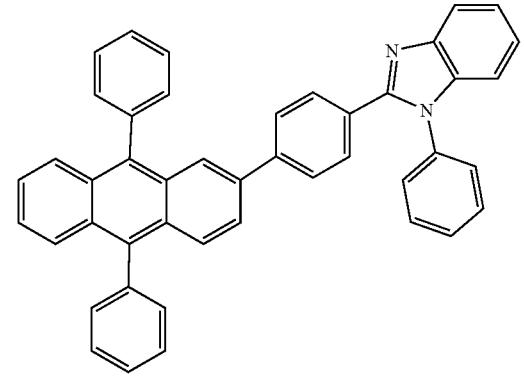
ET5
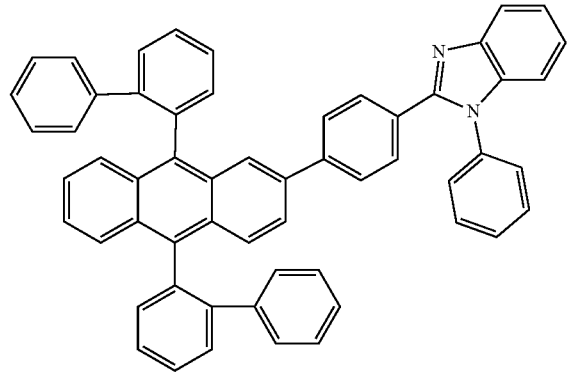
ET6
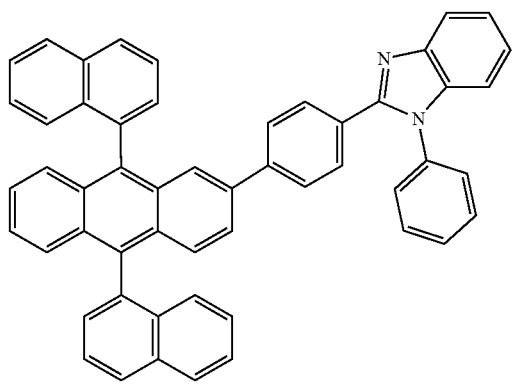
ET7
ET8
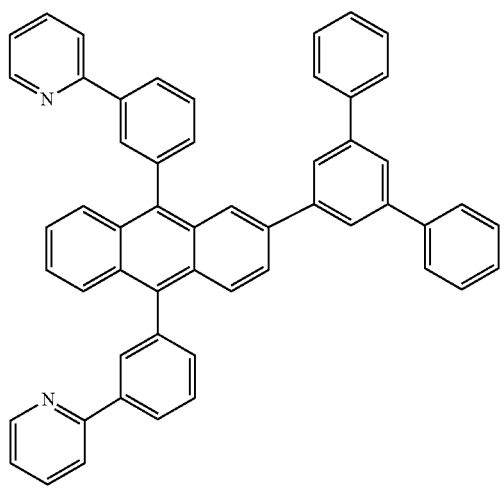

ET9
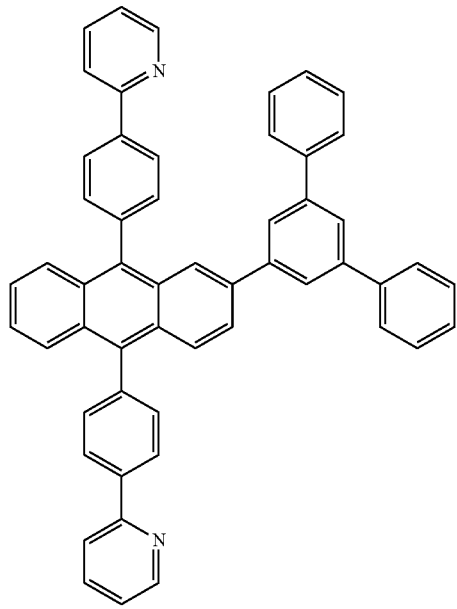
ET11
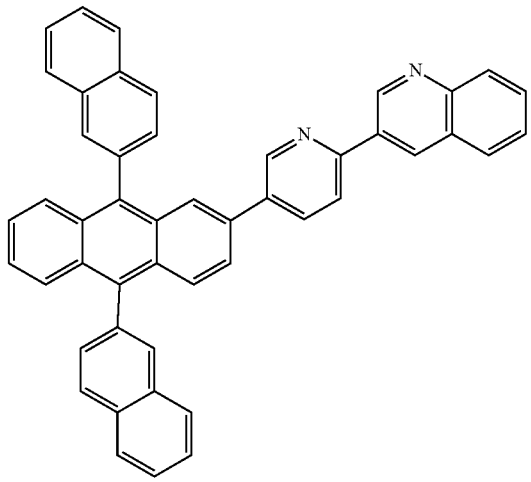
ET12
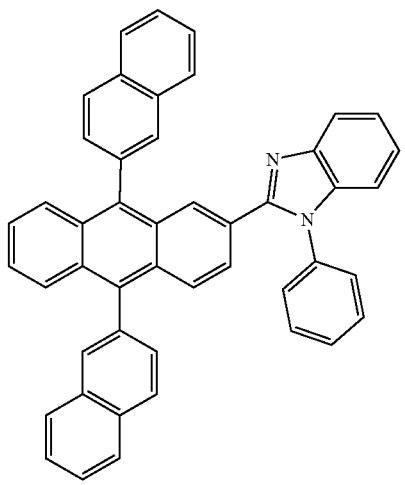
ET10
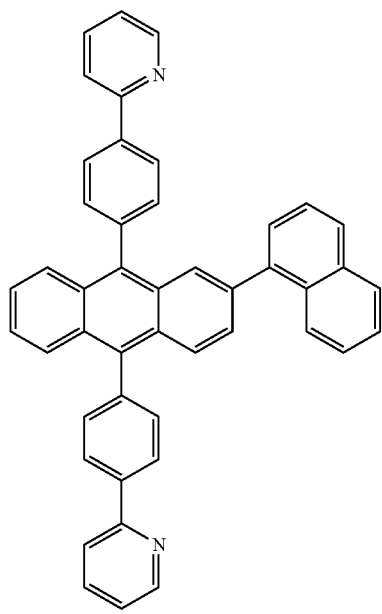
ET13

ET14
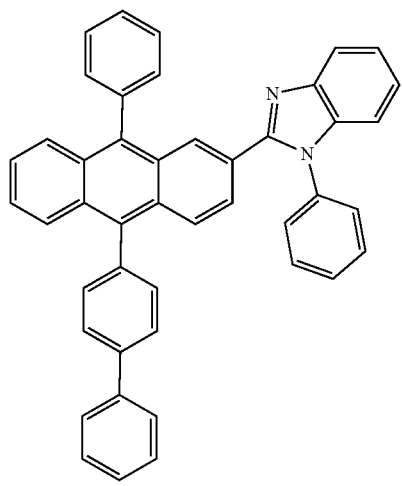
ET15
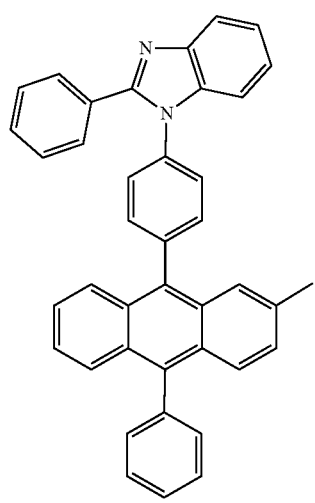
ET16
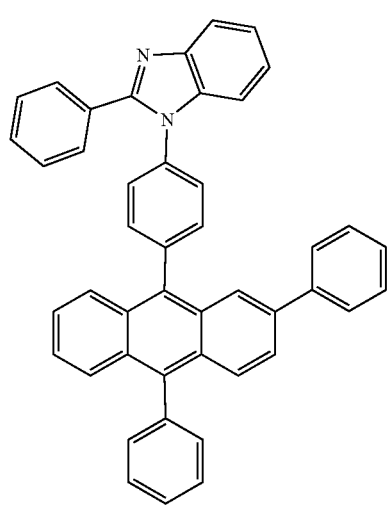
ET17
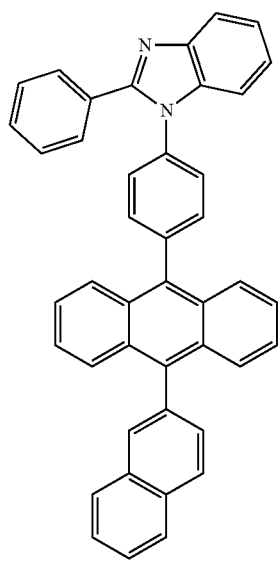
ET18
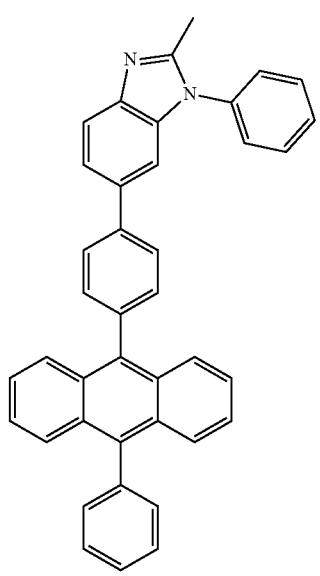
ET19

-continued
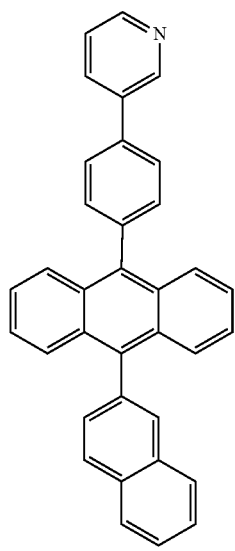
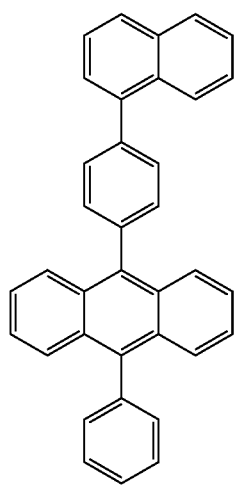
ET20
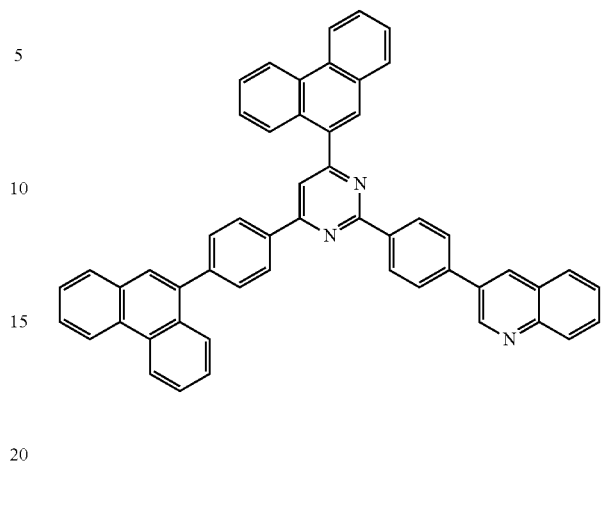
ET21
ET22
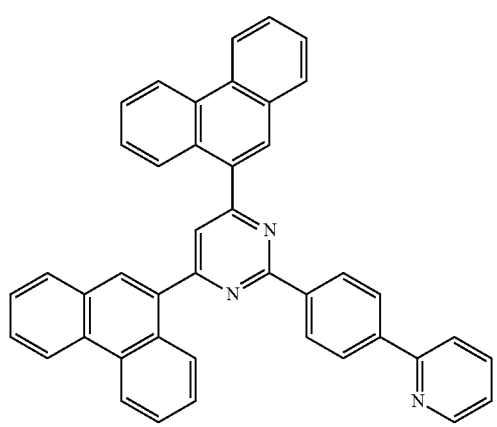
ET23
ET24
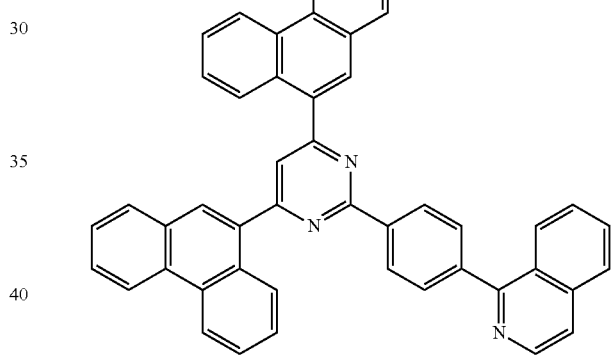
ET25
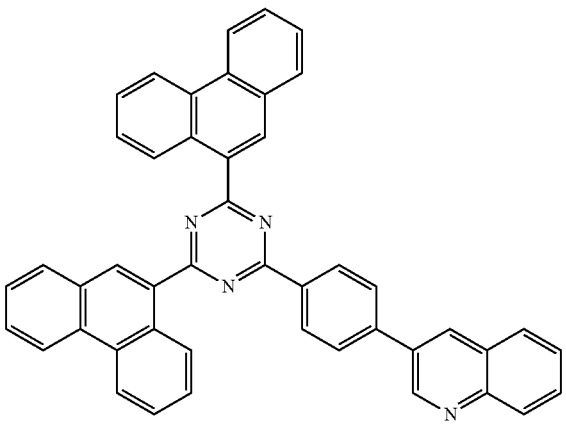

ET26
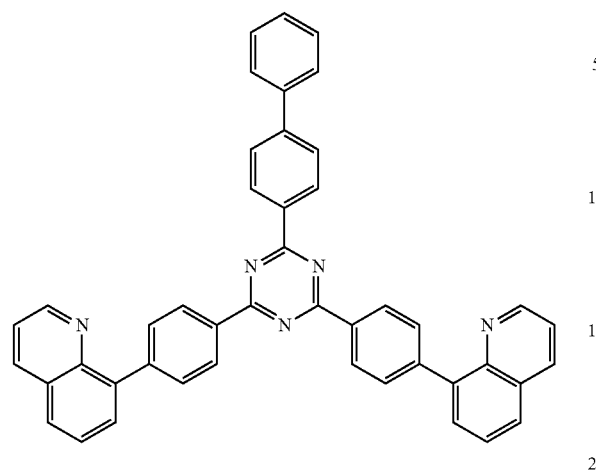
ET27
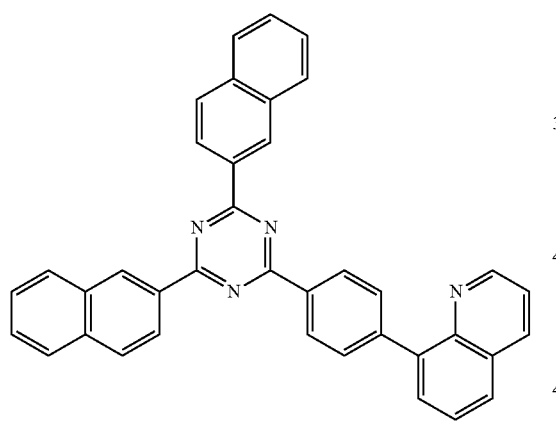
ET28
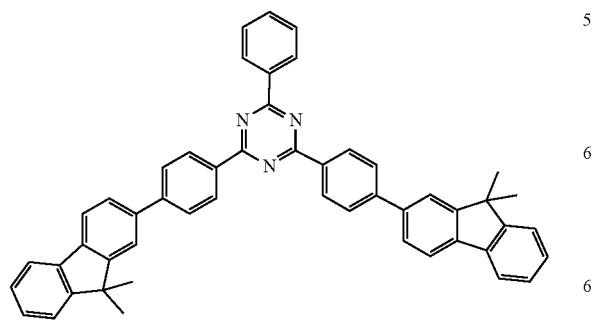
ET29
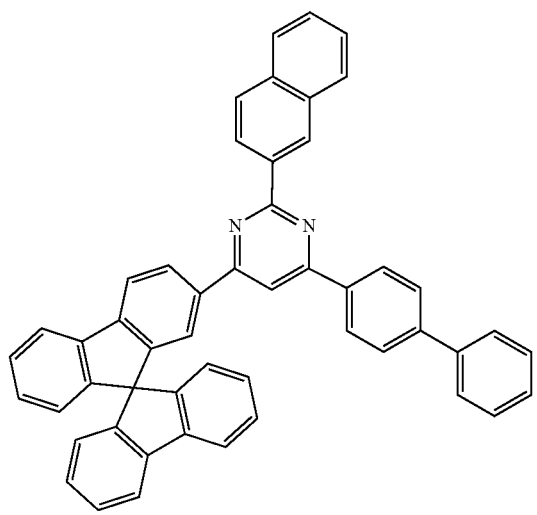
ET30
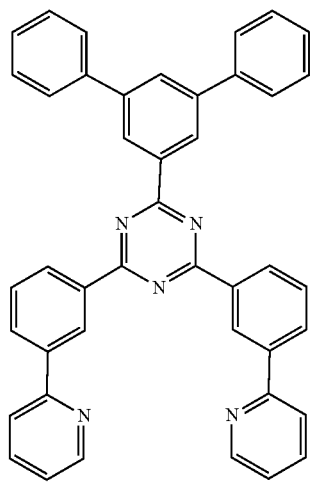
ET31
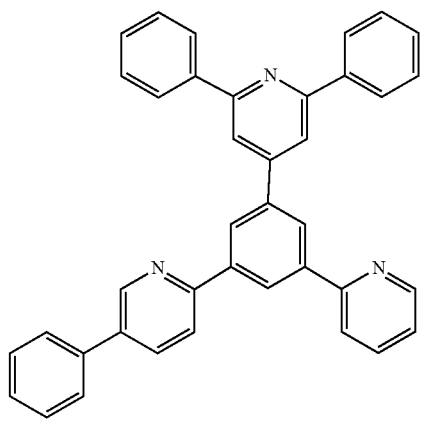

ET32
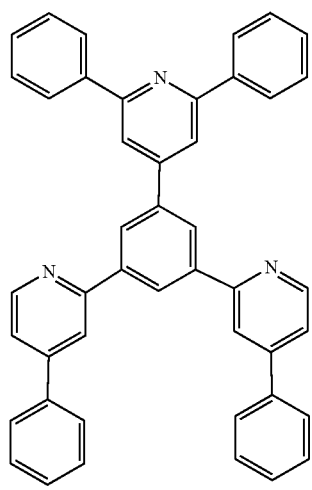
ET33
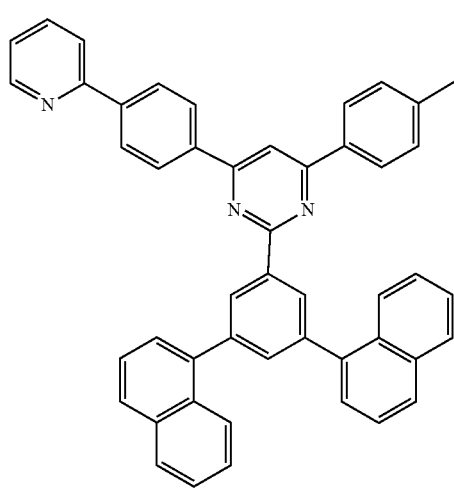
ET34
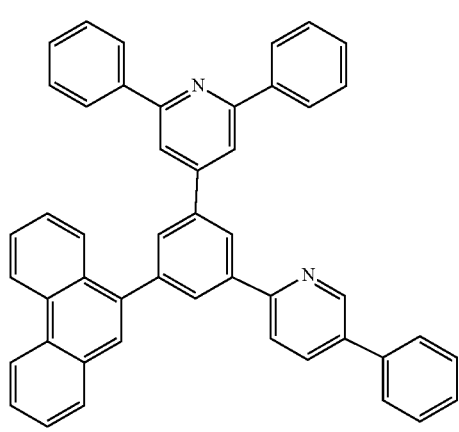
ET35
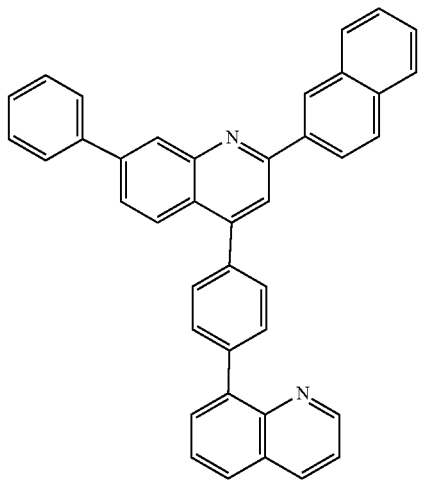
ET36
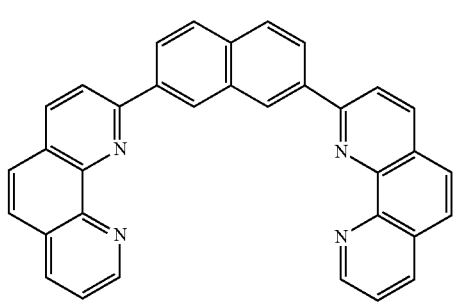
Alq₃
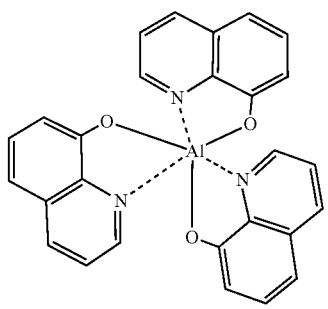
BAlq
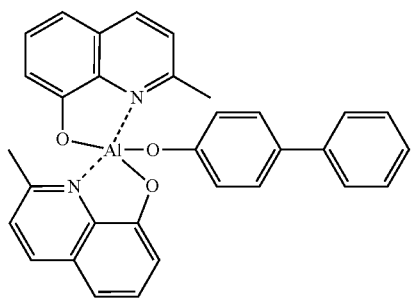
TAZ
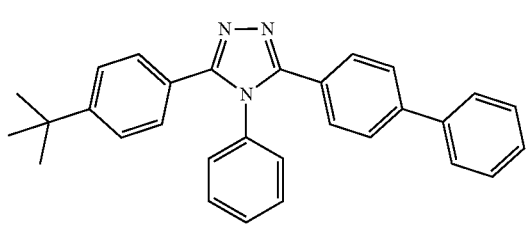

NTAZ

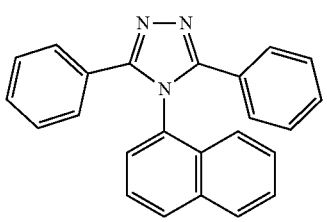

ET-D2

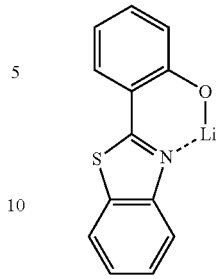

Thicknesses of the buffer layer, the hole blocking layer, and the electron control layer may each independently be in a range of about 20 Å to about 1,000 Å, for example, about 30 Å to about 300 Å. When the thicknesses of the buffer layer, the hole blocking layer, and the electron control layer are within the ranges above, excellent hole blocking characteristics or excellent electron control characteristics may be obtained without a substantial increase in driving voltage.

The thickness of the electron transport layer may be in a range of about 100 Å to about 1,000 Å, for example, about 150 Å to about 500 Å. When the thickness of the electron transport layer is within the range described above, satisfactory electron transport characteristics may be obtained without a substantial increase in driving voltage. The electron transport region (for example, the electron transport layer in the electron transport region) may further include, in addition to the materials as described above, a metal-containing material.

The metal-containing material may include an alkali metal complex, an alkaline earth-metal complex, or any combination thereof. A metal ion of the alkali metal complex may be a Li ion, a Na ion, a K ion, a Rb ion, or a Cs ion, and a metal ion of the alkaline earth-metal complex may be a Be ion, a Mg ion, a Ca ion, a Sr ion, or a Ba ion. A ligand coordinated with the metal ion of the alkali metal complex or the alkaline earth-metal complex may be a hydroxy quinoline, a hydroxy isoquinoline, a hydroxy benzoquinoline, a hydroxy acridine, a hydroxy phenanthridine, a hydroxy phenyloxazole, a hydroxy phenylthiazole, a hydroxy diphenyloxadiazole, a hydroxy diphenylthiadiazole, a hydroxy phenylpyridine, a hydroxy phenylbenzimidazole, a hydroxy phenylbenzothiazole, a bipyridine, a phenanthroline, a cyclopentadiene, or any combination thereof, but the exemplary embodiments are not limited thereto.

For example, the metal-containing material may include a Li complex. The Li complex may include, for example, Compound ET-D1 (lithium quinolate (LiQ)) or ET-D2:

ET-D1

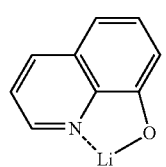

The electron transport region may include an electron injection layer that facilitates electron injection from the second electrode 190. The electron injection layer may directly contact the second electrode 190.

The electron injection layer may have: i) a single-layered structure consisting of a single layer consisting of a single material, ii) a single-layered structure consisting of a single layer consisting of a plurality of different materials, or iii) a multi-layered structure including a plurality of layers including different materials.

The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth-metal complex, a rare earth metal complex, or any combinations thereof.

The alkali metal may include Li, Na, K, Rb, Cs, or any combination thereof. The alkaline earth metal may include Mg, Ca, Sr, Ba, or any combination thereof. The rare earth metal may include Sc, Y, Ce, Tb, Yb, Gd, or any combination thereof.

The alkali metal-containing compound, the alkaline earth metal-containing compound, and the rare earth metal-containing compound may be oxides and halides (for example, fluorides, chlorides, bromides, or iodides) of the alkali metal, the alkaline earth metal, and the rare earth metal, or any combination thereof.

The alkali metal-containing compound may be alkali metal oxides, such as $Li_2O$, $Cs_2O$, or $K_2O$, and alkali metal halides, such as LiF, NaF, CsF, KF, LiI, NaI, CsI, or KI, or any combination thereof. The alkaline earth-metal containing compound may include alkaline earth-metal oxides, such as BaO, SrO, CaO, $Ba_xSr_{1-x}O$ (0<x<1), or $Ba_xCa_{1-x}O$ (0<x<1). The rare earth metal-containing compound may include $YbF_3$, $ScF_3$, $ScO_3$, $Y_2O_3$, $Ce_2O_3$, $GdF_3$, $TbF_3$, $YbI_3$, $ScI_3$, $TbI_3$, or any combination thereof.

The alkali metal complex, the alkaline earth-metal complex, and the rare earth metal complex may include i) one of ions of the alkali metal, the alkaline earth metal, and the rare earth metal, and ii), as a ligand linked to the metal ion, for example, a hydroxy quinoline, a hydroxy isoquinoline, a hydroxy benzoquinoline, a hydroxy acridine, a hydroxy phenanthridine, a hydroxy phenyloxazole, a hydroxy phenylthiazole, a hydroxy diphenyloxadiazole, a hydroxy diphenylthiadiazole, a hydroxy phenylpyridine, a hydroxy phenylbenzimidazole, a hydroxy phenylbenzothiazole, a bipyridine, a phenanthroline, a cyclopentadiene, or any combination thereof, but the exemplary embodiments are not limited thereto.

The electron injection layer consists of an alkali metal, an alkaline earth metal, a rare earth metal, an alkali metal-containing compound, an alkaline earth metal-containing compound, a rare earth metal-containing compound, an alkali metal complex, an alkaline earth-metal complex, a rare earth metal complex, or any combination thereof, or may further include an organic material (for example, a compound represented by Formula 601). When the electron injection layer further includes an organic material, the alkali metal, the alkaline earth metal, the rare earth metal, the alkali metal-containing compound, the alkaline earth metal-containing compound, the rare earth metal-containing compound, the alkali metal complex, the alkaline earth-metal complex, the rare earth metal complex, or any combination thereof may be homogeneously or non-homogeneously dispersed in a matrix including the organic material.

The thickness of the electron injection layer may be in a range of about 1 Å to about 100 Å, for example, about 3 Å to about 90 Å. When the thickness of the electron injection layer is within the range described above, the electron injection layer may have satisfactory electron injection characteristics without a substantial increase in driving voltage.

Second Electrode 190

The second electrode 190 may be located on the interlayer 150 having such a structure. The second electrode 190 may be a cathode, which is an electron injection electrode, and as the material for the second electrode 190, a metal, an alloy, an electrically conductive compound, or any combination thereof, each having a low work function, may be used.

The second electrode 190 may include Li, Ag, Mg, Al, Al—Li, Ca, Mg—In, Mg—Ag, ITO, IZO, or any combination thereof, but the exemplary embodiments are not limited thereto. The second electrode 190 may be a transmissive electrode, a semi-transmissive electrode, or a reflective electrode. The second electrode 190 may have a single-layered structure or a multi-layered structure including two or more layers.

Capping Layer

A first capping layer may be located outside the first electrode 110, and/or a second capping layer may be located outside the second electrode 190. In detail, the light-emitting device 100 may have a structure in which the first capping layer, the first electrode 110, the interlayer 150, and the second electrode 190 are sequentially stacked in this stated order, a structure in which the first electrode 110, the interlayer 150, the second electrode 190, and the second capping layer are sequentially stacked in this stated order, or a structure in which the first capping layer, the first electrode 110, the interlayer 150, the second electrode 190, and the second capping layer are sequentially stacked in this stated order.

Light generated by the emission layer of the interlayer 150 of the light-emitting device 10 may be extracted toward the outside through the first electrode 110 and the first capping layer, each of which may be a semi-transmissive electrode or a transmissive electrode, or light generated by the emission layer of the interlayer 150 of the light-emitting device 10 may be extracted toward the outside through the second electrode 190 and the second capping layer, each of which may be a semi-transmissive electrode or a transmissive electrode.

The first capping layer and the second capping layer may increase external luminescence efficiency according to the principle of constructive interference. The first capping layer and the second capping layer may each independently be an organic capping layer including an organic material, an inorganic capping layer including an inorganic material, or a composite capping layer including an organic material and an inorganic material.

At least one of the first capping layer and the second capping layer may each independently include a carbocyclic compound, a heterocyclic compound, an amine group-containing compound, a porphyrine derivative, a phthalocyanine derivative, a naphthalocyanine derivative, an alkali metal complex, an alkaline earth-metal complex, or a combination thereof. The carbocyclic compound, the heterocyclic compound, and the amine group-containing compound may be optionally substituted with a substituent containing O, N, S, Se, Si, F, Cl, Br, I, or any combination thereof. In some exemplary embodiments, at least one of the first capping layer and the second capping layer may each independently include an amine group-containing compound.

For example, at least one of the first capping layer and second capping layer may each independently include a compound represented by Formula 201, a compound represented by Formula 202, or any combination thereof.

In one or more exemplary embodiments, at least one of the first capping layer and the second capping layer may each independently include a compound selected from Compounds HT28 to HT33, Compounds CP1 to CP5, or any combination thereof, but the exemplary embodiments are not limited thereto:

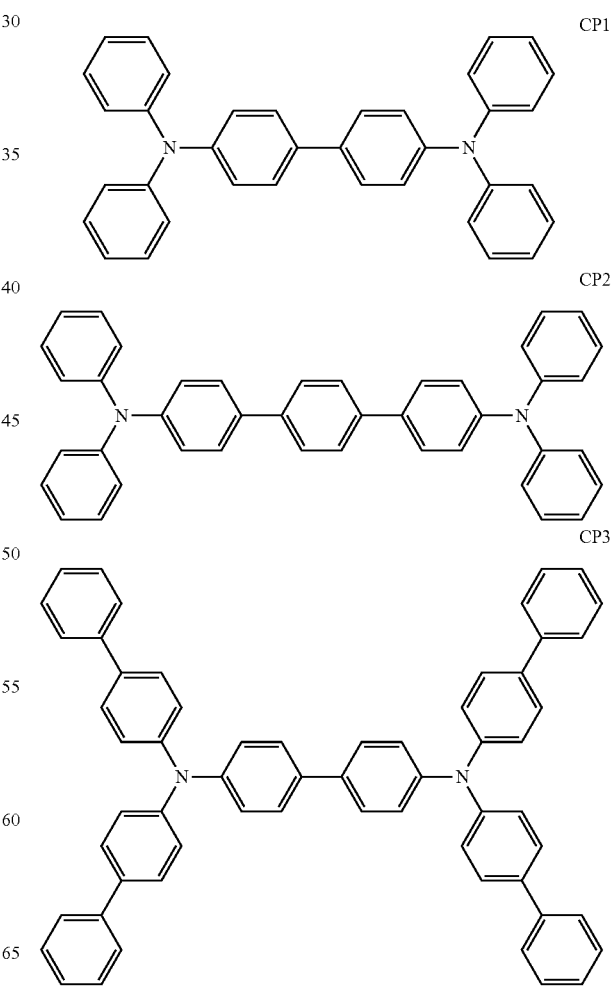

-continued

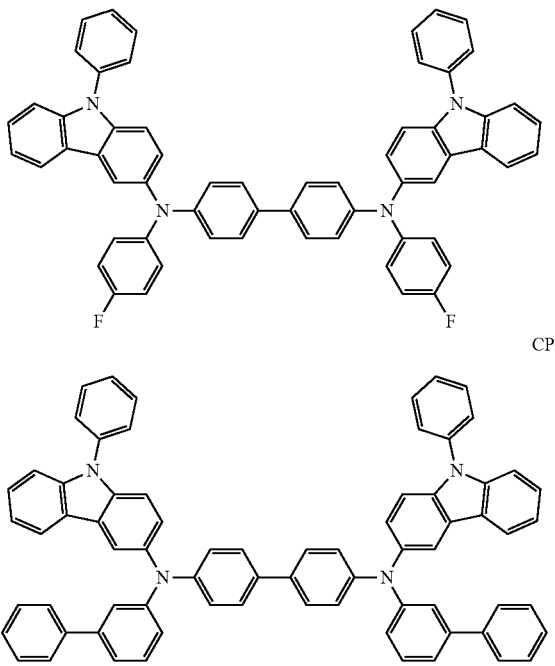

CP4

CP5

Apparatus

The light-emitting device may be included in various apparatuses. For example, a light-emitting apparatus, an authentication apparatus, or an electronic apparatus, which includes the light-emitting device, may be provided.

The light-emitting apparatus may further include a color filter in addition to the light-emitting device as described above. The color filter may be disposed in at least one traveling direction of light emitted from the light-emitting device. For example, the light emitted from the light-emitting device may be blue light, but the exemplary embodiments are not limited thereto. The light-emitting device may be the same as described above. The light-emitting apparatus may include a first substrate. The first substrate may include a plurality of subpixel areas, and the color filter may include a plurality of color filter areas each corresponding to the plurality of subpixel areas. Pixel-defining films may be located between the plurality of subpixel areas to define each of the subpixel areas.

The color filter may further include light-blocking patterns located between the plurality of color filter areas. The plurality of color filter areas may include: a first color filter area emitting first color light; a second color filter area emitting second color light; and/or a third color filter area emitting third color light, and the first color light, the second color light, and the third color light may have different maximum emission wavelengths from one another. For example, the first color light may be red light, the second color light may be green light, and the third color light may be blue light, but the exemplary embodiments are not limited thereto. For example, the plurality of color filter areas may each include a quantum dot, but the exemplary embodiments are not limited thereto. In detail, the first color filter area may include a red quantum dot, the second color filter area may include a green quantum dot, and the third color filter area may not include a quantum dot. The quantum dot may be understood by referring to the description thereof provided herein. The first color filter area, the second color filter area, and/or the third color filter area may each include a scatterer, but the exemplary embodiments are not limited thereto.

For example, the light-emitting device may emit first light, the first color filter area may absorb the first light to emit first-first color light, the second color filter area may absorb the first light to emit second-first color light, and the third color filter area may absorb the first light to emit third-first color light. In this regard, the first-first color light, the second-first color light, and the third-first color light may have different maximum emission wavelengths from one another. In detail, the first light may be blue light, the first first-color light may be red light, the second first-color light may be green light, and the third first-color light may be blue light, but the exemplary embodiments are not limited thereto.

The light-emitting apparatus may further include a thin-film transistor in addition to the light-emitting device as described above. The thin-film transistor may include a source electrode, a drain electrode, and an activation layer, wherein any one of the source electrode and the drain electrode may be electrically connected to any one of the first electrode and the second electrode of the light-emitting device.

The thin-film transistor may further include a gate electrode, a gate insulation layer, or the like. The active layer may include a crystalline silicon, an amorphous silicon, an organic semiconductor, an oxide semiconductor, or the like, but the exemplary embodiments are not limited thereto.

The light-emitting apparatus may further include a sealing portion for sealing the light-emitting device. The sealing portion may be located between the color filter and the light-emitting device. The sealing portion allows light from the light-emitting device to be extracted to the outside, while simultaneously preventing external air and moisture from penetrating into the light-emitting device. The sealing portion may be a sealing substrate including a transparent glass substrate or a plastic substrate. The sealing portion may be a thin-film encapsulation layer including a plurality of organic layers and/or a plurality of inorganic layers. When the sealing portion is a thin-film encapsulation layer, the light-emitting apparatus may be flexible.

The light-emitting apparatus may be used as various displays, light sources, and the like. The authentication apparatus may be, for example, a biometric authentication apparatus for authenticating an individual by using biometric information of a biometric body (for example, a finger tip, a pupil, or the like).

The authentication apparatus may further include, in addition to the light-emitting device, a biometric information collector. The electronic apparatus may be applied to personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement devices, pulse wave measurement devices, electrocardiogram (ECG) displays, ultrasonic diagnostic devices, or endoscope displays), fish finders, various measuring instruments, meters (for example, meters for a vehicle, an aircraft, and a vessel), projectors, and the like, but the exemplary embodiments are not limited thereto.

Preparation Method

Layers constituting the hole transport region, an emission layer, and layers constituting the electron transport region may be formed in a certain region by using one or more suitable methods selected from vacuum deposition, spin coating, casting, Langmuir-Blodgett (LB) deposition, ink-jet printing, laser-printing, and laser-induced thermal imaging.

When layers constituting the hole transport region, an emission layer, and layers constituting the electron transport region are formed by vacuum deposition, the deposition may be performed at a deposition temperature of about 100° C. to about 500° C., a vacuum degree of about $10^{-8}$ torr to about $10^{-3}$ torr, and a deposition speed of about 0.01 Å/sec to about 100 Å/sec by taking into account a material to be included in a layer to be formed and the structure of a layer to be formed.

When layers constituting the hole transport region, an emission layer, and layers constituting the electron transport region are formed by spin coating, the spin coating may be performed at a coating speed of about 2,000 rpm to about 5,000 rpm and at a heat treatment temperature of about 80° C. to 200° C. by taking into account a material to be included in a layer to be formed and the structure of a layer to be formed.

General Definitions Including Substituents

The term "interlayer" as used herein refers to a single layer and/or all layers located between the first electrode and the second electrode of the light-emitting device. A material included in the "interlayer" may include an organic material, an inorganic material, or any combination thereof.

The "π-electron deficient nitrogen-containing cyclic group" may be a $C_1$-$C_{60}$ heterocyclic group which has, as a ring-forming moiety, at least one *—N=*' moiety. For example, the "π-electron-deficient nitrogen-containing cyclic group" may be i) a first ring, ii) a condensed cyclic group in which two or more first rings are fused to each other, or iii) a condensed cyclic group in which at least one first ring and at least one second ring are fused, wherein the first ring is a heteromonocyclic group (for example, an imidazole group, a pyridine group, a triazine group, etc.) which includes, as a ring-forming moiety, at least one *—N=*' moiety, and the second ring is a cyclic group (for example, a benzene group, a dibenzofuran group, a carbazole group, etc.) which does not include, as a ring-forming moiety, *—N=*' moiety.

The term "$C_1$-$C_{60}$ alkyl group" as used herein refers to a linear or branched aliphatic hydrocarbon monovalent group having 1 to 60 carbon atoms, and examples thereof are a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group. The term "$C_1$-$C_{60}$ alkylene group" as used herein refers to a divalent group having a structure corresponding to the $C_1$-$C_{60}$ alkyl group.

The term "$C_2$-$C_{60}$ alkenyl group" as used herein refers to a monovalent hydrocarbon group having at least one carbon-carbon double bond in the middle or at the terminus of a $C_2$-$C_{60}$ alkyl group, and examples thereof include an ethenyl group, a propenyl group, and a butenyl group. The term "$C_2$-$C_{60}$ alkenylene group" as used herein refers to a divalent group having a structure corresponding to the $C_2$-$C_{60}$ alkenyl group.

The term "$C_2$-$C_{60}$ alkynyl group" as used herein refers to a monovalent hydrocarbon group having at least one carbon-carbon triple bond in the middle or at the terminus of a $C_2$-$C_{60}$ alkyl group, and examples thereof include an ethynyl group, and a propynyl group. The term "$C_2$-$C_{60}$ alkynylene group" as used herein refers to a divalent group having a structure corresponding to the $C_2$-$C_{60}$ alkynyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and examples thereof include a methoxy group, an ethoxy group, and an isopropyloxy group.

The term "$C_3$-$C_{10}$ cycloalkyl group" as used herein refers to a monovalent saturated hydrocarbon cyclic group having 3 to 10 carbon atoms, and examples thereof are a cyclopropyl group, a cyclobutyl group, a cyclopentyl group, a cyclohexyl group, a cycloheptyl group, a cyclooctyl group, an adamantanyl group, a norbornanyl group, a bicyclo[1.1.1]pentyl group, a bicyclo[2.1.1]hexyl group, a bicyclo[2.2.1]heptyl group, and a bicyclo[2.2.2]octyl group. The term "$C_3$-$C_{10}$ cycloalkylene group" as used herein refers to a divalent group having a structure corresponding to the $C_3$-$C_{10}$ cycloalkyl group.

The term "$C_1$-$C_{10}$ heterocycloalkyl group" as used herein refers to a monovalent cyclic group with 1 to 10 carbon atoms containing a heteroatom (for example, N, O, Si, P, S, or any combination thereof) as a ring-forming atom, and examples thereof are a 1,2,3,4-oxatriazolidinyl group, a tetrahydrofuranyl group, and a tetrahydrothiophenyl group. The term "$C_1$-$C_{10}$ heterocycloalkylene group" as used herein refers to a divalent group having a structure corresponding to the $C_1$-$C_{10}$ heterocycloalkyl group.

The term "$C_3$-$C_{10}$ cycloalkenyl group" as used herein refers to a monovalent monocyclic group that has 3 to 10 carbon atoms and at least one carbon-carbon double bond in the ring thereof and no aromaticity, and non-limiting examples thereof include a cyclopentenyl group, a cyclohexenyl group, and a cycloheptenyl group. The term "$C_3$-$C_{10}$ cycloalkenylene group" as used herein refers to a divalent group having a structure corresponding to the $C_3$-$C_{10}$ cycloalkenyl group.

The term "$C_1$-$C_{10}$ heterocycloalkenyl group" as used herein refers to a monovalent cyclic group with 1 to 10 carbon atoms containing a heteroatom (for example, N, O, Si, P, S, or any combination thereof) as a ring-forming atom, wherein the ring has at least one a double bond. Examples of the $C_1$-$C_{10}$ heterocycloalkenyl group include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group" as used herein refers to a divalent group having a structure corresponding to the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Examples of the $C_6$-$C_{60}$ aryl group are a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and an ovalenyl group. When the $C_6$-$C_{60}$ aryl group and the $C_6$-$C_{60}$ arylene group each include two or more rings, the two or more rings may be fused to each other.

The term "$C_1$-$C_{60}$ heteroaryl group" as used herein refers to a monovalent heterocyclic aromatic system having a heteroatom (for example, N, O, Si, P, S, or any combination thereof) as a ring-forming atom and 1 to 60 carbon atoms, and the term "$C_1$-$C_{60}$ heteroarylene group" as used herein refers to a bivalent heterocyclic aromatic system having a heteroatom (for example, N, O, Si, P, S, or any combination thereof) as a ring-forming atom and 1 to 60 carbon atoms. Examples of the $C_1$-$C_{60}$ heteroaryl group are a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. When the $C_1$-$C_{60}$ heteroaryl group and the $C_1$-$C_{60}$ heteroarylene group each include two or more rings, the two or more rings may be fused with each other.

The term "$C_6$-$C_{60}$ aryloxy group" as used herein refers to —$OA_{102}$ (wherein $A_{102}$ is the $C_6$-$C_{60}$ aryl group), and the term "$C_6$-$C_{60}$ arylthio group" as used herein refers to —$SA_{103}$ (wherein $A_{103}$ is the $C_6$-$C_{60}$ aryl group).

The term "monovalent non-aromatic fused polycyclic group" as used herein refers to a monovalent group (for example, having 8 to 60 carbon atoms) having two or more rings fused with each other, only carbon atoms as ring-forming atoms, and no aromaticity in its entire molecular structure. Examples of the monovalent non-aromatic fused polycyclic group are an indenyl group, a fluorenyl group, a spiro-bifluorenyl group, a benzofluorenyl group, an indenophenanthrenyl group, and an indenoanthracenyl group. The term "divalent non-aromatic fused polycyclic group" as used herein refers to a divalent group having a structure corresponding to the monovalent non-aromatic fused or condensed polycyclic group.

The term "monovalent non-aromatic fused heteropolycyclic group" as used herein refers to a monovalent group (for example, having 1 to 60 carbon atoms) in which two or more rings are fused to each other, which includes, as a ring-forming atom, a heteroatom (for example, N, O, Si, P, and S, or any combination thereof) other than carbon, and which has no aromaticity in its entire molecular structure. Examples of the monovalent non-aromatic fused heteropolycyclic group are a pyrrolyl group, a thiophenyl group, a furanyl group, an indolyl group, a benzoindolyl group, a naphthoindolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indenocarbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphthosilolyl group, a benzofurodibenzofuranyl group, a benzofurodibenzothiophenyl group, and a benzothienodibenzothiophenyl group. The term "divalent non-aromatic fused heteropolycyclic group" as used herein refers to a divalent group having a structure corresponding to the monovalent non-aromatic fused heteropolycyclic group.

The term "$C_5$-$C_{60}$ carbocyclic group" as used herein refers to a monocyclic or polycyclic group that includes only carbon as a ring-forming atom and consists of 5 to 60 carbon atoms. The $C_5$-$C_{60}$ carbocyclic group may be an aromatic carbocyclic group or a non-aromatic carbocyclic group. The $C_5$-$C_{60}$ carbocyclic group may be a compound, such as benzene, a monovalent group, such as a phenyl group, or a divalent group, such as a phenylene group. In one or more exemplary embodiments, depending on the number of substituents connected to the $C_5$-$C_{60}$ carbocyclic group, the $C_5$-$C_{60}$ carbocyclic group may be a trivalent group or a quadrivalent group.

Examples of the $C_5$-$C_{60}$ carbocyclic group are a cyclopentadiene group, a benzene group, a pentalene group, a naphthalene group, an azulene group, an indacene group, acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indeno phenanthrene group, and an indenoanthracene group.

The term "$C_1$-$C_{60}$ heterocyclic group" as used herein refers to a monocyclic or polycyclic group which includes 1 to 60 carbon atoms and, as a ring-forming atom, a heteroatom (for example, N, O, Si, P, S, or any combination thereof), in addition to carbon (the carbon number may be 1 to 60). The $C_1$-$C_{60}$ heterocyclic group may be an aromatic heterocyclic group or a non-aromatic heterocyclic group. The $C_1$-$C_{60}$ heterocyclic group may be a compound such as a pyridine, a monovalent group such as a pyridinyl group, or a divalent group such as a pyridinylene group. In one or more exemplary embodiments, depending on the number of substituents connected to the $C_1$-$C_{60}$ heterocyclic group, the $C_1$-$C_{60}$ heterocyclic group may be a trivalent group or a quadrivalent group.

Examples of the $C_1$-$C_{60}$ heterocyclic group are a pyridine group, a pyrimidine group, a pyrazine group, a pyridazine group, a triazine group, a quinoline group, a benzoquinoline group, an isoquinoline group, a benzoisoquinoline group, a quinoxaline group, a benzoquinoxaline group, a quinazoline group, a benzoquinazoline group, a cinnoline group, a phenanthroline group, a phthalazine group, a naphthyridine group, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an azacarbazole group, an azafluorene group, an azadibenzosilole group, an azadibenzothiophene group, an azadibenzofuran group, a pyrazole group, an imidazole group, a triazole group, a tetrazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, an imidazopyridine group, an imidazopyrimidine group, an imidazotriazine group, an imidazopyrazine group, an imidazopyridazine group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, and a benzothienodibenzothiophene group.

The substituent of the substituted $C_5$-$C_{60}$ carbocyclic group, the substituted $C_1$-$C_{60}$ heterocyclic group, the substituted $C_1$-$C_{60}$ alkylene group, the substituted $C_2$-$C_{60}$ alkenylene group, the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic fused polycyclic group, the substituted divalent non-aromatic fused heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic fused polycyclic group, and the substituted monovalent non-aromatic fused heteropolycyclic group may be:

Deuterium (-D), —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic fused polycyclic group, a monovalent non-aromatic fused heteropolycyclic group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), and —P(=O)($Q_{11}$)($Q_{12}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic fused polycyclic group, or a monovalent non-aromatic fused heteropolycyclic group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic fused polycyclic group, a monovalent non-aromatic fused heteropolycyclic group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), and —P(=O)($Q_{21}$)($Q_{22}$);

—Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), or any combination thereof.

As used herein, $Q_1$ to $Q_3$, $Q_{11}$ to $Q_{13}$, $Q_{21}$ to $Q_{23}$, and $Q_{31}$ to $Q_{33}$ may each be, independently from one another, hydrogen, deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic fused polycyclic group, a monovalent non-aromatic fused heteropolycyclic group, a biphenyl group, or a terphenyl group.

The term "Ph" as used herein refers to a phenyl group, the term "Me" as used herein refers to a methyl group, the term "Et" as used herein refers to an ethyl group, the term "ter-Bu" or "Bu$^t$" as used herein refers to a tert-butyl group, and the term "OMe" as used herein refers to a methoxy group.

The term "biphenyl group" as used herein refers to "a phenyl group substituted with a phenyl group". In other words, the "biphenyl group" is a substituted phenyl group having a $C_6$-$C_{60}$ aryl group as a substituent.

The term "terphenyl group" as used herein refers to "a phenyl group substituted with a biphenyl group". In other words, the "terphenyl group" is a substituted phenyl group having, as a substituent, a $C_6$-$C_{60}$ aryl group substituted with a $C_6$-$C_{60}$ aryl group.

As used herein, a substituent for a monovalent group, e.g., alkyl, may also be, independently, a substituent for a corresponding divalent group, e.g., alkylene.

The terms "hydrogen" and "deuterium" refer to their respective atoms and corresponding radicals, and the terms "—F, —Cl, —Br, and —I" are radicals of, respectively, fluorine, chlorine, bromine, and iodine.

* and *' as used herein, unless defined otherwise, each refer to a binding site to a neighboring atom in a corresponding formula.

Hereinafter, a compound according to some exemplary embodiments and a light-emitting device according to some exemplary embodiments will be described in detail with reference to Synthesis Examples and Examples. The wording "B was used instead of A" used in describing Synthesis Examples refers to that an identical molar equivalent of B was used in place of A.

EXAMPLES

Manufacture of Light-Emitting Device

Comparative Example 1

An ITO 300 Å/Ag 50 Å/ITO 300 Å glass substrate (anode) was cut to a size of 50 mm×50 mm×0.7 mm, sonicated with isopropyl alcohol and pure water each for 5 minutes, and then cleaned by exposure to ultraviolet rays and ozone for 30 minutes. Then, the ITO glass substrate was provided to a vacuum deposition apparatus.

On the ITO glass substrate, Compound 400 and a p-dopant (HAT-CN) were vacuum-deposited at a weight ratio of 1:0.1 to form a p-doped hole transport layer having a thickness of 100 Å, and then, Compound 400 which is a hole transport compound was vacuum-deposited thereon to form a hole transport layer having a thickness of 1,200 Å.

On the hole transport layer, Compound G100 and a p-dopant (HAT-CN) were formed at a weight ratio of 1:0.1 to a thickness of 100 Å, and then, Compound G100 was vacuum-deposited thereon to form an emission auxiliary layer having a thickness of 200 Å.

On the emission auxiliary layer, Compounds HT100 and ET100 as hosts in a weight ratio of 70:30, and Compound D100 as a dopant (10% weight ratio based on the total weight hosts and dopant) were co-deposited to form an emission layer having a thickness of 200 Å.

Next, Compound ET400 was formed to a thickness of 200 Å. to form a buffer layer, and Compound 500 which is an electron transport compound was deposited thereon to form an electron transport layer having a thickness of 300 Å.

The element combination AgMg was vacuum-deposited on the electron transport layer to form a cathode having a thickness of 120 Å (10% by weight AgMg layer), thereby completing the manufacture of an organic light-emitting device.

HT100

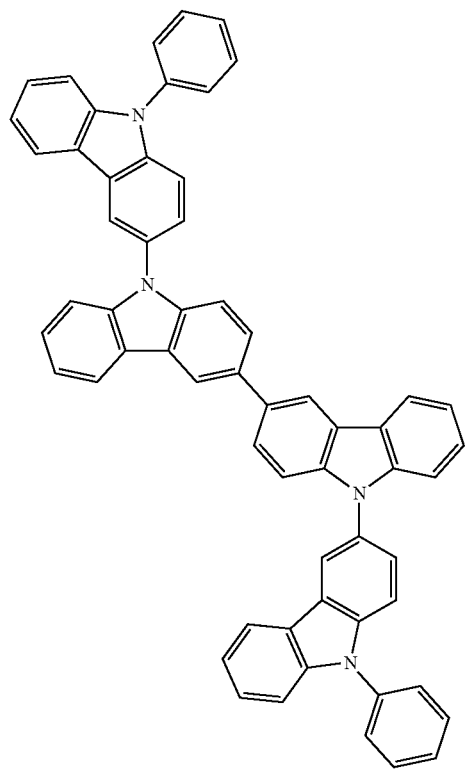

ET100

ET200

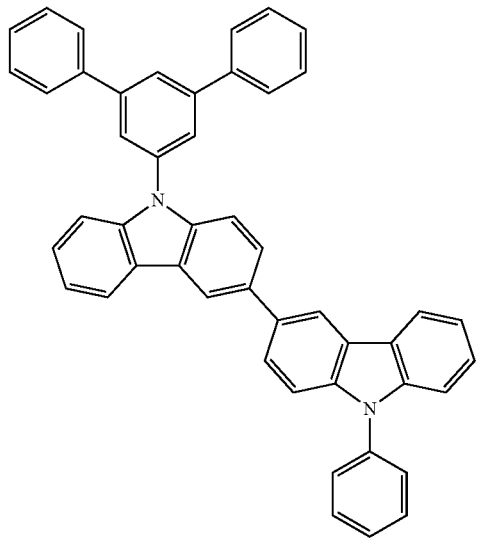

ET400

ET400

D100

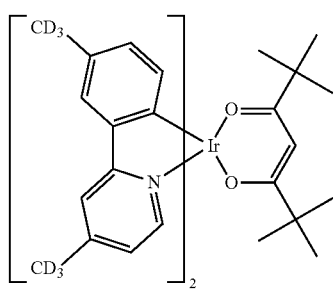

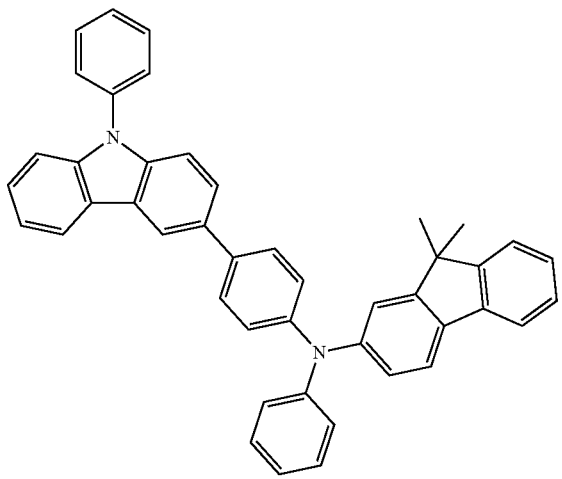

400

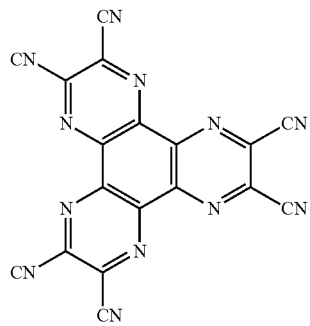

HAT-CN

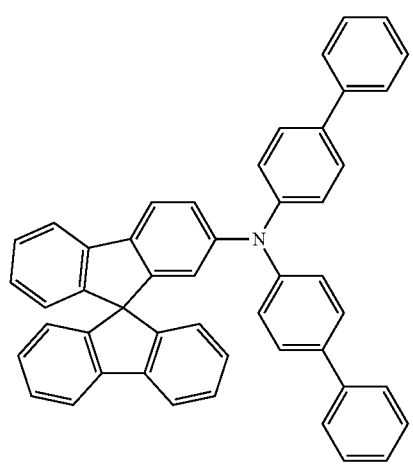

G100

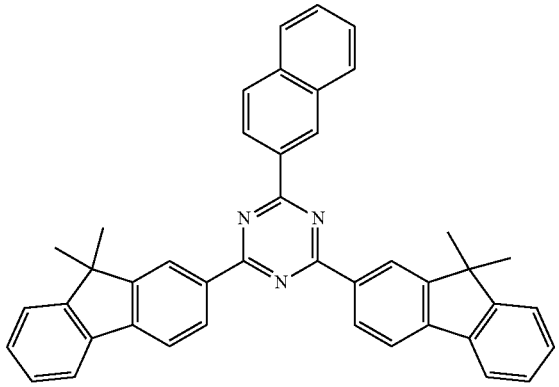

500

Comparative Example 2

A light-emitting device was manufactured in the same manner as in Comparative Example 1, except that, in forming an emission layer, Compounds HT100, ET100, and ET200 were used as the hosts in a weight ratio of 70:20:10, and Compound D100 was used as a dopant (10% weight ratio based on the total weight of the composition) to be co-deposited.

Comparative Example 3

A light-emitting device was manufactured in the same manner as in Comparative Example 1, except that, in forming an emission layer, Compounds HT100 and ET200 were used as the hosts in a weight ratio 70:20:10, and Compound D100 was used as a dopant (10% weight ratio based on the total weight of the composition) to be co-deposited, and that, in forming a buffer layer, Compound ET200 was used.

Example 1

A light-emitting device was manufactured in the same manner as in Comparative Example 1, except that, in forming an emission layer, Compounds HT100, ET100, and ET200 were used as the hosts in a weight ratio 70:20:10, and Compound D100 was used as a dopant (10% weight ratio based on the total weight of the composition) to be co-deposited, and that, in forming a buffer layer, Compound ET200 was used.

The HOMO and LUMO energy level values were measured with a surface analyzer sold under the trade designation AC3 by RIKEN KEIKI Co., Ltd of Tokyo, Japan of each of the Compounds HT100, ET100, ET200, and ET400 are as follows:

TABLE 1

| Compound | HOMO (eV) | LUMO (eV) |
|---|---|---|
| HT100 | −5.51 | −1.81 |
| ET100 | 5.61 | 2.13 |
| ET200 | 5.70 | 2.03 |
| ET400 | −5.82 | −1.95 |

To evaluate characteristics of the light-emitting devices manufactured according to Comparative Examples 1 to 3 and Example 1, the driving voltage at a current density of 10 mA/cm2, efficiency, lifespan, and the like were measured.

The driving voltage and current density of the light-emitting devices were measured by using a source meter (by Keithley Instrument Company, 2400 series by Tektronix, Inc., of Beaverton, Oregon), and the efficiency of the light-emitting devices was measured by using a measuring meter manufactured by HAMAMATSU Photonics Company of Hamamatsu-city, Japan.

TABLE 2

|  | Host in emission layer | Buffer layer | Driving voltage (V) | Efficiency (Cd/A) | CIE_x | Lifespan (T97) |
|---|---|---|---|---|---|---|
| Comparative Example 1 | HT100 + ET100 | ET400 | 3.7 | 153 | 0.250 | 100% |
| Comparative Example 2 | HT100 + ET100 + ET200 | ET400 | 3.8 | 162 | 0.250 | 84% |
| Comparative Example 3 | HT100 + ET200 | ET200 | 3.9 | 162 | 0.250 | 76% |
| Example 1 | HT100 + ET100 + ET200 | ET200 | 3.6 | 166 | 0.250 | 125% |

Referring to Table 2, it was confirmed that the light-emitting device of Example 1 showed significant and unexpectedly excellent results in terms of efficiency and long lifespan compared to those of the light-emitting devices manufactured according to Comparative Examples 1 to 3. According to the principles and one or more exemplary embodiments of the invention, a light-emitting device may have both significant and unexpectedly excellent efficiency and lifespan at the same time.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A light-emitting device comprising:
a first electrode;
a second electrode facing the first electrode; and
an interlayer disposed between the first electrode and the second electrode and comprising an emission layer, wherein the interlayer comprises:
  i) a hole transport region disposed between the first electrode and the emission layer; and
  ii) an electron transport region disposed between the emission layer and the second electrode;
wherein:
  the emission layer comprises three or more hosts;
  the electron transport region comprises a buffer layer;
  the three or more hosts comprise a hole transport host, a first electron transport host, and a second electron transport host;
  the buffer layer consists of a third electron transport host; and
  a lowest unoccupied molecular orbital energy level of the second electron transport host is substantially equal to a lowest unoccupied molecular orbital energy level of the third electron transport host,
wherein the hole transport host comprises a fluorene-based compound, a carbazole-based compound, a diarylamine-based compound, a triarylamine-based compound, a dibenzofuran-based compound, a dibenzothiophene-based compound, or a dibenzosilole-based compound,
wherein the first electron transport host comprises a triazine-based compound, a triazole-based compound, an imidazole-based compound, or an oxazine-based compound,
wherein the second electron transport host comprises a triazine-based compound, a triazole-based compound, an imidazole-based compound, or an oxazine-based compound,
wherein the second electron transport host and the third electron transport host are identical compounds, and
wherein the buffer layer contacts the emission layer.

2. The light-emitting device of claim 1, wherein the first electrode comprises an anode, the second electrode comprises a cathode, and the hole transport region comprises a hole injection layer, a hole transport layer, an emission auxiliary layer, an electron blocking layer, or any combination thereof.

3. The light-emitting device of claim 1, wherein the first electrode comprises an anode, the second electrode comprises a cathode, and the electron transport region further comprises a hole blocking layer, an electron transport layer, an electron injection layer, or any combination thereof.

4. The light-emitting device of claim 1, wherein a highest occupied molecular orbital energy level of the second electron transport host is substantially equal to a highest occupied molecular orbital energy level of the third electron transport host.

5. The light-emitting device of claim 1, wherein a lowest unoccupied molecular orbital energy level of the hole transport host $E_{LUMO\_HT}$, a lowest unoccupied molecular orbital energy level of the first electron transport host $E_{LUMO\_ET1}$, and the lowest unoccupied molecular orbital energy level of the second electron transport host $E_{LUMO\_ET2}$ satisfy Inequalities (1) and (2) below:

$$|E_{LUMO\_HT}| > |E_{LUMO\_ET1}| \qquad (1); \text{ and}$$

$$|E_{LUMO\_HT}| > |E_{LUMO\_ET2}| \qquad (2).$$

6. The light-emitting device of claim 1, wherein a highest occupied molecular orbital energy level of the hole transport host $E_{HOMO\_HT}$, a highest occupied molecular orbital energy level of the first electron transport host $E_{HOMO\_ET1}$, and a highest occupied molecular orbital energy level of the second electron transport host $E_{HOMO\_ET2}$ satisfy Inequality (3) below:

$$|E_{HOMO\_ET2}| > |E_{HOMO\_ET1}| > |E_{HOMO\_HT}| \qquad (3).$$

7. The light-emitting device of claim 1, wherein a lowest unoccupied molecular orbital energy level $E_{LUMO\_ET1}$ and a highest occupied molecular orbital energy level $E_{HOMO\_ET1}$ of the first electron transport host and the lowest unoccupied molecular orbital energy level $E_{LUMO\_ET2}$ and a highest occupied molecular orbital energy level $E_{HOMO\_ET2}$ of the second electron transport host satisfy Inequalities (4) and (5) below:

$$|E_{LUMO\_ET2}| > |E_{LUMO\_ET1}| \qquad (4); \text{ and}$$

$$|E_{HOMO\_ET2}| > |E_{HOMO\_ET1}| \qquad (5).$$

8. The light-emitting device of claim 1, wherein a lowest unoccupied molecular orbital energy level $E_{LUMO\_ET1}$ and a highest occupied molecular orbital energy level $E_{HOMO\_ET1}$ of the first electron transport host and the lowest unoccupied molecular orbital energy level $E_{LUMO\_ET2}$ and a highest occupied molecular orbital energy level $E_{HOMO\_ET2}$ of the second electron transport host satisfy Inequalities (6) and (7) below:

$$|E_{LUMO\_ET2} - E_{LUMO\_ET1}| \leq \text{about } 0.1 \text{ eV} \qquad (6); \text{ and}$$

$$|E_{HOMO\_ET2} - E_{HOMO\_ET1}| \leq \text{about } 0.1 \text{ eV} \qquad (7).$$

9. The light-emitting device of claim 1, wherein the electron transport region comprises an electron transport layer, and the buffer layer at least partially contacts the electron transport layer.

10. The light-emitting device of claim 1, wherein the hole transport region comprises an emission auxiliary layer, and the emission auxiliary layer comprises a charge-generation material.

11. The light-emitting device of claim 10, wherein the emission auxiliary layer includes two layers of different compositions.

12. The light-emitting device of claim 1, wherein the hole transport region comprises an emission auxiliary layer and a hole transport layer, and the emission auxiliary layer at least partially contacts the hole transport layer.

13. The light-emitting device of claim 12, wherein the hole transport layer comprises a charge-generation material.

14. The light-emitting device of claim 12, wherein the hole transport layer has a two-layered structure that includes a layer including a charge-generation material and a layer not including a charge-generation material.

15. The light-emitting device of claim 10, wherein the charge-generation material comprises a p-dopant.

16. The light-emitting device of claim 15, wherein the p-dopant comprises at least one of a quinone moiety, a metal oxide, a cyano group-containing compound, or any combination thereof.

17. The light-emitting device of claim 16, wherein the cyano group-containing compound is HAT-CN or a compound represented by Formula 221:

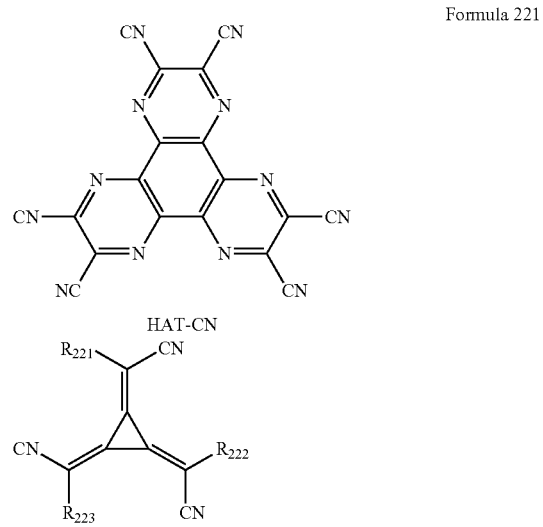

Formula 221 wherein, in Formula 221,
R221 to R223 are each, independently from one another, a substituted or unsubstituted C3-C10 cycloalkyl group, a substituted or unsubstituted C1-C10 heterocycloalkyl group, a substituted or unsubstituted C3-C10 cycloalkenyl group, a substituted or unsubstituted C1-C10 heterocycloalkenyl group, a substituted or unsubstituted C6-C60 aryl group, a substituted or unsubstituted C1-C60 heteroaryl group, a substituted or unsubstituted monovalent non-aromatic fused polycyclic group, or a substituted or unsubstituted monovalent non-aromatic heterofused polycyclic group.

18. An electronic apparatus comprising:
a thin-film transistor; and the light-emitting device of claim 1;
wherein the thin-film transistor comprises a source electrode, a drain electrode, an activation layer, and a gate electrode, and the first electrode of the light-emitting device is electrically connected to one of the source electrode and the drain electrode of the thin-film transistor.

* * * * *